(12) United States Patent
Noguchi et al.

(10) Patent No.: US 7,985,810 B2
(45) Date of Patent: Jul. 26, 2011

(54) POLYMER COMPOUND AND POLYMER LIGHT EMITTING DEVICE USING THE SAME

(75) Inventors: Takanobu Noguchi, Ibaraki (JP); Tomoyuki Suzuki, Tokyo (JP); Makoto Anryu, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 333 days.

(21) Appl. No.: 12/095,364

(22) PCT Filed: Nov. 30, 2006

(86) PCT No.: PCT/JP2006/324399
§ 371 (c)(1),
(2), (4) Date: May 29, 2008

(87) PCT Pub. No.: WO2007/064034
PCT Pub. Date: Jun. 7, 2007

(65) Prior Publication Data
US 2010/0288339 A1    Nov. 18, 2010

(30) Foreign Application Priority Data

Dec. 2, 2005 (JP) .................................. 2005-348963

(51) Int. Cl.
*C08G 79/02* (2006.01)
*C08G 79/04* (2006.01)
*C08G 79/06* (2006.01)
*C08F 283/00* (2006.01)

(52) U.S. Cl. ........ 525/538; 525/535; 528/398; 428/690; 428/917

(58) Field of Classification Search .................. 525/538, 525/535; 528/398; 428/690, 917
See application file for complete search history.

(56) References Cited

U.S. PATENT DOCUMENTS

| | | | |
|---|---|---|---|
| 3,998,864 | A | 12/1976 | Trevillyan |
| 2001/0026878 | A1 | 10/2001 | Woo et al. |
| 2004/0019180 | A1 | 1/2004 | Makioka et al. |
| 2006/0210827 | A1 | 9/2006 | Becker et al. |
| 2007/0031698 | A1 | 2/2007 | Towns et al. |
| 2007/0051945 | A1 | 3/2007 | Nakayama et al. |
| 2008/0233429 | A1 | 9/2008 | Oguma et al. |
| 2009/0056811 | A1 | 3/2009 | Noguchi et al. |

FOREIGN PATENT DOCUMENTS

| | | |
|---|---|---|
| DE | 10349033 A1 | 5/2005 |
| DE | 102004004008 A1 | 10/2005 |
| EP | 1378532 A1 | 1/2004 |
| WO | 99/32537 A1 | 7/1999 |
| WO | 99/54385 A1 | 10/1999 |
| WO | 00/46321 A1 | 8/2000 |
| WO | 00/78843 A1 | 12/2000 |

(Continued)

OTHER PUBLICATIONS

Y. Zhang et al., "Polyamides Incorporating Phosphine Oxide Groups. I. Wholly Aromatic Polymers," Journal of Polymer Science: Part A: Polymer Chemistry, vol. 34, 1996, pp. 1561-1566.

(Continued)

*Primary Examiner* — Duc Truong
(74) *Attorney, Agent, or Firm* — Sughrue Mion, PLLC

(57) ABSTRACT

A polymer compound comprising a repeating unit of the following formula (1) and at least one of a repeating unit of the following formula (2) and a repeating unit of the following formula (70).

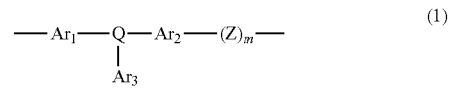

(wherein, Q represents

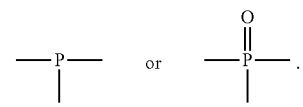

$Ar_1$ and $Ar_2$ represent an arylene group, divalent heterocyclic group or divalent aromatic amine group. $Ar_3$ represents an aryl group, monovalent heterocyclic group or monovalent aromatic amine group. Z represents $-CR_1=CR_2-$ or $-C\equiv C-$. $R_1$ and $R_2$ represent a hydrogen atom, alkyl group or the like. m represents 0 or 1.)

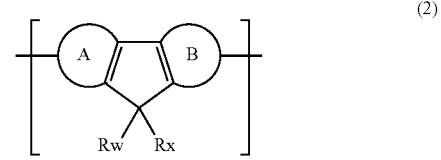

(wherein, a ring A and a ring B represent an aromatic hydrocarbon ring, and at least one of the ring A and the ring B is an aromatic hydrocarbon ring having two or more benzene rings condensed. Rw and Rx represent an alkyl group, alkoxy group or the like.)

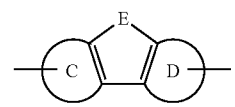

(wherein, a ring C and a ring D represent an aromatic ring. E represents O or S.).

9 Claims, No Drawings

FOREIGN PATENT DOCUMENTS

| | | |
|---|---|---|
| WO | 02/072661 A1 | 9/2002 |
| WO | 2004/056937 A1 | 7/2004 |
| WO | 2005/017065 A1 | 2/2005 |
| WO | 2005/040302 A1 | 5/2005 |
| WO | 2005/056633 A1 | 6/2005 |
| WO | 2005/060012 A1 | 6/2005 |

OTHER PUBLICATIONS

M.K.W. Choi et al., "Direct Radical Polymerization of 4-Styryldiphenylphosphine: Preparation of Cross-Linked and Non-Cross-Linked Triphenylphosphine-Containing Polystyrene Polymers," J. Org. Chem., vol. 68, 2003, pp. 9831-9834.

S. Kondo et al., "Polymeric Analogues of Triphenylphosphine Oxide as Stable Phase Transfer Catalysts," J. Polym. Sci. Part A: Polym. Chem., vol. 30, 1992, pp. 1503-1506.

POLYMER COMPOUND AND POLYMER LIGHT EMITTING DEVICE USING THE SAME

TECHNICAL FIELD

The present invention relates to a polymer compound and a polymer light emitting device using the polymer compound (hereinafter, referred to as polymer LED in some cases).

BACKGROUND ART

Light emitting material and charge transporting material with high molecular weight are different from those with low molecular weight in being soluble in a solvent and capable of forming a layer in a light emitting device by an application method, thus, various investigations are conducted, and examples thereof include homo-polymers comprising a triarylamine or triaryl phosphine as a repeating unit (WO 99/32537, WO 00/78843, WO 2004/056937), further, copolymers comprising a triaryl phosphine and fluorene (WO2 005/017065), and copolymers comprising a triarylamine and fluorene as a repeating unit (WO 99/54385, WO 00/46321).

These copolymers, however, are not satisfactory yet in heat resistance or fluorescence intensity.

DISCLOSURE OF THE INVENTION

An object of the present invention is to provide a novel polymer compound which is useful as a light emitting material and having heat resistance and strong fluorescence intensity, and a polymer light emitting device using the polymer compound.

That is, the present invention provides a polymer compound comprising a repeating unit of the following formula (1) and at least one of a repeating unit of the following formula (2) and a repeating unit of the following formula (70).

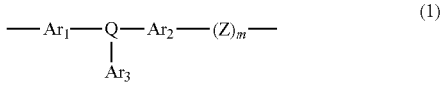

(1)

(wherein, Q represents

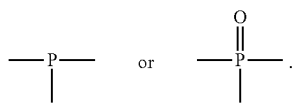

$Ar_1$ and $Ar_2$ represent each independently an arylene group, divalent heterocyclic group or divalent aromatic amine group. $Ar_3$ represents an aryl group, monovalent heterocyclic group or monovalent aromatic amine group. Z represents —$CR_1$=$CR_2$— or —C≡C—. $R_1$ and $R_2$ represent each independently a hydrogen atom, alkyl group, aryl group, monovalent heterocyclic group or cyano group. m represents 0 or 1.)

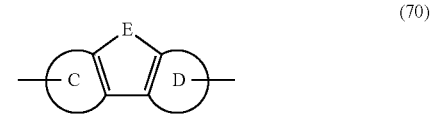

(2)

(wherein, a ring A and a ring B represent each independently an aromatic hydrocarbon ring optionally having a substituent, and at least one of the ring A and the ring B is an aromatic hydrocarbon ring having two or more benzene rings condensed, two bonds are present on the ring A and/or the ring B, and Rw and Rx represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, aryloxy' group, imine residue, amide group, acid imide group, monovalent heterocyclic group, carboxyl group, substituted carboxyl group or cyano group, and Rw and Rx may be mutually connected to form a ring.)

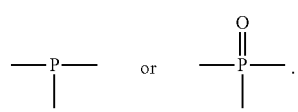

(70)

(wherein, a ring C and a ring D represent each independently an aromatic ring. The ring C or the ring D optionally have a substituent selected from the group consisting of an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group. When there are two or more of substituents, they may be the same or different. E represents O or S.).

MODES FOR CARRYING OUT THE INVENTION

The polymer compound of the present invention comprises a repeating unit of the above-described formula (1), and at least one of a repeating unit of the above-described formula (2) and a repeating unit of the above-described formula (70).

The polymer compound of the present invention may comprise only one or two or more of repeating units of the above-described formula (1).

The polymer compound of the present invention may comprise only one, or two or more of repeating units of the above-described formula (2).

The polymer compound of the present invention may comprise only one, or two or more of repeating units of the above-described formula (70).

Q in the above-described formula (1) represents

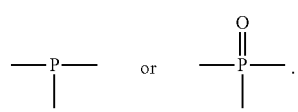

$Ar_1$ and $Ar_2$ in the above-described formula (1) represent each independently an arylene group, divalent heterocyclic group or divalent aromatic amine group. Here, $Ar_1$ and $Ar_2$ optionally have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, cyano group or the like. When $Ar_1$ and $Ar_2$ have two or more of substituents, they may be the same or different.

From the standpoint of the fluorescence intensity of a polymer compound, preferable $Ar_1$ and $Ar_2$ are an arylene group or a divalent heterocyclic group.

In the above-described formula (1), the arylene group is an atomic group remaining after removing two hydrogen atoms from an aromatic hydrocarbon, and has a carbon number of usually about from 6 to 60. This carbon number does not include the carbon number of substituents. Here, the aromatic hydrocarbon includes also those having a condensed ring, and those in which independent two or more benzene rings or condensed rings are connected directly or via a group such as vinylene and the like.

Examples of the arylene group include phenylene groups (for example, the following formulae 1 to 3), naphthalenediyl groups (the following formulae 4 to 13), anthracenylene-diyl groups (the following formulae 14 to 19), biphenylene groups (the following formulae 20 to 25), triphenylene groups (the following formulae 26 to 28), condensed ring compound groups (the following formulae 29 to 38), stilbene-diyl (the following formulae A to D), distilbene-diyl (the following formulae E, F), benzofluorene-diyl (the following formulae G, H, I, K), and the like.

Of them, preferable are phenylene groups, naphthalenediyl groups, biphenylene groups, fluorine-diyl groups, stilbene-diyl (the following formulae A to D), distilbene-diyl (the following formulae E, F) and benzofluorene-diyl (the following formulae G, H, X, K). From the standpoint of easiness of synthesis of a monomer, phenylene groups are more preferable.

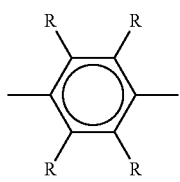

1

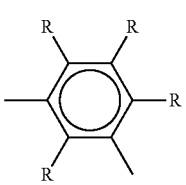

2

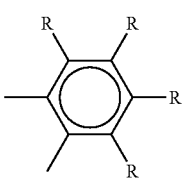

3

-continued

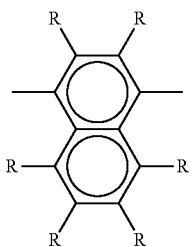

4

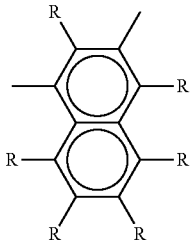

5

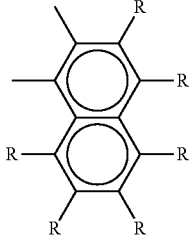

6

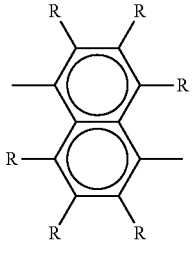

7

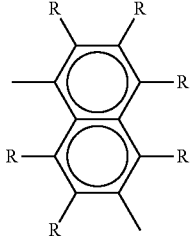

8

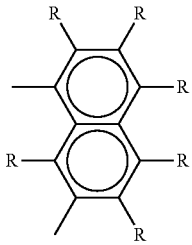

9

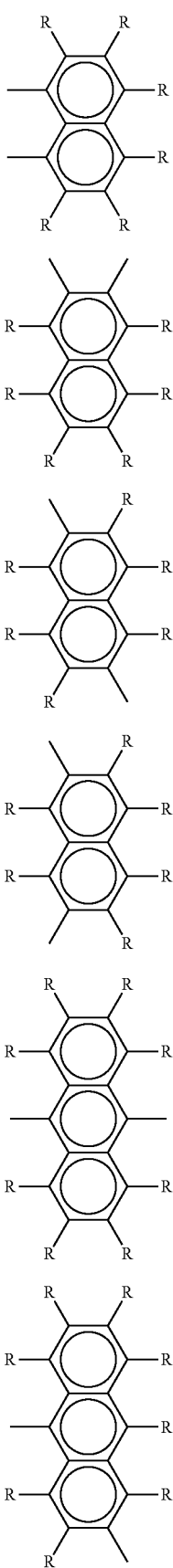
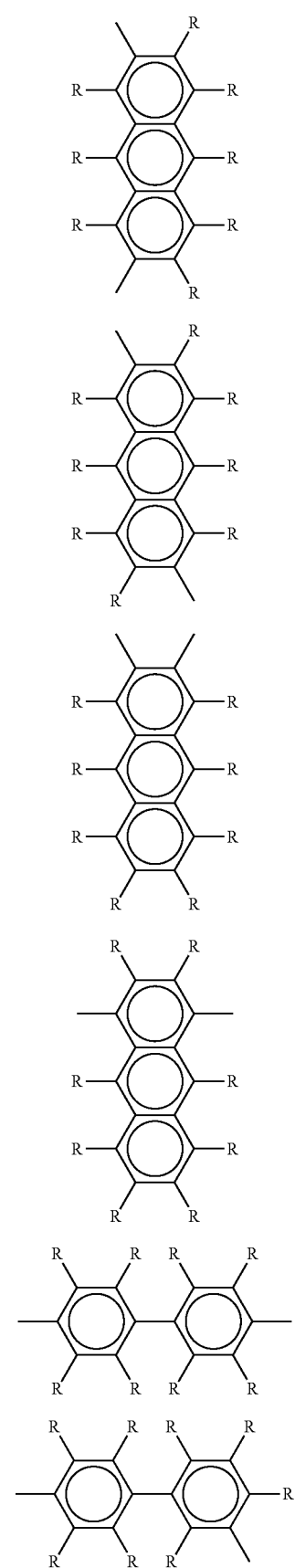

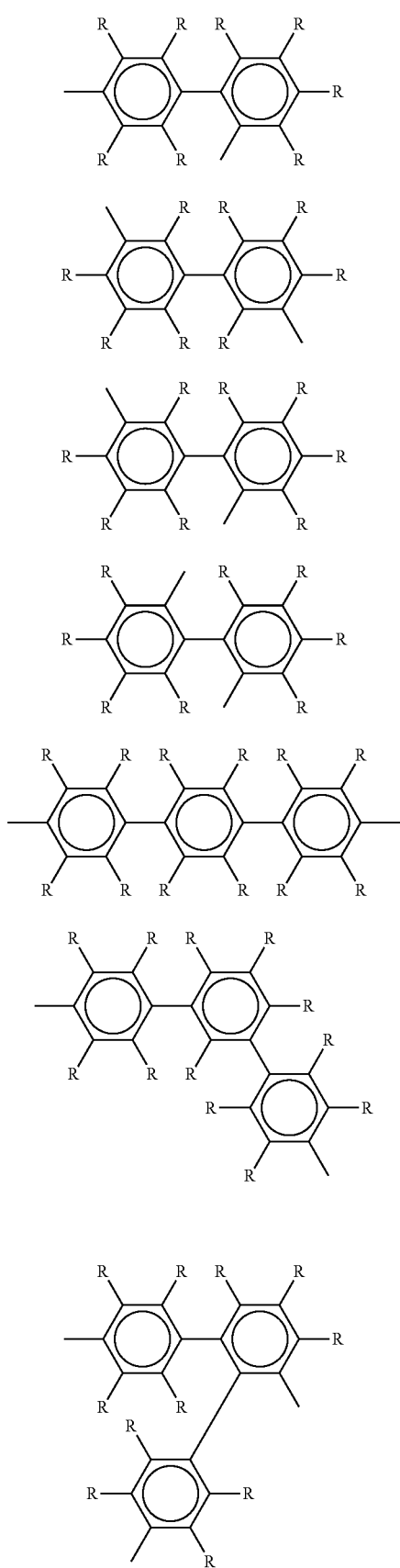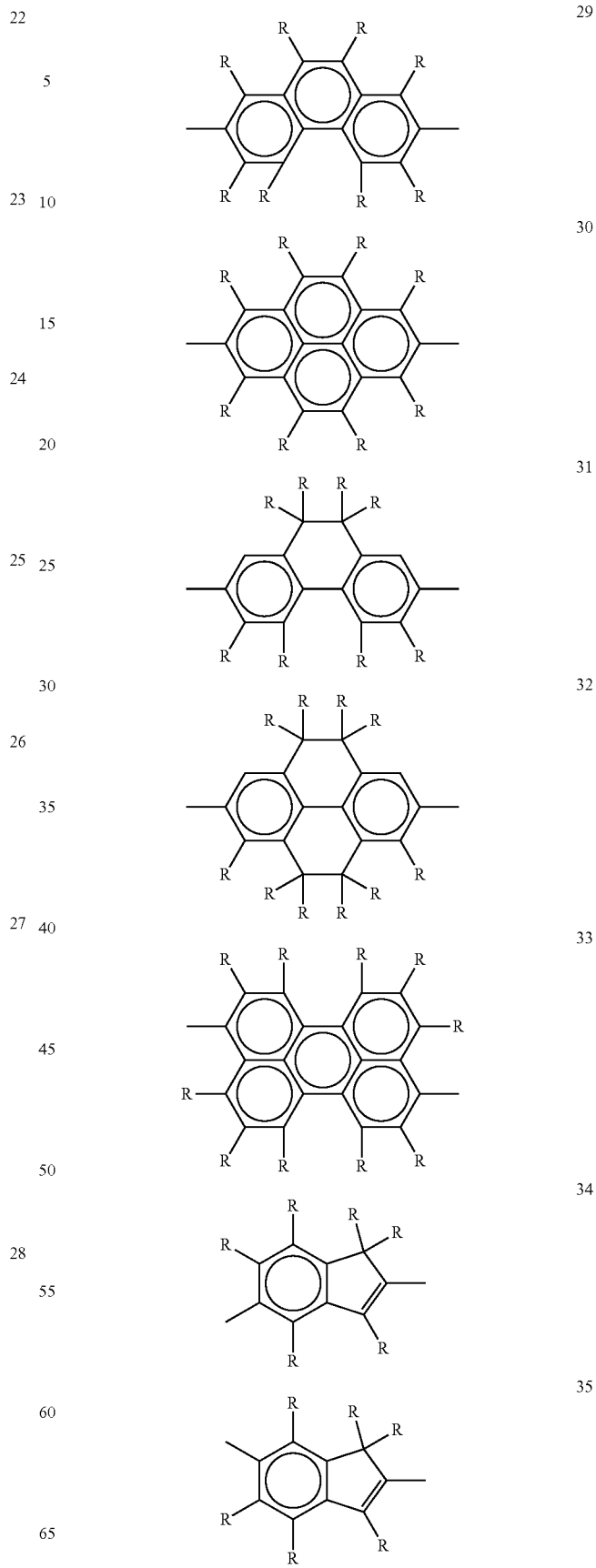

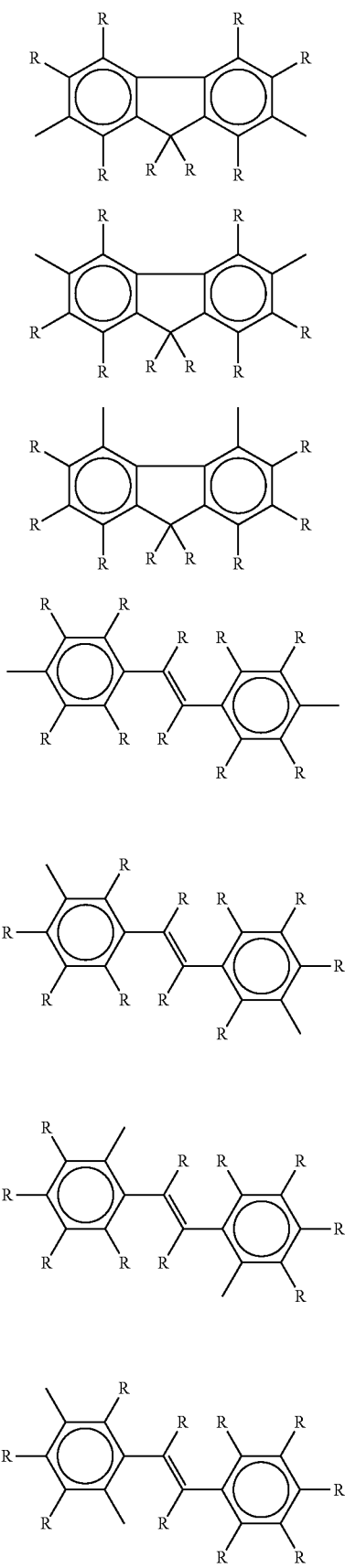
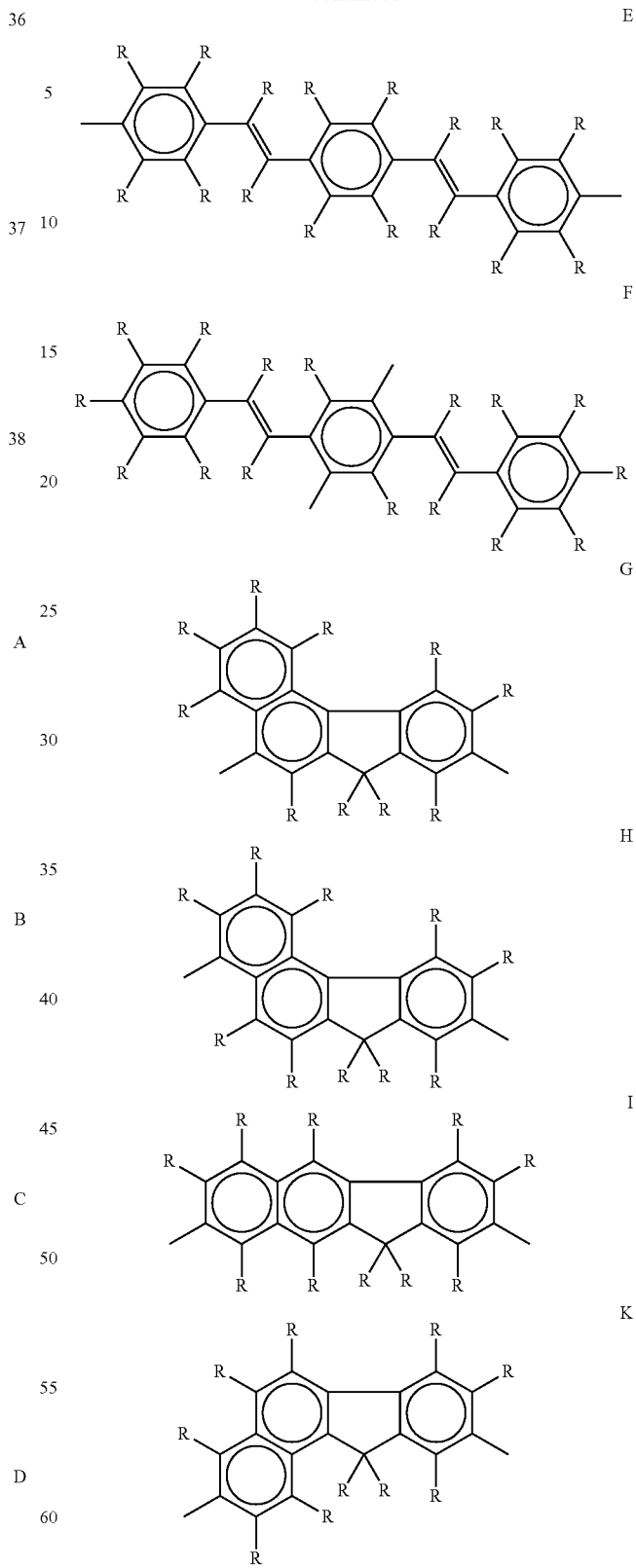
In the above-described formulae 1 to 38, A to I and K, Rs represent each independently a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group. In the above-described examples, two or more of Rs in one structural formula may be the same or different.

The alkyl group may be any of linear, branched or cyclic one, the carbon number thereof is usually about from 1 to 20, and examples thereof include a methyl group, ethyl group, propyl group, i-propyl group, butyl group, 1-butyl group, t-butyl group, pentyl group, hexyl group, cyclohexyl group, heptyl group, octyl group, 2-ethylhexyl group, nonyl group, decyl group, 3,7-dimethyloctyl group, lauryl group and the like, and preferable are a pentyl group, hexyl group, octyl group, 2-ethylhexyl group, decyl group and 3,7-dimethyloctyl group.

The alkoxy group may be any of linear, branched or cyclic one, the carbon number thereof is usually about from 1 to 20, and examples thereof include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group and the like, and preferable are a pentyloxy group, hexyloxy group, octyloxy group, 2-ethylhexyloxy group, decyloxy group and 3,7-dimethyloctyloxy group.

The alkylthio group may be any of linear, branched or cyclic one, the carbon number thereof is usually about from 1 to 20, and examples thereof include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and the like, and preferable are a pentylthio group, hexylthio group, octylthio group, 2-ethylhexylthio group, decylthio group and 3,7-dimethyloctylthio group.

The alkylsilyl group may be arty of linear, branched or cyclic one the carbon number thereof is usually about from 1 to 60, and examples thereof include a methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group and the like, and preferable are a pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyl-dimethylsilyl group, decyldimethylsilyl group and 3,7-dimethyloctyl-dimethylsilyl group.

The alkylamino group may be any of linear, branched or cyclic one and may be a monoalkylamino group or dialkylamino group, the carbon number thereof is usually about from 1 to 40, and examples thereof include a methylamino group, dimethylamino group, ethylamino group, diethylamino group, propylamino group, i-propylamino group, butylamino group, 1-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group and the like, and preferable are a pentylamino group, hexylamino group, octylamino group, 2-ethylhexylamino group, decylamino group and 3,7-dimethyloctylamino group.

The aryl group has a carbon number of usually about from 6 to 60, and examples thereof include a phenyl group, $C_1$ to $C_{12}$ alkoxyphenyl groups ($C_1$ to $C_{12}$ means a carbon number of 1 to 12. Applicable also in the later descriptions), $C_1$ to $C_{12}$ alkylphenyl groups, 1-naphthyl group, 2-naphthyl group and the like, and preferable are $C_1$ to $C_{12}$ alkoxyphenyl groups and $C_1$ to $C_{12}$ alkylphenyl groups.

The aryloxy group has a carbon number of usually about from 6 to 60, and examples thereof include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and preferable are $C_1$ to $C_{12}$ alkoxyphenoxy groups and $C_1$ to $C_{12}$ alkylphenoxy groups.

The arylalkyl group has a carbon number of usually about from 7 to 60, and examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about from 7 to 60, and examples thereof include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkenyl group has a carbon number of usually about from 8 to 60, and examples thereof include phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like, and preferable are $C_1$ to $C_{12}$ alkoxyphenyl-$C_2$ to $C_{12}$ alkenyl groups and $C_1$ to $C_{12}$ alkylphenyl-$C_2$ to $C_{12}$ alkenyl groups.

The arylalkynyl group has a carbon number of usually about from 8 to 60, and examples thereof include phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like, and preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The arylamino group has a carbon number of usually about from 6 to 60, and a phenylamino group, diphenylamino group, $C_1$ to $C_{12}$ alkoxyphenylamino groups, di ($C_1$ to $C_{12}$ alkoxyphenyl)amino groups, di ($C_1$ to $C_{12}$ alkylphenyl)amino groups, 1-naphthylamino group, 2-naphthylamino group and the like are illustrated, and preferable are $C_i$ to $C_{12}$ alkylphenylamino groups and di ($C_1$ to $C_{12}$ alkylphenyl)amino groups.

The monovalent heterocyclic group has a carbon number of usually about from 4 to 60, and examples thereof include a thienyl group, $C_1$ to $C_{12}$ alkylthienyl groups, pyrrolyl group, furyl group, pyridyl group, $C_1$ to $C_{12}$ alkylpyridyl groups and the like, and preferable are a thienyl group, $C_1$ to $C_{12}$ alkylthienyl groups, pyridyl group and $C_1$ to $C_{12}$ alkylpyridyl groups. The monovalent heterocyclic group means an atomic group remaining after removal of one hydrogen atom from a heterocyclic compound.

When the above-mentioned substituent contains an alkyl chain, this alkyl chain may be interrupted by a heteroatom or a group containing a heteroatom. Here, examples of the heteroatom include an oxygen atom, sulfur atom, nitrogen atom and the like. As the heteroatom or group containing a heteroatom, for example, the following groups are mentioned.

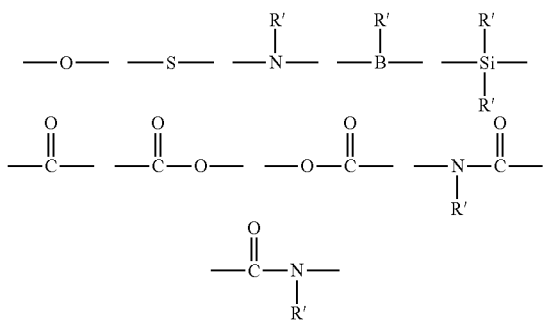

Here, examples of R' include a hydrogen atom, alkyl groups having 1 to 20 carbon atoms, aryl groups having 6 to 60 carbon atoms and monovalent heterocyclic groups having 4 to 60 carbon atoms.

For enhancing the solubility of a polymer compound of the present invention in solvents, it is preferable that the shape of a repeating unit has little symmetry, and it is preferable that a cyclic or branched alkyl chain is contained in one or more Rs. Two or more of Rs may be connected to form a ring.

Substituents containing an alkyl chain, among groups represented by R, may be any of linear, branched or cyclic one or a combination thereof. In the case of not being linear, examples include an isoamyl group, 2-ethylhexyl group, 3,7-dimethyloctyl group, cyclohexyl group, 4-$C_1$ to $C_{12}$ alkylcyclohexyl groups and the like.

In the above-described formula (1), the divalent heterocyclic group means an atomic group remaining after removing two hydrogen atoms from a heterocyclic compound, and the carbon number thereof is usually about from 4 to 60. This carbon number does not include the carbon number of substituents. Here, the heterocyclic compound refers to organic compounds having a cyclic structure in which elements constituting the cyclic structure include not only a carbon atom, but also a heteroatom such as oxygen, sulfur, nitrogen, phosphorus, boron and the like contained in the ring. As the divalent heterocyclic group, divalent aromatic heterocyclic groups are preferable.

Examples of the divalent heterocyclic group include the following groups.

Groups containing nitrogen as a heteroatom; pyridine-diyl group (the following formulae 39 to 44), diazaphenylene group (the following formulae 45 to 48), quinolinediyl group (the following formulae 49 to 63), quinoxalinediyl group (the following formulae 64 to 68), acridinediyl group (the following formulae 69 to 72), bipyridyldiyl group (the following formulae 73 to 75), phenanthrolinediyl group (the following formulae 76 to 78), and the like.

Groups containing silicon, nitrogen, oxygen, sulfur, selenium and the like as a heteroatom and having a fluorene structure (the following formulae 79 to 93).

5-membered ring heterocyclic groups containing silicon, nitrogen, oxygen, sulfur, selenium and the like as a heteroatom (the following formulae 94 to 98) are mentioned.

5-membered ring condensed heterocyclic groups containing silicon, nitrogen, oxygen, sulfur, selenium and the like as a heteroatom (the following formulae 99 to 108) are mentioned.

5-membered ring heterocyclic groups containing sulfur and the like as a heteroatom, and having bonding at a-position of its heteroatom to form a dimer or oligomer (the following formulae 109 to 110) are mentioned.

5-membered ring heterocyclic groups containing silicon, nitrogen, oxygen, sulfur, selenium and the like as a heteroatom, and having bonding to a phenyl group at a-position of its heteroatom (the following formulae 111 to 117) are mentioned.

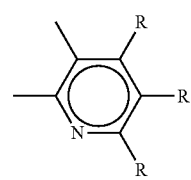

39

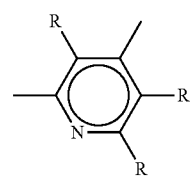

40

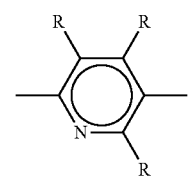

41

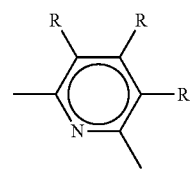

42

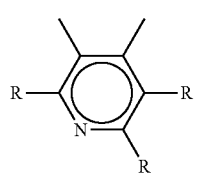

43

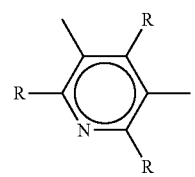

44

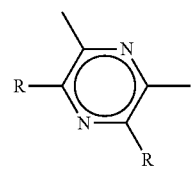

45

46
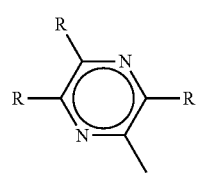
47
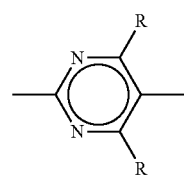
48
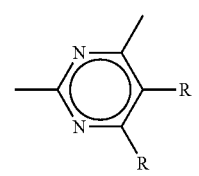
49
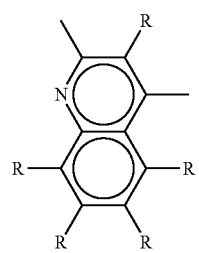
50
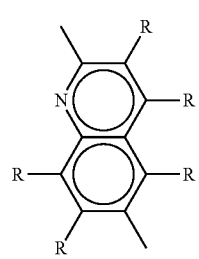
51
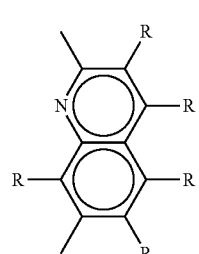
52
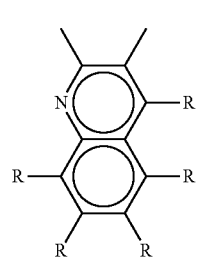
53
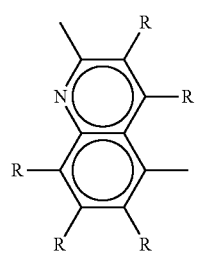
54
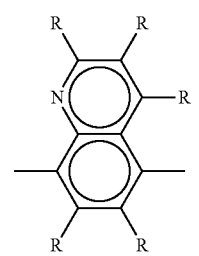
55
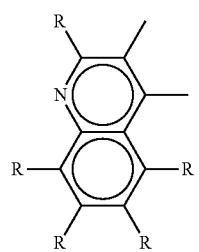
56
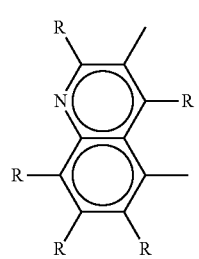
57
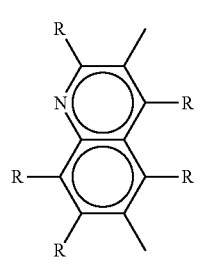
58
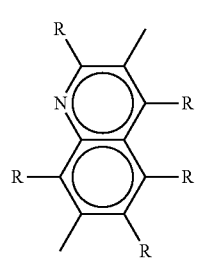

-continued
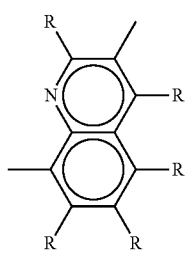
59
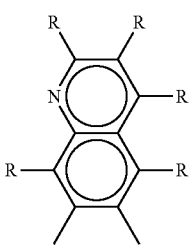
60
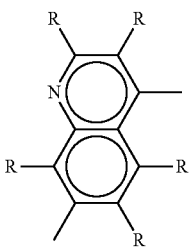
61
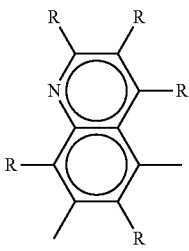
62
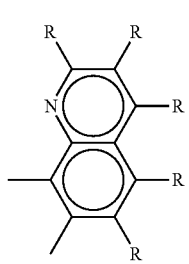
63
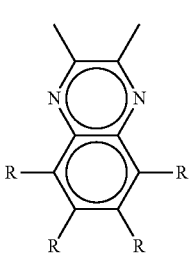
64
-continued
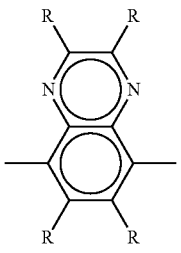
65
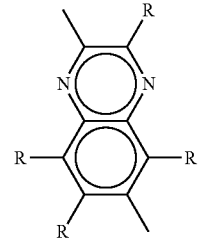
66
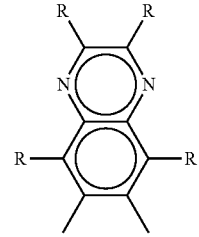
67
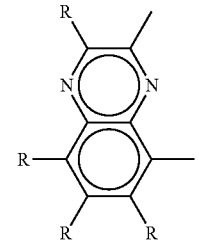
68
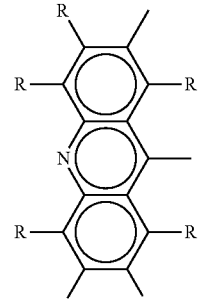
69
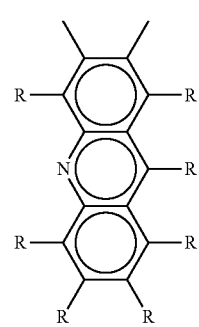
70

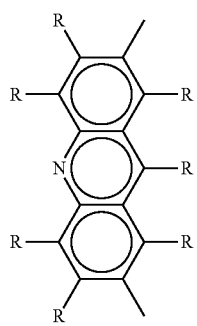
71
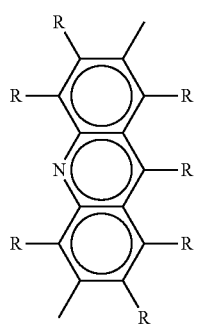
72
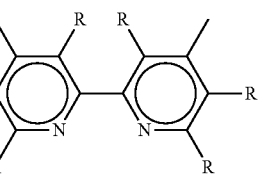
73
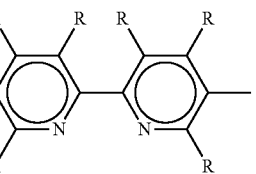
74
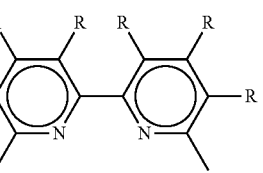
75
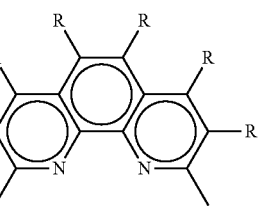
76
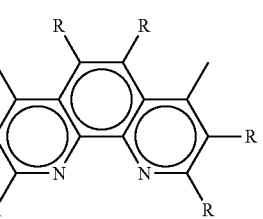
77
78
79
80
81
82
84
85
86

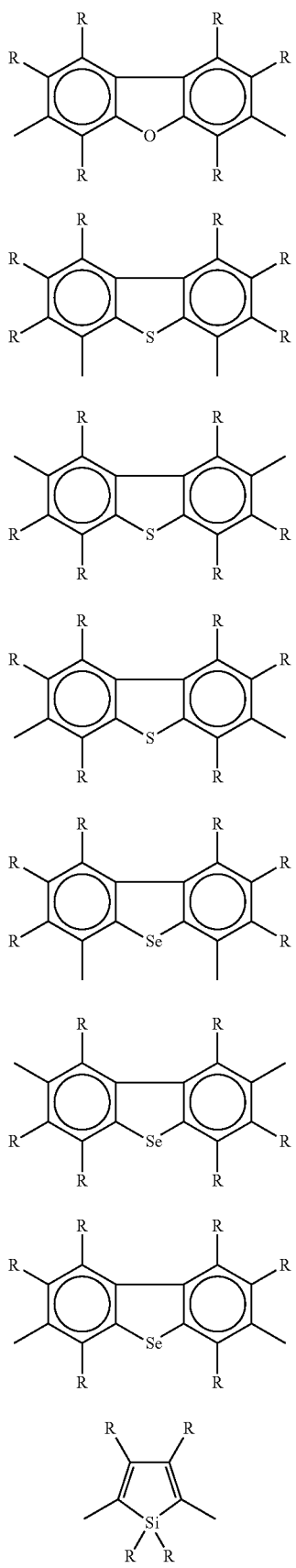
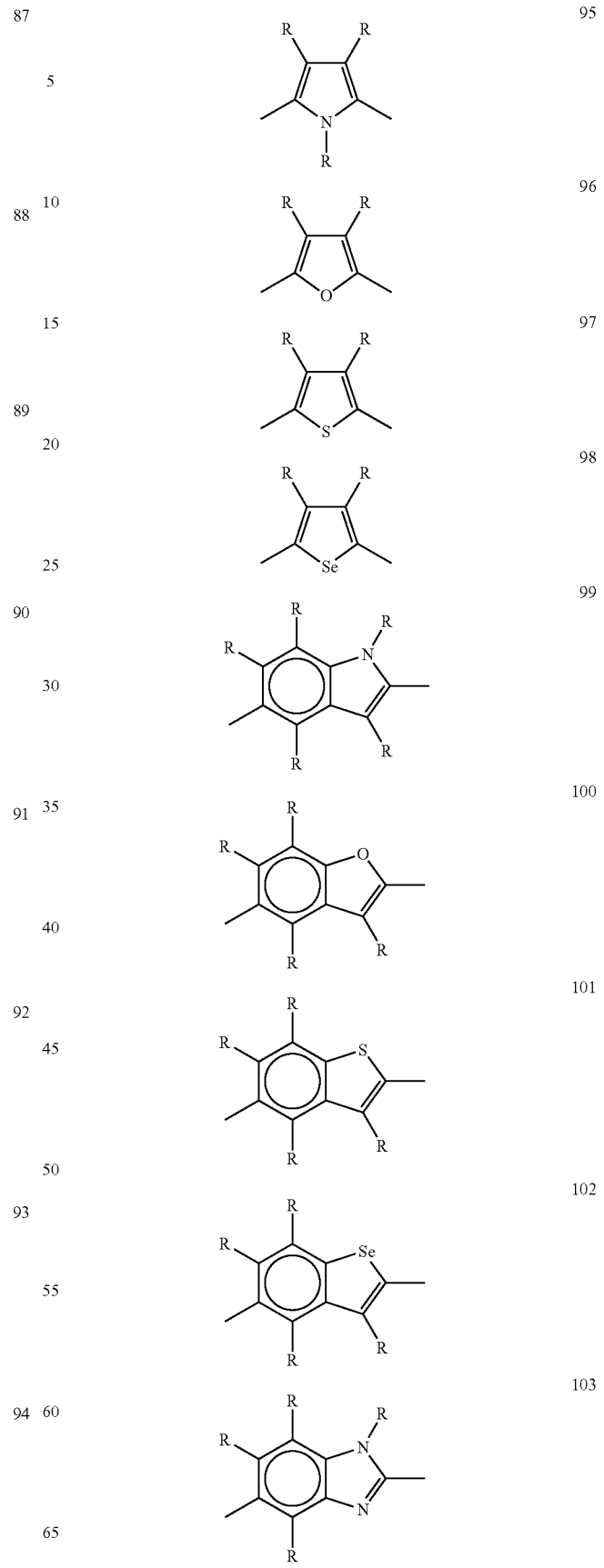

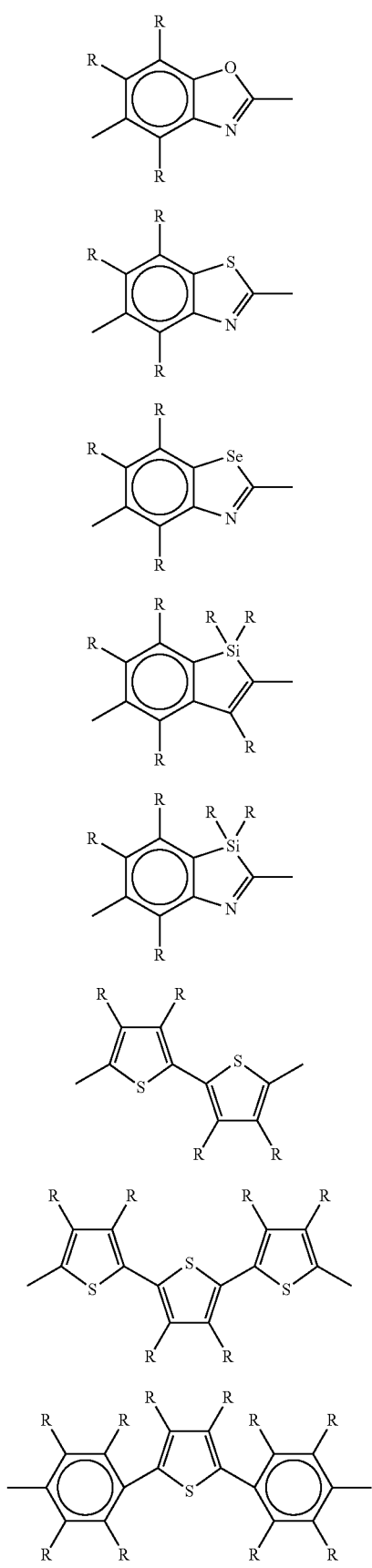
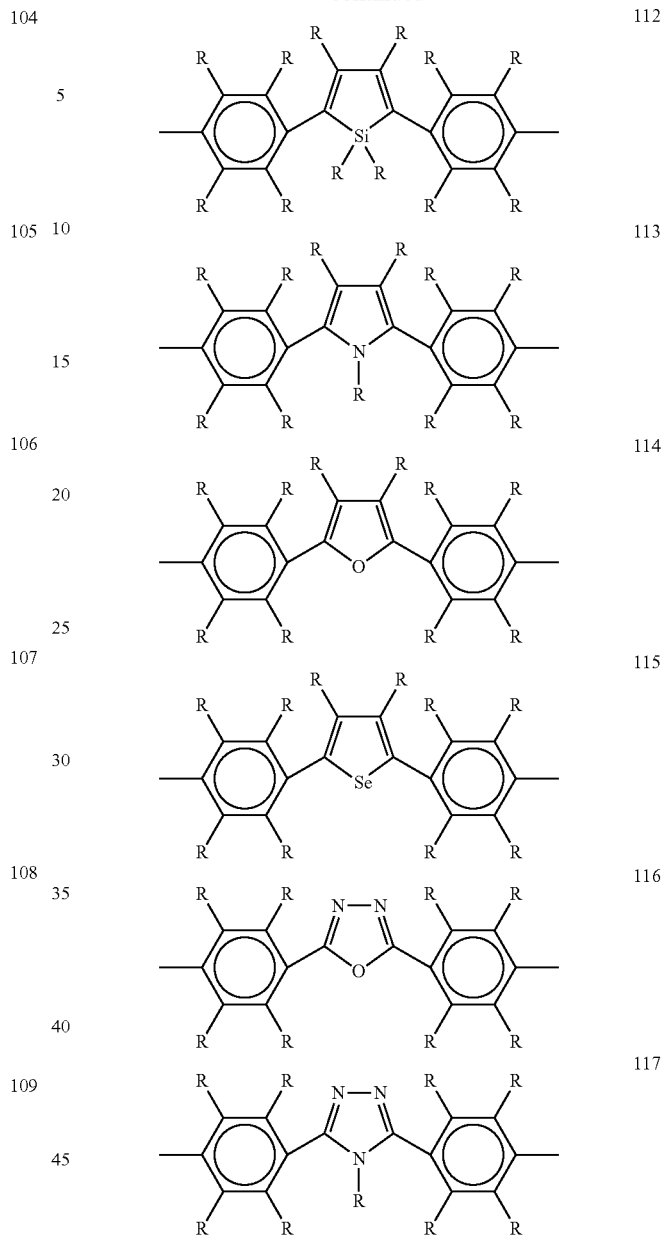

In the above-described formulae 39 to 117, R represents the same meaning as described above.

In the above-described formula (1), the divalent aromatic amine group means an atomic group remaining after removal of two hydrogen atoms from an aromatic amine, and has a carbon number of usually about from 4 to 60, and this carbon number does not include the carbon number of substituents. As the divalent aromatic amine group, for example, groups of the following general formula (3) are mentioned.

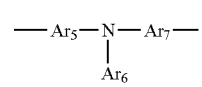

(3)

In the formula, $Ar_5$ and $Ar_7$ represent each independently an arylene group optionally having a substituent, a group of the general formula (4) or a group of the general formula (5). $Ar_5$ represents an aryl group optionally having a substituent, a group of the general formula (6) or a group of the general formula (7). A ring may be formed between $Ar_5$ and $Ar_6$, between $Ar_5$ and $Ar_7$, or between $Ar_6$ and $Ar_7$.

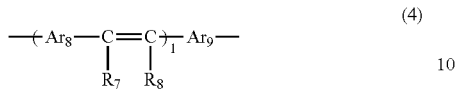   (4)

In the formula, $Ar_8$ and $Ar_9$ represent each independently an arylene group optionally having a substituent. $R_7$ and $R_8$ represent each independently a hydrogen atom, alkyl group, aryl group, monovalent heterocyclic group or cyano group. 1 is 0 or 1.

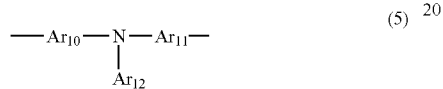   (5)

In the formula, $Ar_{10}$ and $Ar_{11}$ represent each independently an arylene group optionally having a substituent. $Ar_{12}$ is an aryl group optionally having a substituent. A ring may be formed between $Ar_{10}$ and $Ar_{12}$, between $Ar_{10}$ and $Ar_{11}$, or between $Ar_{11}$ and $Ar_{12}$.

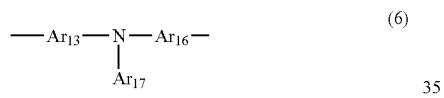   (6)

In the formula, $Ar_{13}$ represents an arylene group optionally having a substituent. $Ar_{16}$ and $Ar_{17}$ represent each independently an aryl group optionally having a substituent. A ring may be formed between $Ar_{13}$ and $Ar_{16}$, between $Ar_{13}$ and $Ar_{17}$, or between $Ar_{16}$ and $Ar_{17}$.

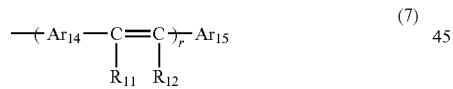   (7)

In the formula. $Ar_{14}$ represents an arylene group optionally having a substituent. $Ar_{15}$ represents an aryl group optionally having a substituent. $R_{11}$ and $R_{12}$ represent each independently a hydrogen atom, alkyl group, aryl group, monovalent heterocyclic group or cyano group. r is 0 or 1.

$Ar_5$, $Ar_7$ in the above-described formula (3), $Ar_8$, $Ar_9$ in the above-described formula (4), $Ar_{10}$, $Ar_{11}$ in the above-described formula (5), $Ar_{13}$ in the above-described formula (6) and $Ar_{14}$ in the above-described formula (7) optionally have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, cyano group or the like.

$Ar_6$ in the above-described formula (3), $Ar_{12}$ in the above-described formula (5), $Ar_{16}$, $Ar_{17}$ in the above-described formula (6) and $Ar_{15}$ in the above-described formula (7) optionally have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, cyano group or the like.

As the divalent aromatic amine group the following groups are illustrated.

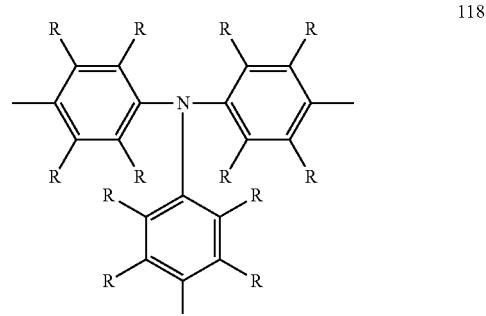

118

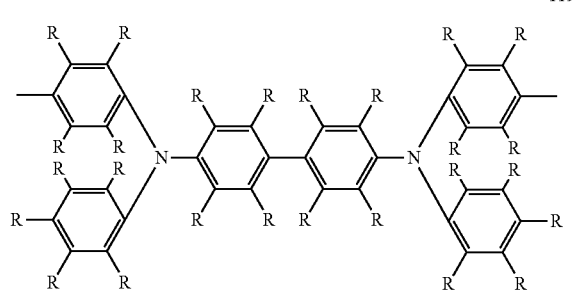

119

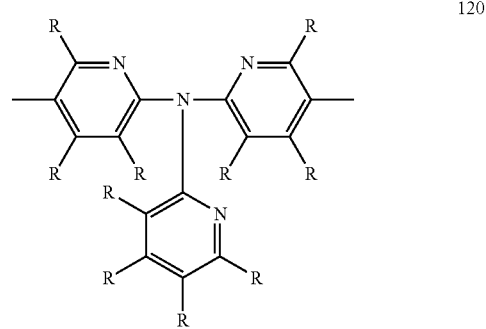

120

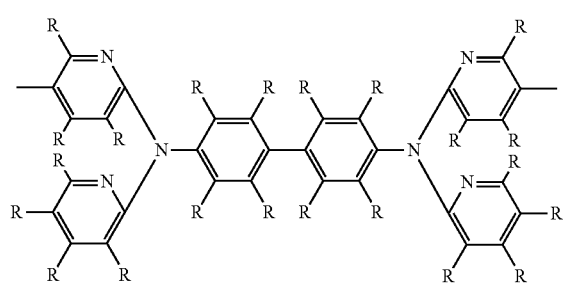

121

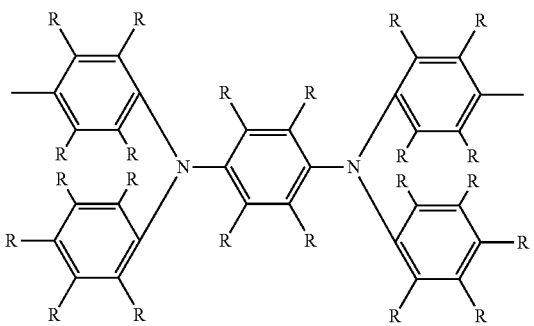

122

In the above-described formulae 118 to 122, R represents the same meaning as described above.

In the above-described formula (1), $Ar_3$ represents an aryl group, monovalent heterocyclic group or monovalent aromatic amine group. The group $Ar_3$ optionally has a substituent. The substituent includes an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group and the like.

Here, the aryl group has a carbon number of usually from about 6 to 60, and examples thereof include a phenyl group, naphthyl group, anthracenyl group, biphenyl group, triphenyl group, pyrenyl group, fluorenyl group, benzofluorenyl group, stilbene-diyl group, distilbene-diyl group and the like. Of them, preferable are a phenyl group, naphthyl group, biphenyl group, fluorenyl group, benzofluorenyl group, stilbene-diyl group and distilbene-diyl group. From the standpoint of easiness of synthesis of a monomer, a phenylene group is more preferable.

The monovalent heterocyclic group means an atomic group remaining after removing one hydrogen atom from a heterocyclic compound, and the carbon number thereof is usually from about 2 to 80.

Examples of the monovalent heterocyclic group include the following groups.

Monovalent heterocyclic groups containing nitrogen as a heteroatom; pyridinyl group, diazaphenyl group, quinolinyl group, quinoxalinyl group, acridinyl group, bipyridinyl group), phenanthroline-yl group and the like.

Groups containing silicon, nitrogen, oxygen, sulfur, selenium and the like as a heteroatom and having a fluorene structure (groups having rings represented by the above-described formulae 79 to 93).

5-membered ring heterocyclic groups containing silicon, nitrogen, oxygen, sulfur, selenium and the like as a heteroatom (groups having rings represented by the above-described formulae 94 to 98).

5-membered ring condensed heterocyclic groups containing silicon, nitrogen, oxygen, sulfur, selenium and the like as a heteroatom (groups having rings represented by the above-described formulae 99 to 108).

5-membered ring heterocyclic groups containing sulfur and the like as a heteroatom, and having bonding at a-position of its heteroatom to form a dimer or oligomer (groups having rings represented by the above-described formulae 109 to 110).

5-membered ring heterocyclic groups containing silicon, nitrogen, oxygen, sulfur, selenium and the like as a heteroatom, and having bonding to a phenyl group at a-position of its heteroatom (groups having rings represented by the above-described formulae 111 to 117).

Further, the monovalent heterocyclic group includes also, for example, groups derived from triplet light emitting complexes, and the like, and examples thereof include monovalent metal complex groups as illustrated below.

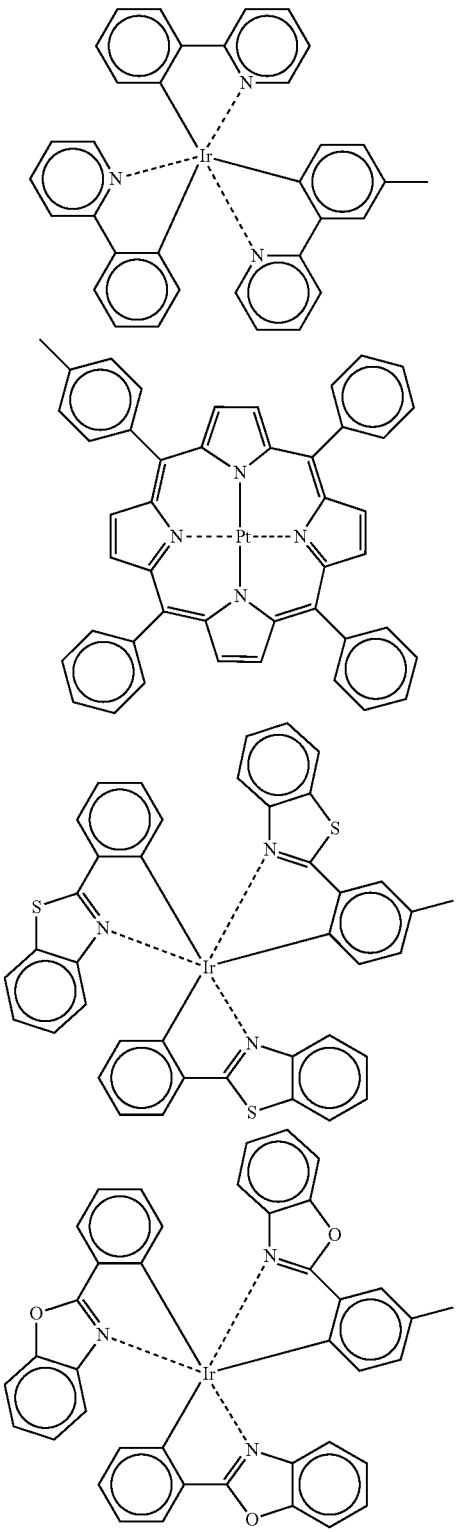

-continued

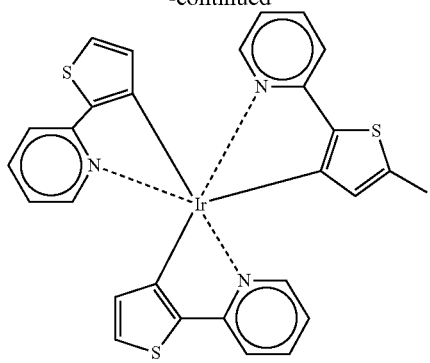

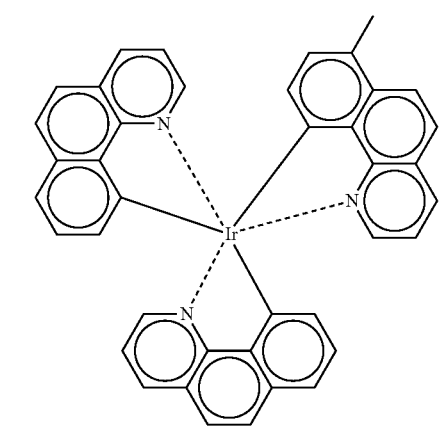

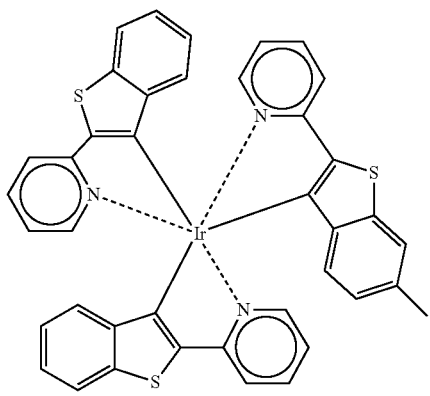

The monovalent aromatic amine group means an atomic group remaining after removal of one hydrogen atom from an aromatic amine, and has a carbon number of usually about from 4 to 60, and this carbon number does not include the carbon number of substituents. As the monovalent aromatic amine group, for example, groups of the following formulae 123 to 127 are illustrated.

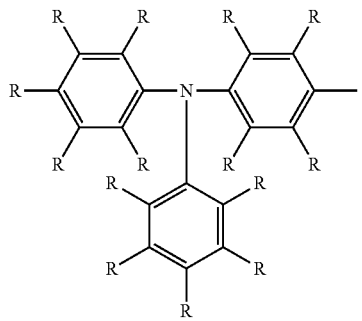

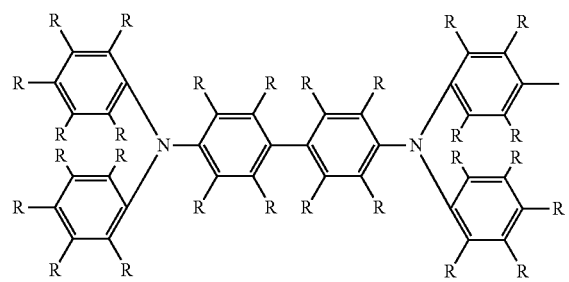

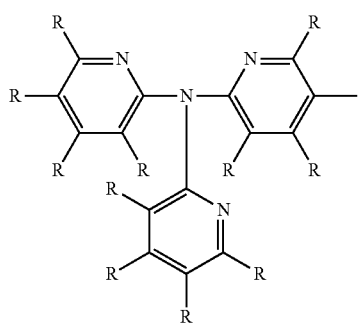

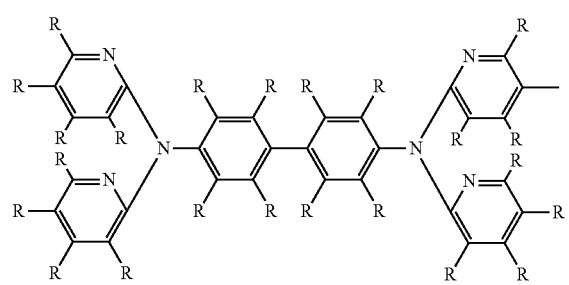

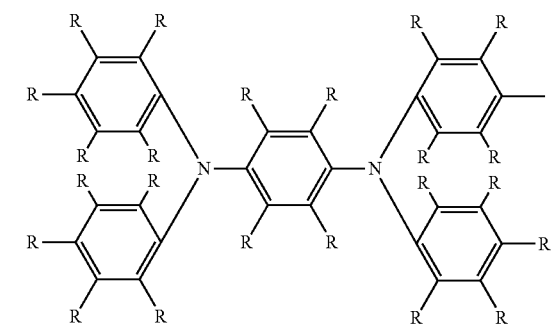

In the above-described formulae 123 to 127, R represents the same meaning as described above.

In the above-described formula (1), Z represents —CR$_1$═CR$_2$— or —C≡C—, and —CR$_1$═CR$_2$— is preferable from the standpoint of stability of a polymer compound. m is 0 or 1, and 0 is preferable from the standpoint of photooxidation stability of a polymer compound.

Here, R$_1$ and R$_2$ represent each independently a hydrogen atom, alkyl group, aryl group, monovalent heterocyclic group or cyano group.

As the repeating unit of the formula (1), those as described below are mentioned.

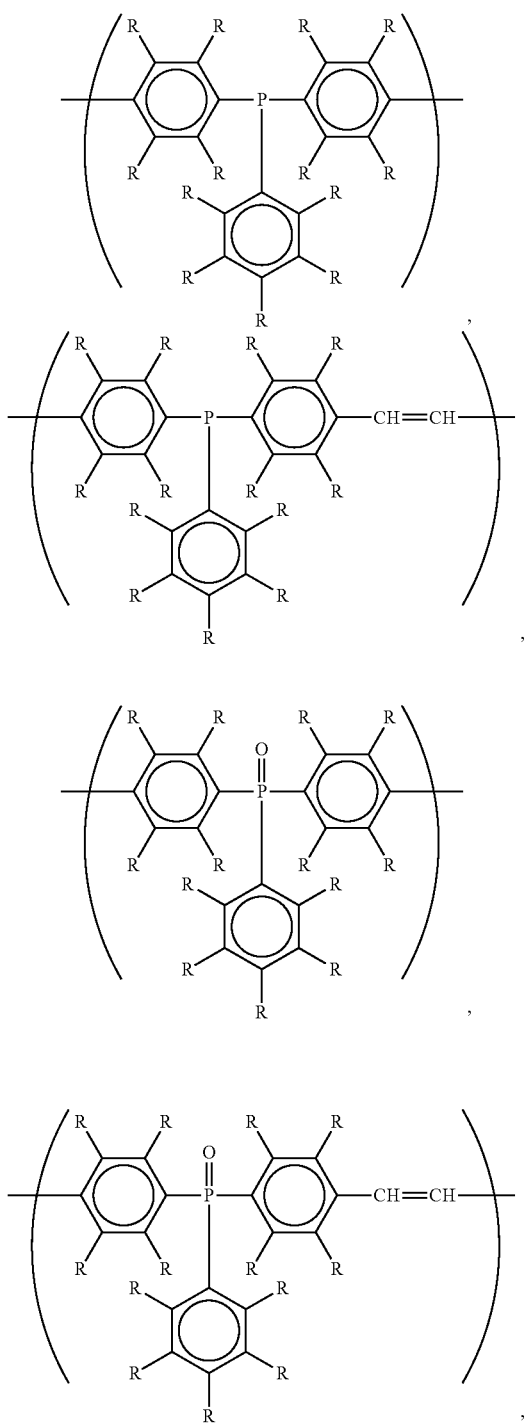

The polymer compound of the present invention contains one or more of at least one of repeating units of the above-described formula (2) and repeating units of the above-described formula (70), in addition to the above-described repeating unit of the formula (1).

In the formula (2), a ring A and a ring B represent each independently an aromatic hydrocarbon ring optionally having a substituent, and at least one of them is an aromatic hydrocarbon ring into which two or more benzene rings are condensed. In the aromatic hydrocarbon ring, an aromatic hydrocarbon ring other than a benzene ring and/or a non-aromatic hydrocarbon-type condensed cyclic compound may further be condensed. In the polymer compound of the present invention, the aromatic hydrocarbon ring A and the aromatic hydrocarbon ring B may have mutually the same ring structure or different ring structures, however, it is preferable from the standpoints of heat resistance and fluorescence intensity that the aromatic hydrocarbon ring A and the aromatic hydrocarbon ring B have mutually different ring structures.

The aromatic hydrocarbon ring is preferably a single benzene ring or a ring into which two or more benzene rings are condensed, and examples thereof include aromatic hydrocarbon rings such as a benzene ring, naphthalene ring, anthracene ring, tetracene ring, pentacene ring, pyrene ring, phenanthrene ring and the like, and preferably a benzene ring, naphthalene ring, anthracene ring and phenanthrene ring.

As the combination of a ring A and a ring B, preferably mentioned are combinations of a benzene ring and a naphthalene ring, a benzene ring and an anthracene ring, a benzene ring and a phenanthrene ring, a naphthalene ring and an anthracene ring, a naphthalene ring and a phenanthrene ring, and an anthracene ring and a phenanthrene ring, and more preferable is a combination of a benzene ring and a naphthalene ring.

The expression that the aromatic hydrocarbon ring A and the aromatic hydrocarbon ring 13 have mutually different ring structures means that: when

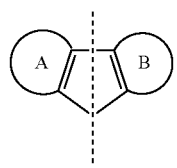

in the formula (1) is depicted by a planar structural formula, the aromatic hydrocarbon ring A and the aromatic hydrocarbon ring B are asymmetrical over a symmetrical axis (dotted line) connecting a vertex of a 5-membered ring in the middle of the structural formula and a middle point of a side opposite to the vertex.

For example, when both the ring A and the ring A represent a naphthalene ring, the ring A and the ring B have different ring structures in the case of:

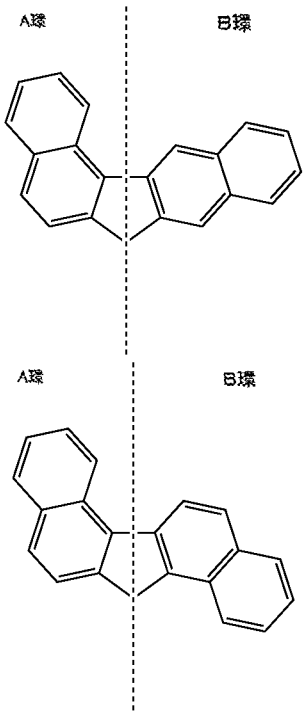

On the other hand, even if both the ring A and the ring B represent a naphthalene ring, the ring A and the ring B have the same ring structure in the case of:

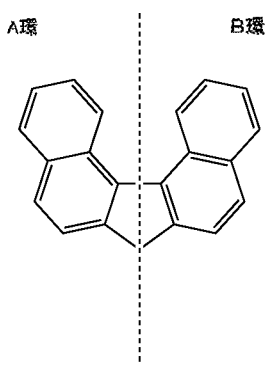

When the aromatic hydrocarbon ring has a substituent, it is preferable, from the standpoints of solubility of a polymer compound in organic solvents, properties of a device using the polymer compound, and the like, that the substituent is selected from an alkyl group, alkoxy group, alkylthio group, aryl group, acyloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group.

Here, the alkyl group may be any of linear, branched or cyclic one, has a carbon number of usually about from 1 to 20, preferably 3 to 20, and examples thereof include a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like, and for balance between heat resistance and standpoints such as solubility in organic solvents, device properties, easiness of synthesis and the like, preferable are a pentyl group, isoamyl group, hexyl group, octyl group, 2-ethylhexyl group, decyl group and 3,7-dimethyloctyl group.

The alkoxy group may be any of linear, branched or cyclic one, has a carbon number of usually about from 1 to 20, preferably 3 to 20, and examples thereof include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyloxy group, perfluorooctyloxy group, methoxymethyloxy group, 2-methoxymethyloxy group and the like, and for balance between heat resistance and standpoints such as solubility in organic solvents, device properties, easiness of synthesis and the like, preferable are a pentyloxy group, hexyloxy group, octyloxy group, 2-ethylhexyloxy group, decyloxy group and 3,7-dimethyloctyloxy group.

The alkylthio group may be any of linear, branched or cyclic one, has a carbon number of usually about from 1 to 20, preferably 3 to 20, and examples thereof include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like, and for balance between heat resistance and standpoints such as solubility in organic solvents, device properties, easiness of synthesis and the like, preferable are a pentylthio group, hexylthio group, octylthio group, 2-ethylhexylthio group, decylthio group and 3,7-dimethyloctylthio group.

The aryl group is an atomic group obtained by removing one hydrogen atom from an aromatic hydrocarbon, and includes also those having a condensed ring, and those in which independent two or more benzene rings or condensed rings are connected directly or via a group such as vinylene and the like. The aryl group has a carbon number of usually about from 6 to 60, preferably 7 to 48, and examples thereof include a phenyl group, $C_1$ to $C_{12}$ alkoxyphenyl groups ($C_1$ to $C_{12}$ shows that the carbon number is 1 to 12, being applicable also in the following descriptions), $C_1$ to $C_{12}$ alkylphenyl groups, 1-naphtyl group, 2-naphtyl group, 1-anthracenyl group, 2-anthracenyl group, 9-anthracenyl group, pentafluorophenyl group and the like, and from the standpoints of solubility in organic solvents, device properties, easiness of synthesis and the like, preferable are $C_1$ to $C_{12}$ alkoxyphenyl groups and $C_1$ to $C_{12}$ alkylphenyl groups. Examples of the $C_1$ to $C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Examples of the $C_1$ to $C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like.

The aryloxy group has a carbon number of usually about from 6 to 60, preferably 7 to 48, and examples thereof include a phenoxy group, $C_1$ to $C_{12}$ alkoxyphenoxy groups, $C_1$ to $C_{12}$ alkylphenoxy groups, 1-naphtyloxy group, 2-naphtyloxy group, pentafluorophenyloxy group and the like, and from the standpoints of solubility in organic solvents, device properties, easiness of synthesis and the like, preferable are $C_1$ to $C_{12}$ alkoxyphenoxy groups and $C_1$ to $C_{12}$ alkylphenoxy groups.

Examples of the $C_1$ to $C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Examples of the $C_1$ to $C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group and the like.

The arylthio group has a carbon number of usually about from 3 to 60, and examples thereof include a phenylthio group, $C_1$ to $C_{12}$ alkoxyphenylthio groups, $C_1$ to $C_{12}$ alkylphenylthio groups, 1-naphtylthio group, 2-naphtylthio group, pentafluorophenylthio group and the like, and from the standpoints of solubility in organic solvents, device properties, easiness of synthesis and the like, preferable are $C_1$ to $C_{12}$ alkoxyphenylthio groups and $C_1$ to $C_{12}$ alkylphenylthio groups.

The arylalkyl group has a carbon number of usually about from 7 to 60, preferably 7 to 48, and examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_i$ to $C_{12}$ alkyl groups, 1-naphthyl-$C_1$ to $C_{12}$ alkyl groups, 2-naphthyl-$C_1$ to $C_{12}$ alkyl groups and the like, and from the standpoints of solubility in organic solvents, device properties, easiness of synthesis and the like, preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about from 7 to 60, preferably 7 to 48, and examples thereof include phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and from the standpoints of solubility in organic solvents, device properties, easiness of synthesis and the like, preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylthio group has a carbon number of usually about from 7 to 60, preferably 7 to 48, and examples thereof include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups, 2-naphthyl-$C_1$ to $C_{12}$ alkylthio groups and the like, and from the standpoints of solubility in organic solvents, device properties, easiness of synthesis and the like, preferable are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a carbon number of usually about from 8 to 60, and examples thereof include phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like, and from the standpoints of solubility in organic solvents, device properties, easiness of synthesis and the like, preferable are $C_1$ to $C_{12}$ alkoxyphenyl-$C_2$ to $C_{12}$ alkenyl groups and $C_1$ to $C_{12}$ alkylphenyl-$C_2$ to $C_{12}$ alkenyl groups.

The arylalkynyl group has a carbon number of usually about from 8 to 60, and examples thereof include phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like, and from the standpoints of solubility in organic solvents, device properties, easiness of synthesis and the like, preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

As the substituted amino group, amino groups substituted with one or two groups selected from an alkyl group, aryl group, arylalkyl group or monovalent heterocyclic group are mentioned, and the alkyl group, aryl group, arylalkyl group or monovalent heterocyclic group optionally has a substituent. The carbon number of the substituted amino group is usually about from 1 to 60, preferably 2 to 48 not including the carbon number of the substituent.

Specific examples include a methylamino group, dimethylamino group, ethylamino group, diethylamino group, propylamino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, $C_1$ to $C_{12}$ alkoxyphenylamino group, di($C_1$ to $C_{12}$ alkoxyphenyl)amino group, di($C_1$ to $C_{12}$ alkylphenyl)amino group, 1-naphthylamino group, 2-naphthylamino group, pentafluorophenylamino group, pyridylamino group, pyridazinylamino group, pyrimidylamino group, pyrazylamino group, triazylamino group, phenyl-$C_1$ to $C_{12}$ alkylamino group, $C_1$ to $C_{12}$ alkoxyphenyl-$C_1$ to $C_{12}$ alkylamino group, $C_1$ to $C_{12}$ alkylphenyl-$C_1$ to $C_{12}$ alkylamino group, di($C_1$ to $C_{12}$ alkoxyphenyl-$C_1$ to $C_{12}$ alkyl)amino group, di($C_1$ to $C_{12}$ alkylphenyl-$C_1$ to $C_{12}$ alkylamino group, 1-naphthyl-$C_1$ to $C_{12}$ alkylamino group, 2-naphthyl-$C_1$ to $C_{12}$ alkylamino group and the like.

As the substituted silyl group, silyl groups Substituted with one, two or three groups selected from an alkyl group, aryl group, arylalkyl group or monovalent heterocyclic group are mentioned. The carbon number of the substituted silyl group is usually about from 1 to 60, preferably 3 to 48. The alkyl group, aryl group, arylalkyl group or monovalent heterocyclic group optionally has a substituent.

Specific examples include a trimethylsilyl group, triethylsilyl group, tripropylsilyl group, tri-i-propylsilyl group, dimethyl-i-propylsilyl group, diethyl-i-propylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$ to $C_{12}$ alkylsilyl group, $C_1$ to $C_{12}$ alkoxyphenyl-$C_1$ to $C_{12}$ alkylsilyl group, $C_1$ to $C_{12}$ alkylphenyl-$C_1$ to $C_{12}$ alkylsilyl group, 1-naphthyl-$C_1$ to $C_{12}$ alkylsilyl group, 2-naphthyl-$C_1$ to $C_{12}$ alkylsilyl group, phenyl-$C_1$ to $C_{12}$ alkyldimethylsilyl group, triphenylsilyl group, tri-p-xylylsilyl group, tribenzylsilyl group, diphenylmethylsilyl group, t-butyldiphenylsilyl group, dimethylphenylsilyl group and the like.

Examples of the halogen atom include a fluorine atom, chlorine atom, bromine atom and iodine atom.

The acyl group has a carbon number of usually about from 2 to 20, preferably 2 to 18, and examples thereof include an acetyl group, propionyl group, butyryl group, isobutyryl group, pivaloyl group, benzoyl group, trifluoroacetyl group, pentafluorobenzoyl group and the like.

The acyloxy group has a carbon number of usually about from 2 to 20, preferably 2 to 18, and examples thereof include an acetoxy group, propionyloxy group, butyryloxy group, isobutyryloxy group, pivaloyloxy group, benzoyloxy group, trifluoroacetyloxy group, pentafluorobenzoyloxy group and the like.

The imine residue has a carbon number of about from 2 to 20, preferably 2 to 18, and examples thereof include groups of the following structural formulae, and the like.

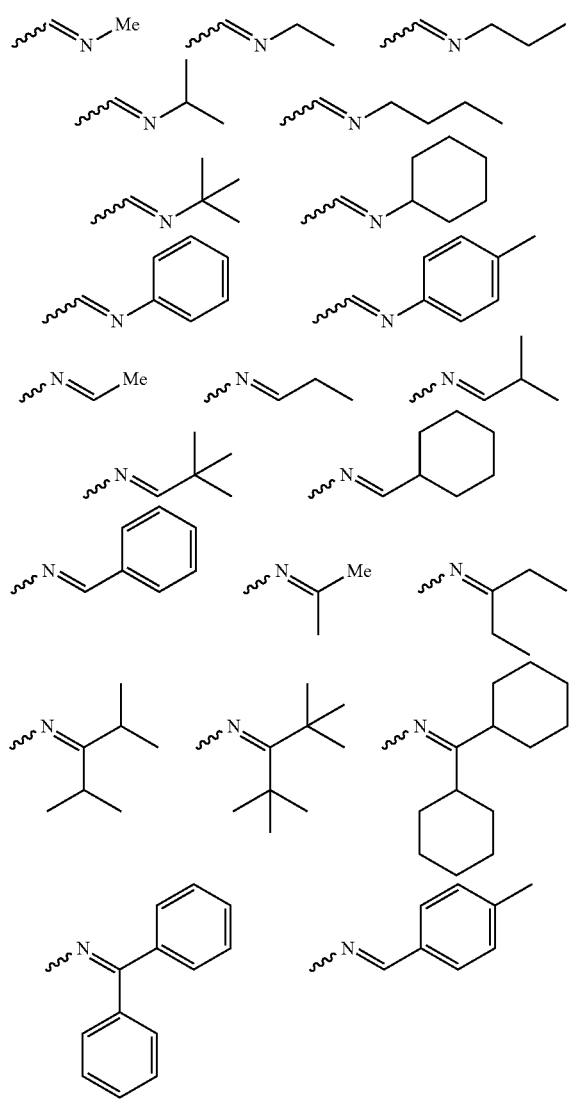

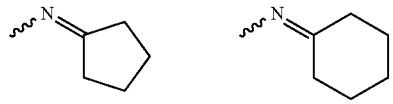

The amide group has a carbon number of usually about from 2 to 20, preferably 2 to 18, and examples thereof include a formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group and the like.

As the acid imide group, residues obtained by removing from an acid imide a hydrogen atom bonded to its nitrogen atom are mentioned, and the carbon number is about from 4 to 20, and specific examples include the following groups and the like.

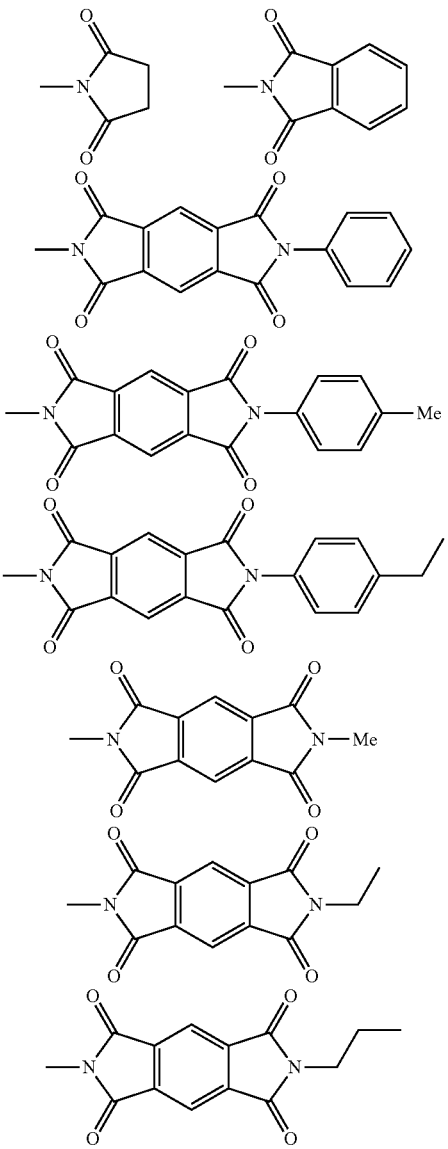

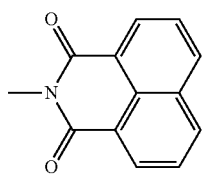 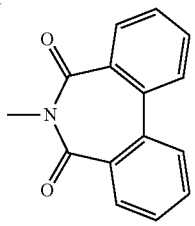

The monovalent heterocyclic group means an atomic group remaining after removing one hydrogen atom from a heterocyclic compound, and the carbon number thereof is usually about from 4 to 60, preferably 4 to 20. The carbon number of a heterocyclic group does not include the carbon number of substituents. Here, the heterocyclic compound refers to organic compounds having a cyclic structure in which elements constituting the ring include not only a carbon atom, but also a hetero atom such as oxygen, sulfur, nitrogen, phosphorus, boron and the like contained in the ring. Specific examples are a thienyl group, $C_1$ to $C_{12}$ alkylthienyl group, pyrrolyl group, furyl group, pyridyl group, $C_1$ to $C_{12}$ alkylpyridyl group, piperidyl group, quinolyl group, isoquinolyl group and the like, and preferable are a thienyl group, $C_1$ to $C_{12}$ alkylthienyl group, pyridyl group and $C_1$ to $C_{12}$ alkylpyridyl group.

As the substituted carboxyl group, carboxyl groups substituted with an alkyl group, aryl group, arylalkyl group or monovalent heterocyclic group are mentioned, and the carbon number thereof is usually about from 2 to 60, preferably 2 to 48, and examples thereof include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group, and the like. The alkyl group, aryl group, arylalkyl group or monovalent heterocyclic group optionally has a substituent. The carbon number of the substituted carboxyl group does not include the carbon number of the substituents.

In the formula (2), Rw and Rx represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group or cyano group, and Rw and Rx may be mutually connected to form a ring.

The definitions and examples of the alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group represented by Rw and Rx are the same as the definitions and examples for a substituent when the above-described aromatic hydrocarbon ring has a substituent.

In the above-described repeating unit of the formula (2), it is preferable that Rw and Rx are mutually connected to form a ring from the standpoint of heat stability of a polymer compound.

As the above-described repeating unit of the formula (2) in this case, for example, those of the following formula (60) are mentioned.

Here, a ring A and a ring B represent the same meanings as described above, and a ring F represents a hydrocarbon ring or heterocyclic ring.

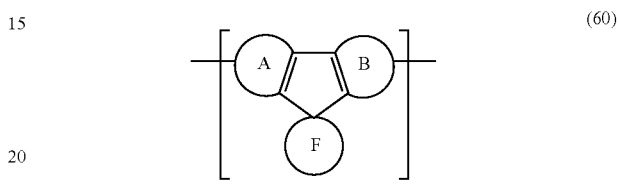

Here, in the above-described formula (60), the ring F (the following formula 2a) contains one carbon atom connected to a ring A and a ring B via a single bond.

As the hydrocarbon ring in the ring F, for example, hydrocarbon rings containing an aromatic ring are mentioned, and examples thereof include structures as represented by the following formula (2b).

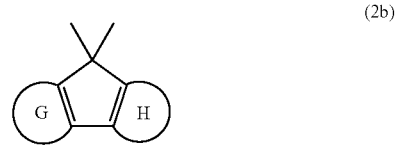

(wherein, a ring G and a ring H represent each independently an aromatic hydrocarbon ring optionally having a substituent.).

As the hydrocarbon ring, also aliphatic hydrocarbon rings are mentioned, and examples thereof include structures represented by the following formula (2c).

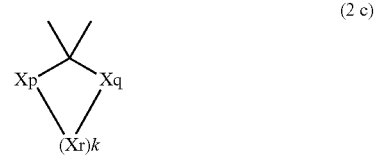

(wherein, Xp, Xq and Xr represent each independently a methylene group optionally having a substituent or an ethenylene group optionally having a substituent. k represents 0 or an integer.).

The number of carbon contained in a hydrocarbon ring is 3 or more, and the carbon number is preferably 4 or more and 20 or less. A polycyclic structure combined with other ring may also be permissible. More specific examples are $C_4$ to $C_{20}$ cycloalkyl rings and $C_4$ to $C_{20}$ cycloalkenyl rings optionally having a substituent.

Examples of the heterocyclic ring include structures in which a carbon atom contained in the ring represented by the above-described formulae (2b) and (2c) is substituted by a hetero ring. More specific examples are $C_4$ to $C_{20}$ heterocyclic rings optionally having a substituent.

Of them, $C_4$ to $C_{20}$ cycloalkyl rings, $C_4$ to $C_{20}$ cycloalkenyl rings and $C_4$ to $C_{20}$ heterocyclic rings optionally having a substituent are more preferable from the standpoints of fluorescence intensity of the resultant polymer compound in thin film state and controllability of emission color in the visible region from blue to red.

These rings optionally substituted by an alkyl group, alkoxy group, alkylthio group, halogen atom or the like. Here, the alkyl group includes a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like. The alkoxy group includes a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyloxy group, perfluorooctyloxy group, methoxymethyloxy group, 2-methoxyethyloxy group and the like. The alkylthio group includes a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like. The halogen atom includes a fluorine atom, chlorine atom, bromine atom and iodine atom.

Examples of the cycloalkyl ring include cyclobutane, cyclopentane, cyclohexane, cycloheptane, cyclooctane, cyclononane, cyclodecane, cycloundecane, cyclododecane, cyclotridecane, cyclotetradecane, cyclopentadecane, cyclohexadecane, cyclopentadecane, cyclooctadecane, cyclononadecane, cycloicosane, bicycle, ring, adamantyl ring and the like.

The cycloalkenyl ring includes also those having two or more double bonds, and examples thereof include a Cyclohexene ring, cyclohexadiene ring, cycloheptene ring, cyclohexadecene ring, cyclooctatriene ring and the like.

Examples of the heterocyclic ring include a tetrahydrofuran ring, tetrahydrothiophene ring, tetrahydroindole ring, tetrahydropyran ring, hexahydropyridine ring, tetrahydrothiopyran ring, oxocane ring, tetrahydroquinoline ring, tetrahydroisoquinoline ring, crown ethers and the like.

It is advantageous that $R_w$ and $R_x$ form a ring having a total number of 5 to 20 of carbon and other elements from the standpoints of fluorescence intensity and solubility of a polymer compound and light emission efficiency of a device using the polymer compound.

Examples of the repeating unit of the formula (2) include the following units (1A-1 to 1A-64, 1B-1 to 1B-64, 1C-1 to 1C-64, 1D-1 to 1D-18), and these units having a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group and cyano group and the like.

In the following formulae, a bond on an aromatic hydrocarbon ring can exist at any position.

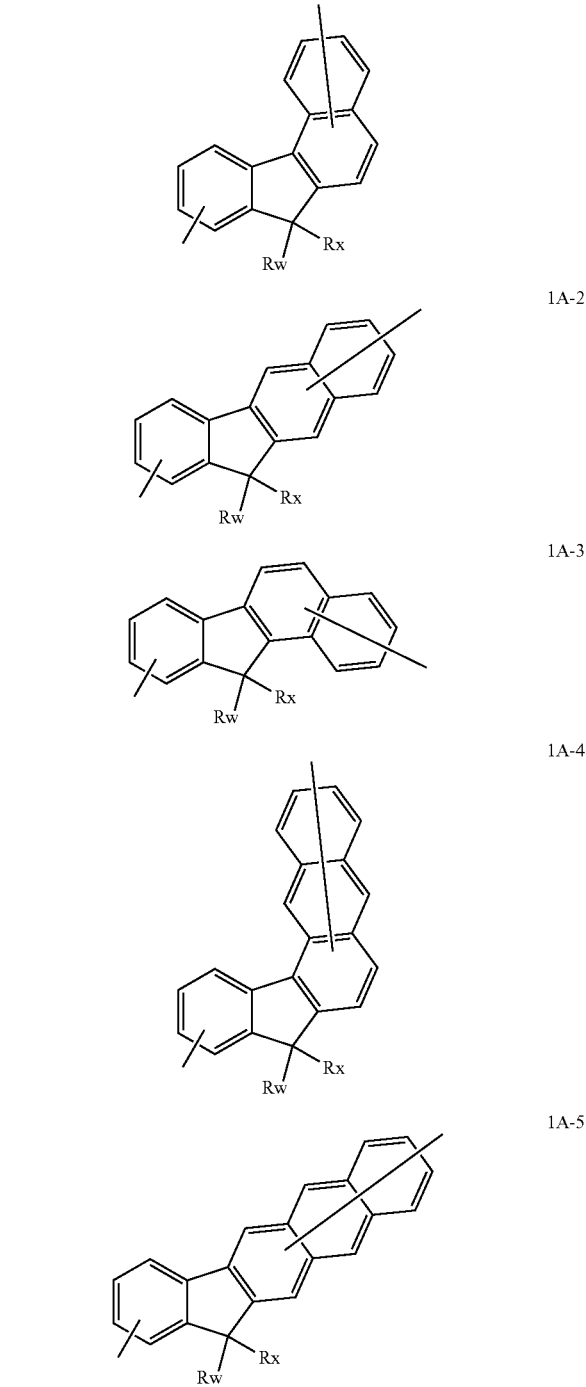

-continued
1A-6
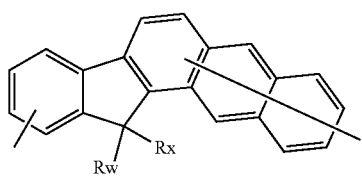
1A-7
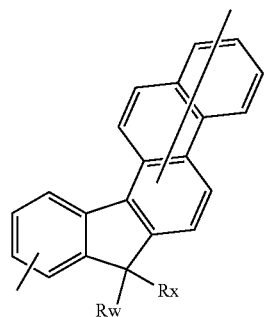
1A-8
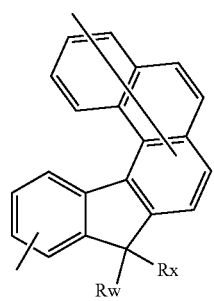
1A-9
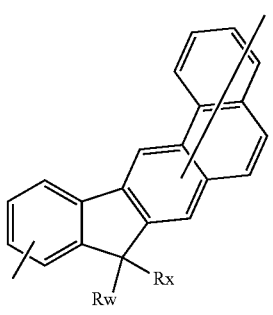
1A-10
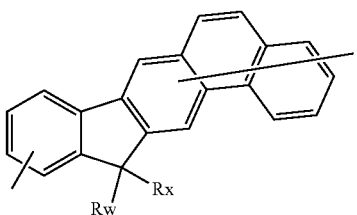
1A-11
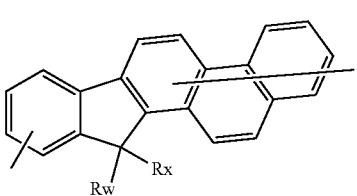
-continued
1A-12
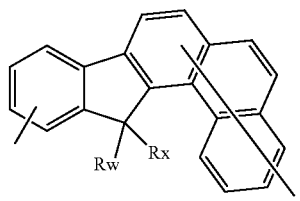
1A-13
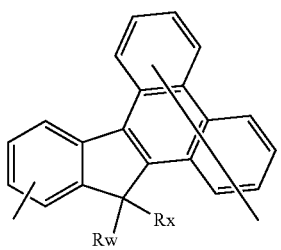
1A-14
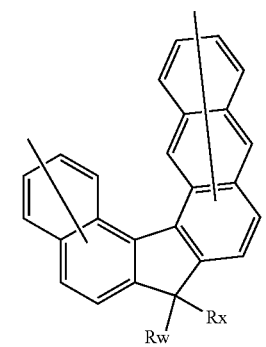
1A-15
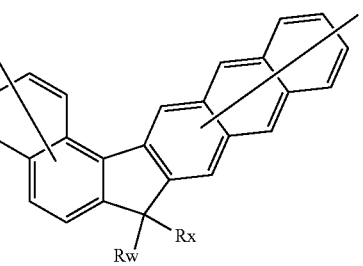
1A-16
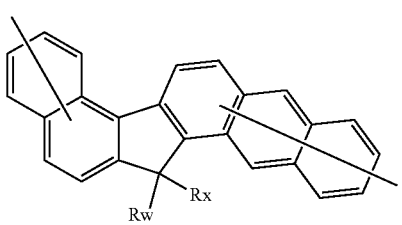
1A-17
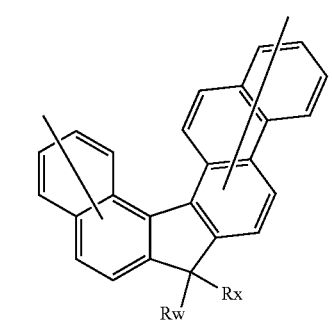

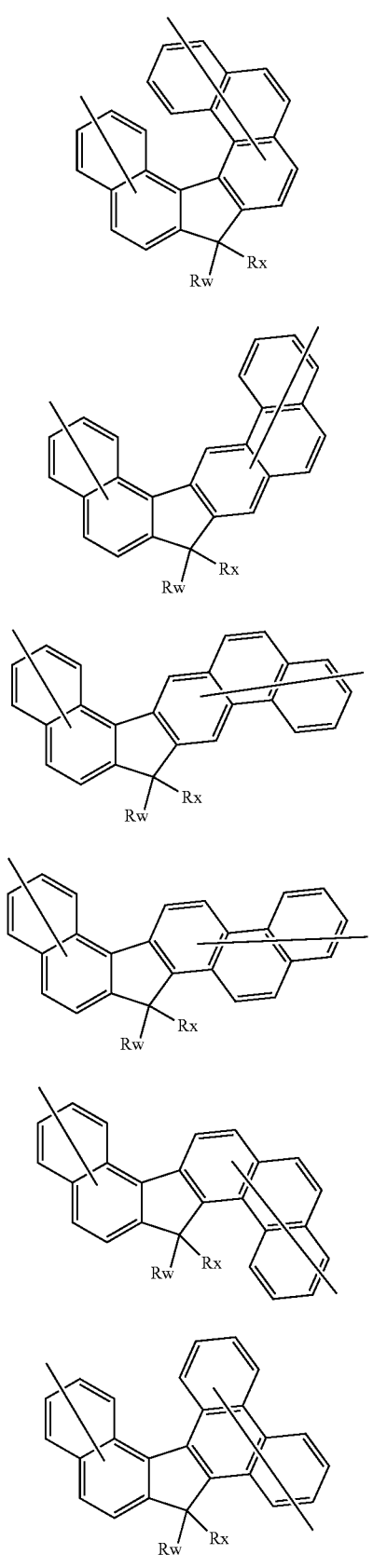
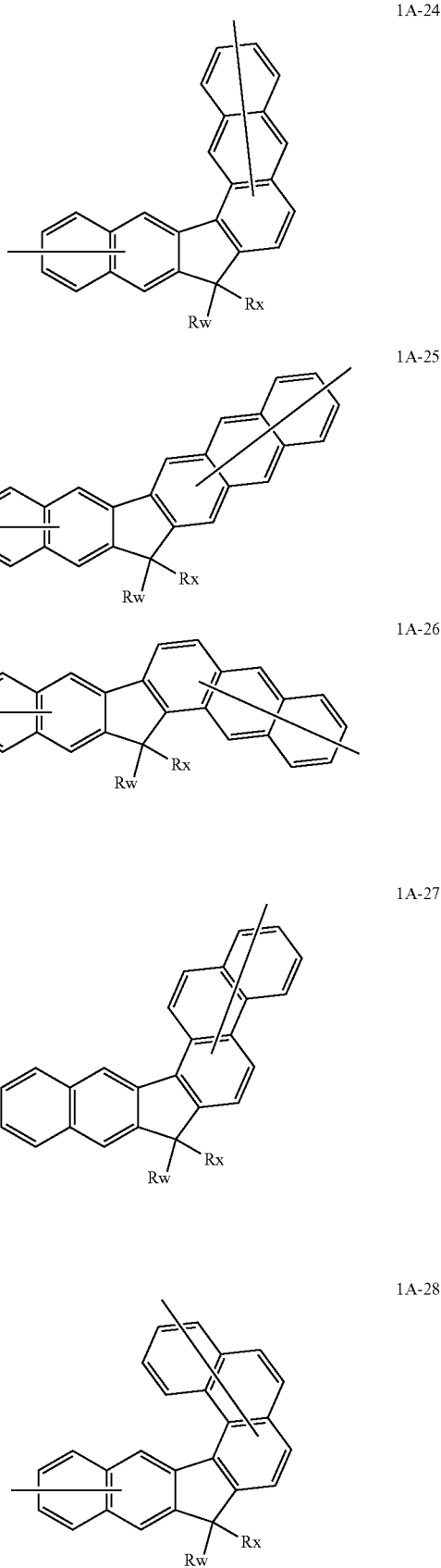

-continued
1A-29
1A-30
A-31
1A-32
1A-33
1A-34
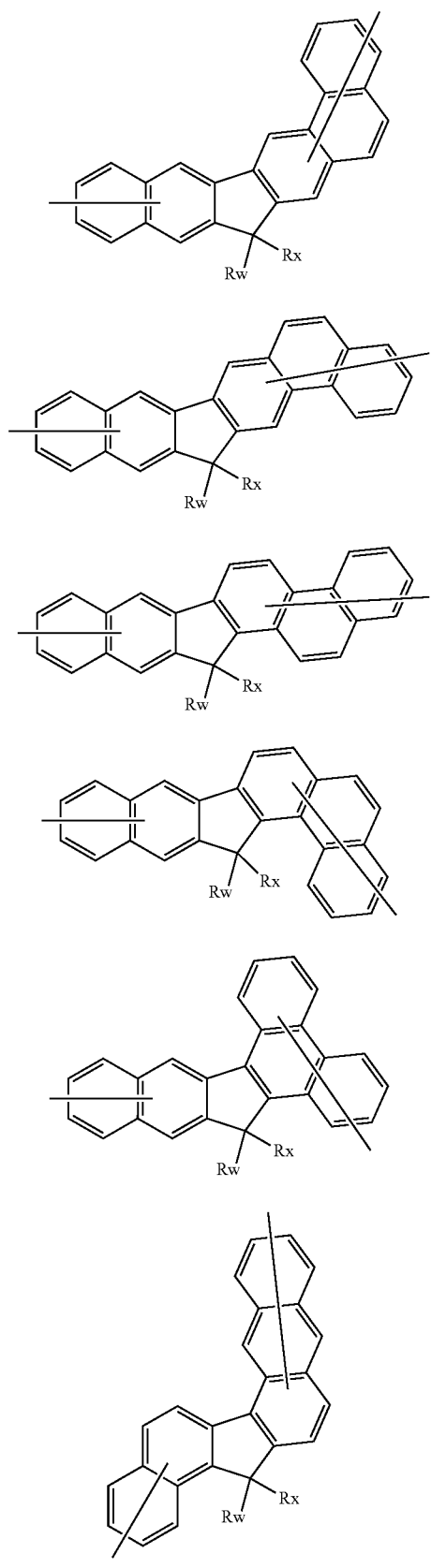
1A-35
1A-36
1A-37
1A-38
1A-39
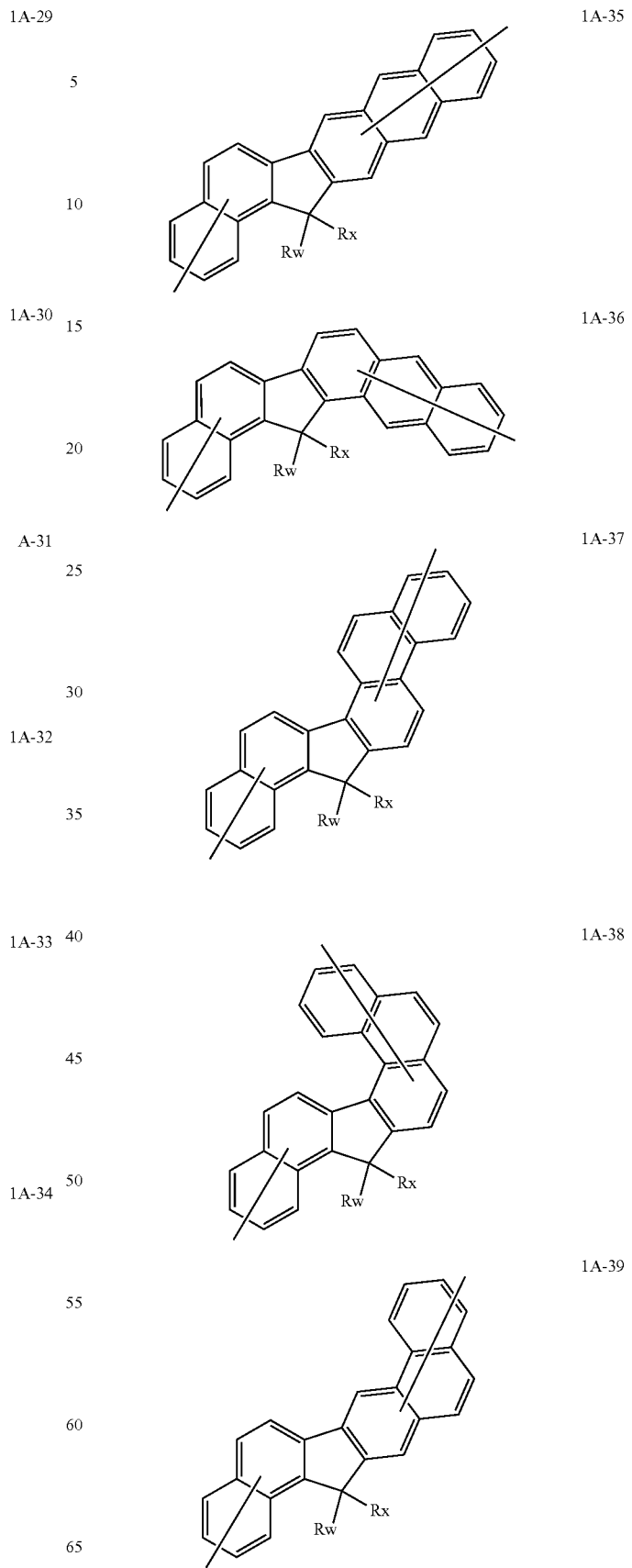

1A-40
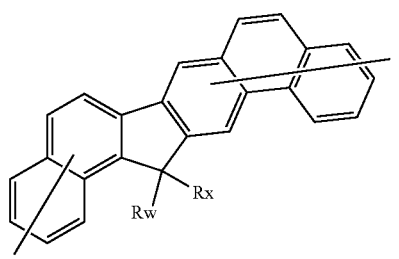
1A-41
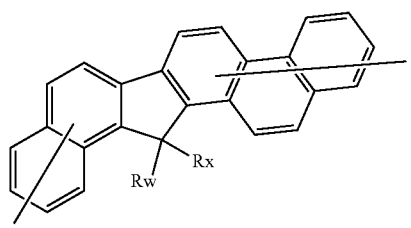
1A-42
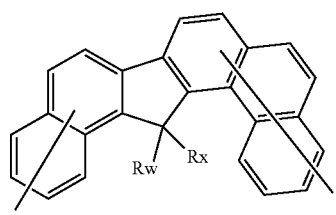
1A-43
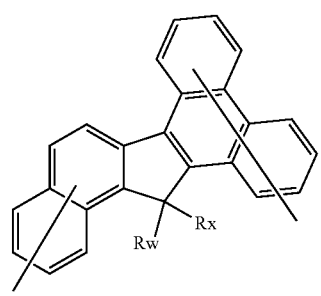
1A-44
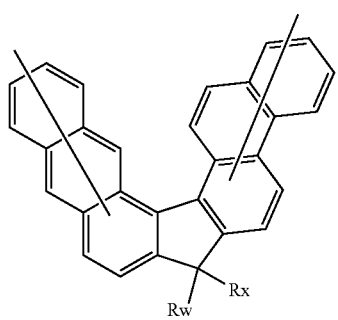
1A-45
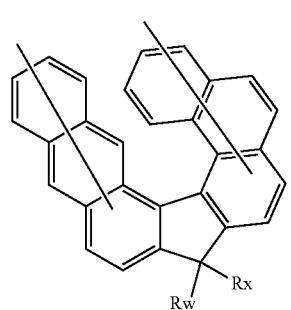
1A-46
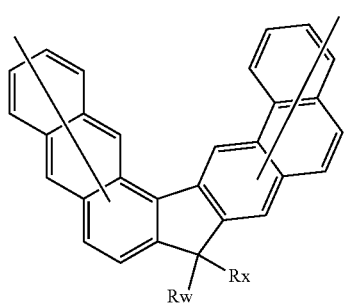
1A-47
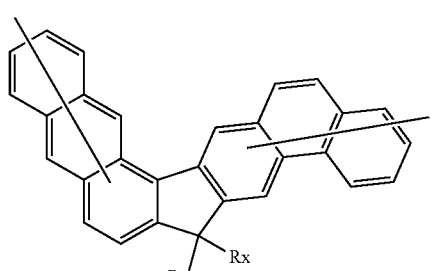
1A-48
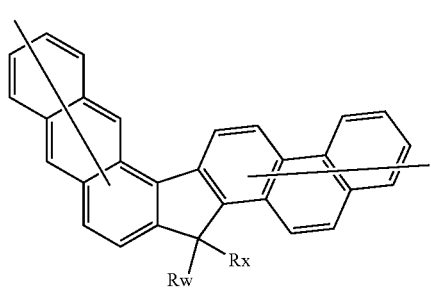
1A-49
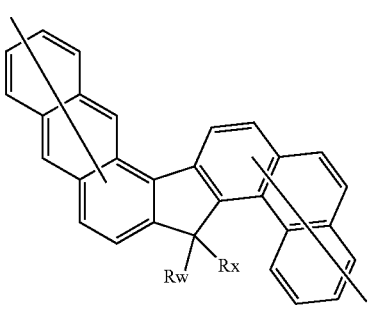
1A-50
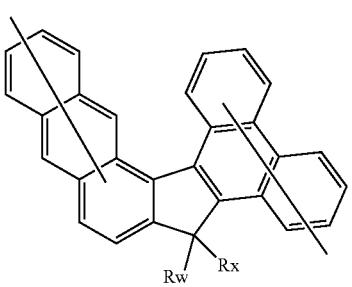

-continued
1A-51
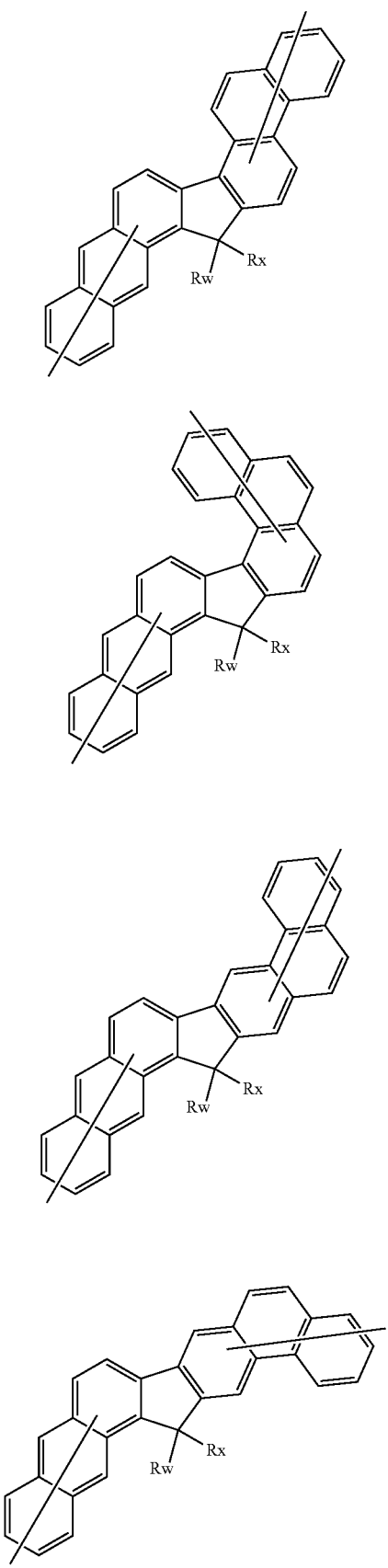
1A-52
1A-53
1A-54
-continued
1A-55
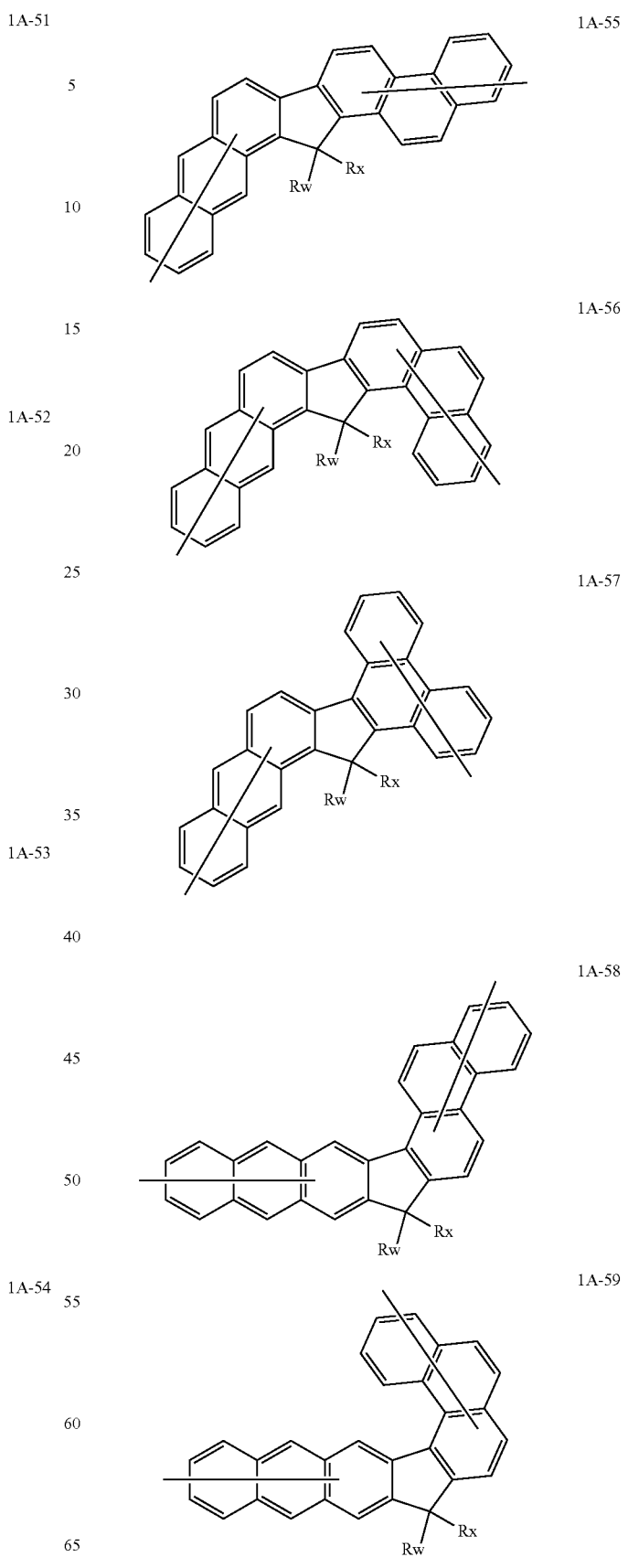
1A-56
1A-57
1A-58
1A-59

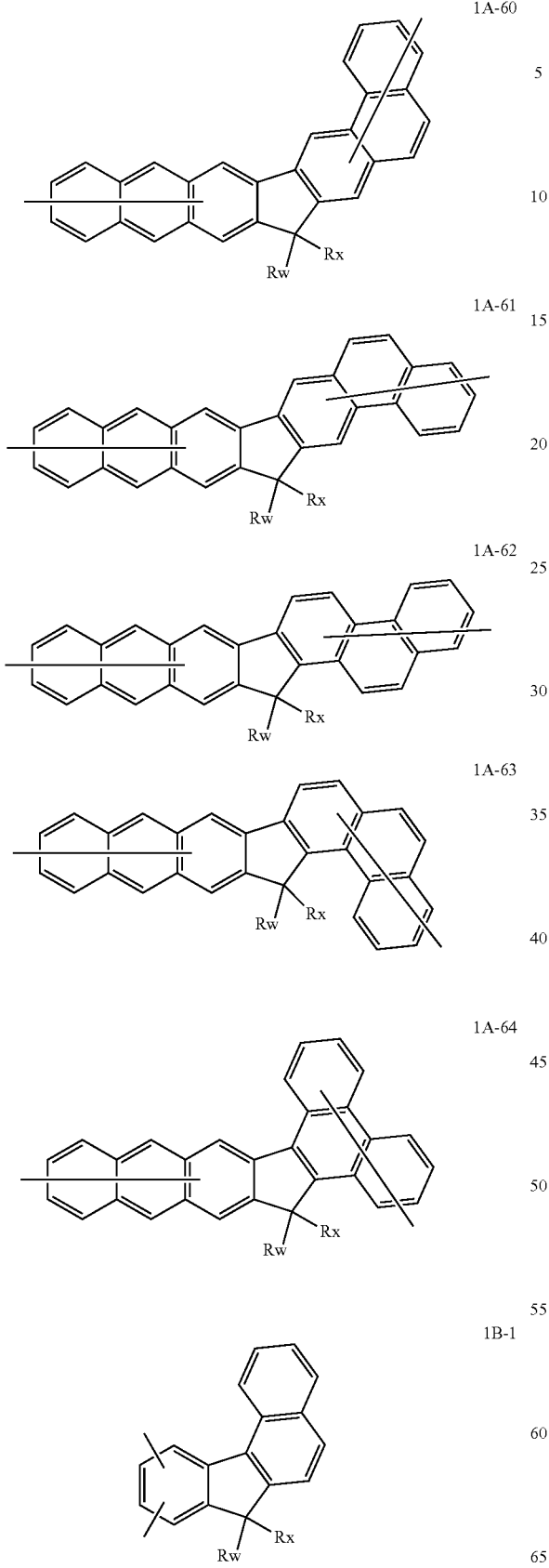

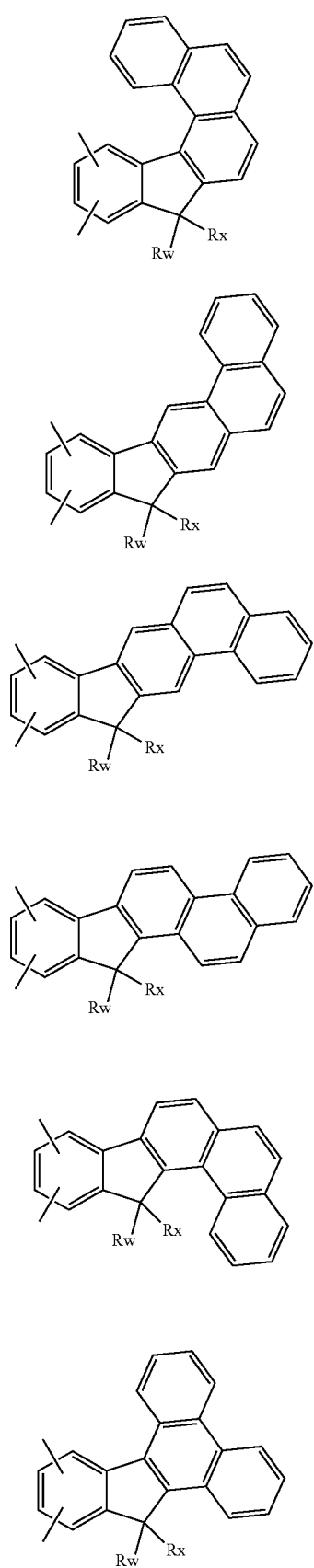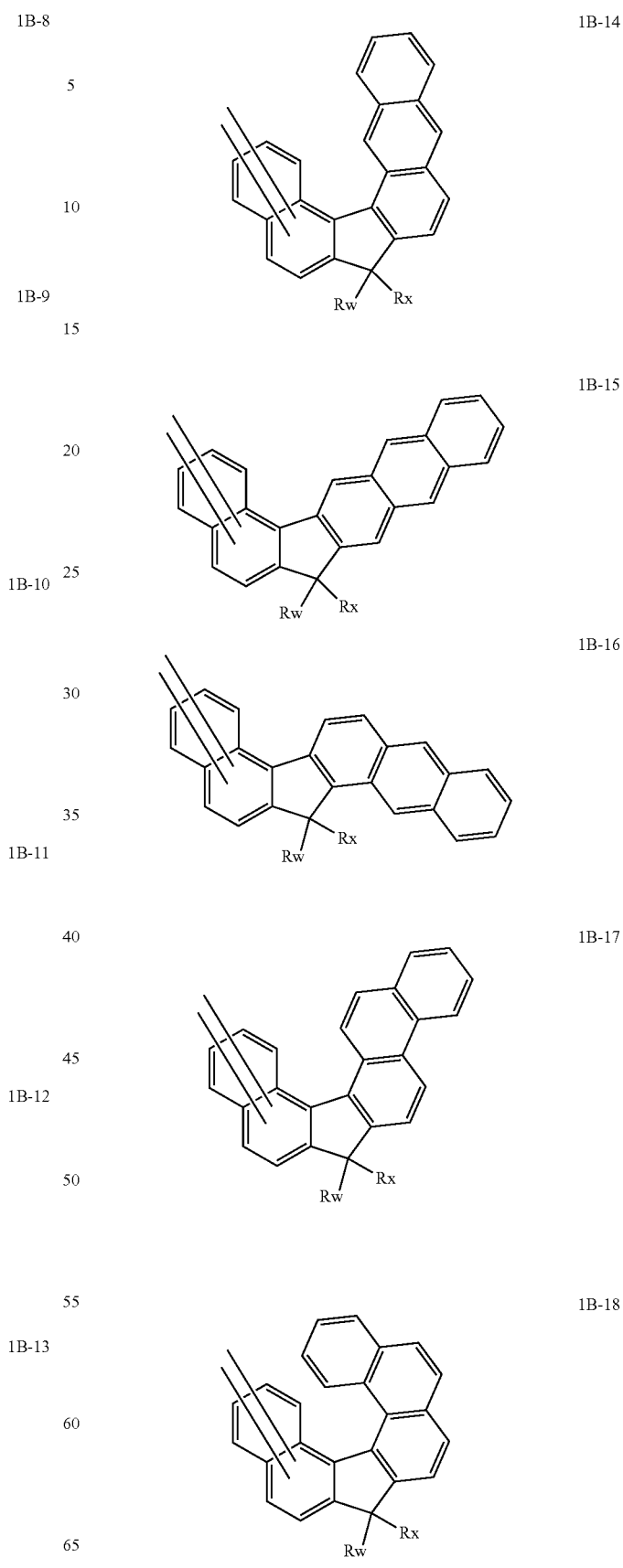

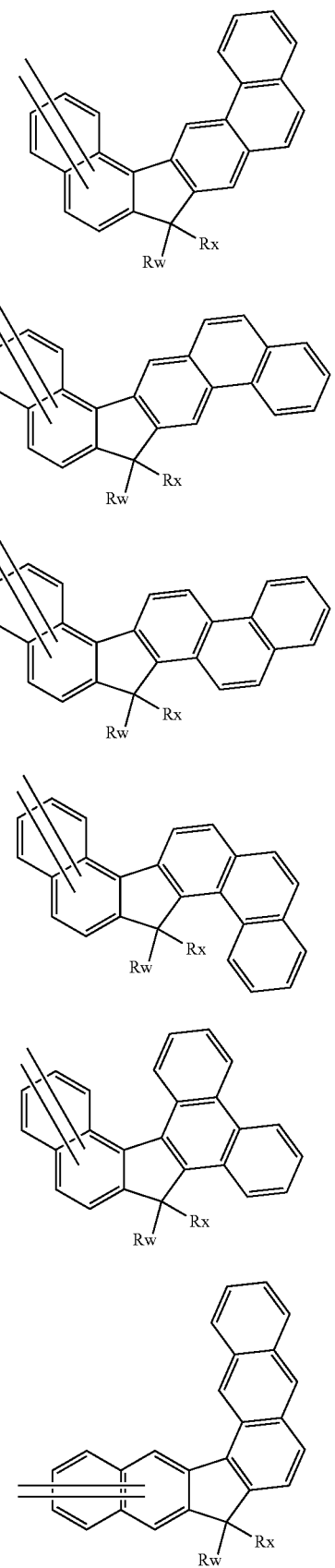
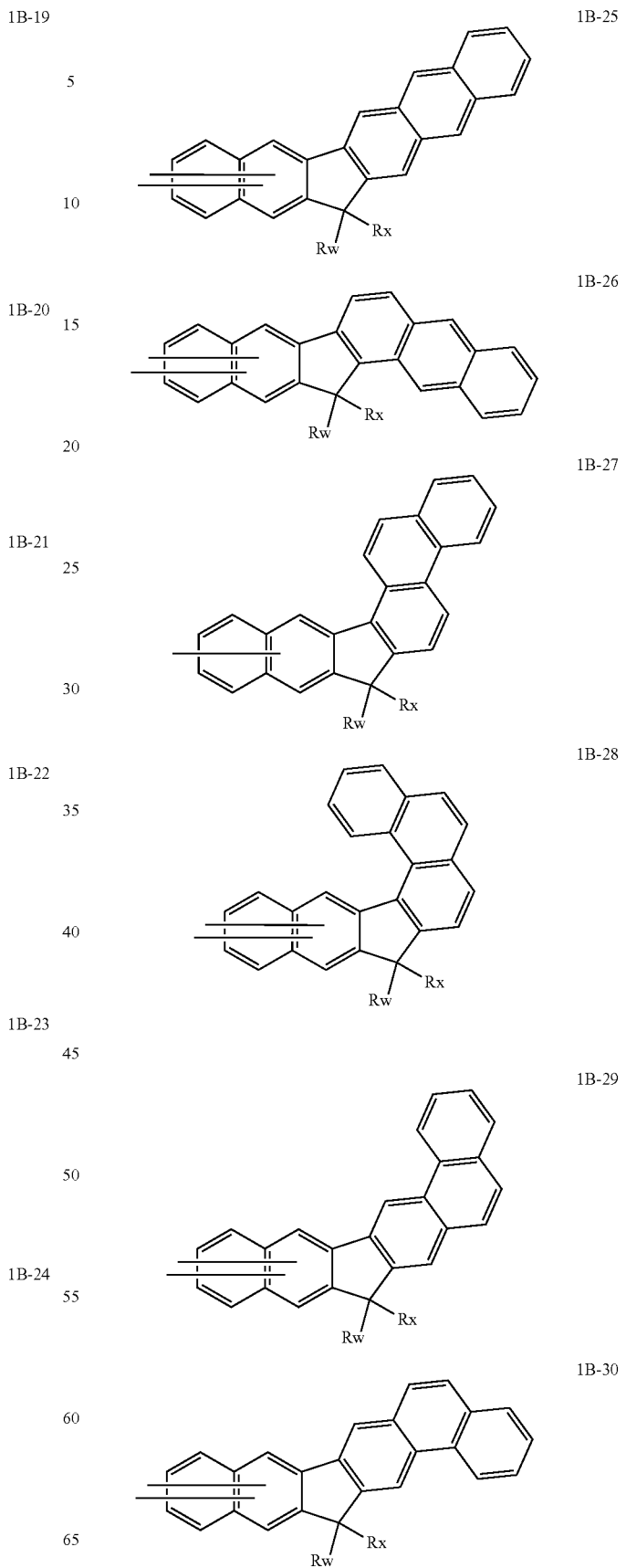

1B-31
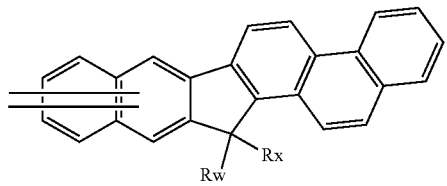
1B-32
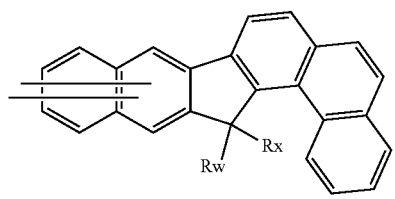
1B-33
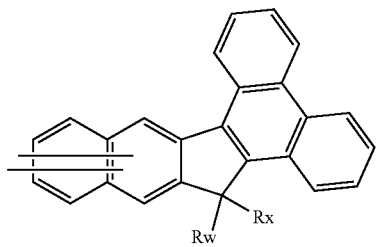
1B-34
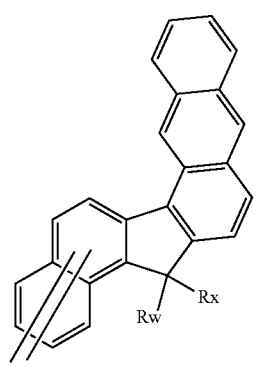
1B-35
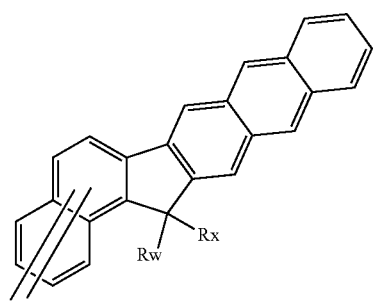
1B-36
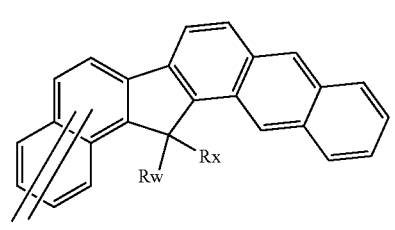
1B-37
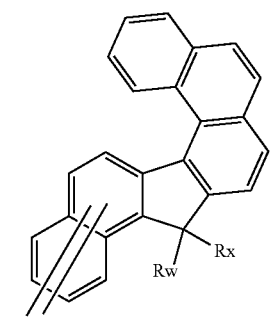
1B-38
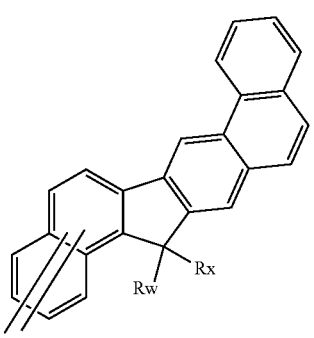
1B-39
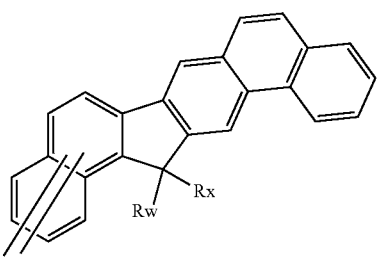
1B-40
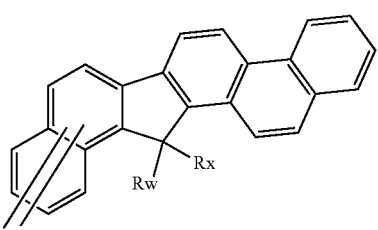
1B-41
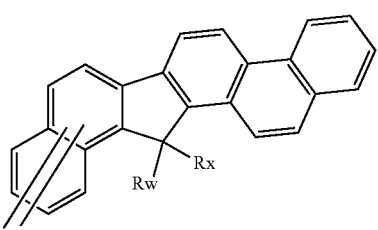

-continued
1B-42
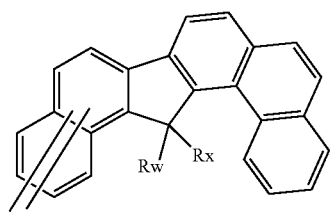
1B-43
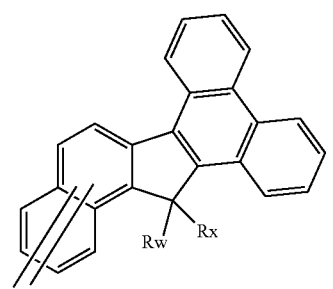
1B-44
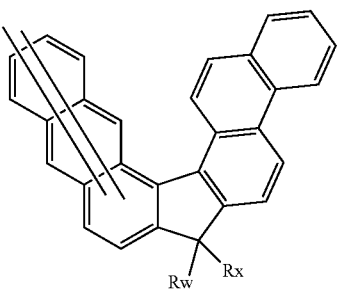
1B-45
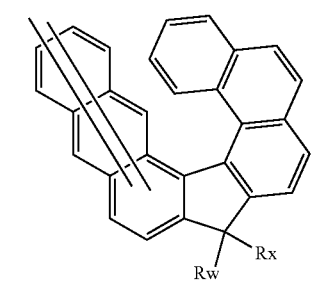
1B-46
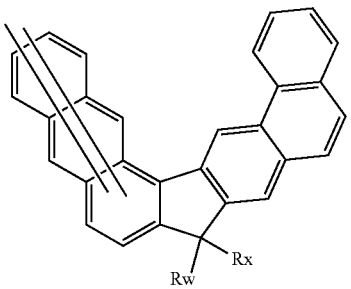
-continued
1B-47
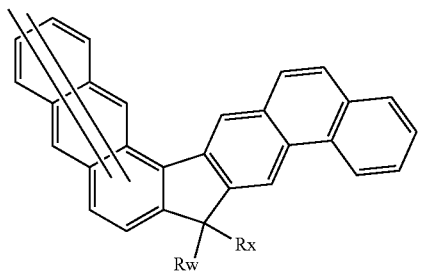
1B-48
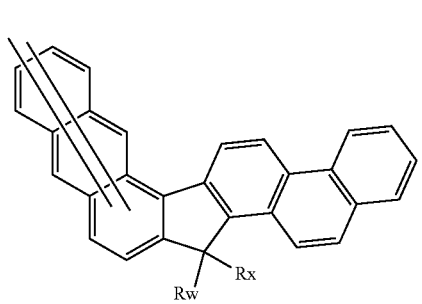
1B-49
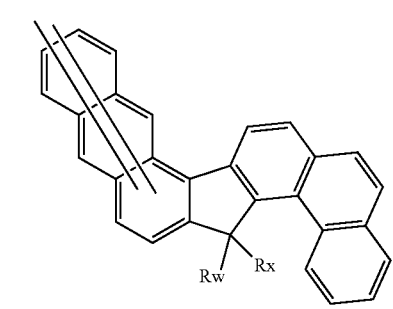
1B-50
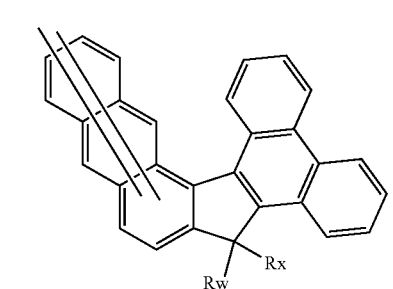
1B-51
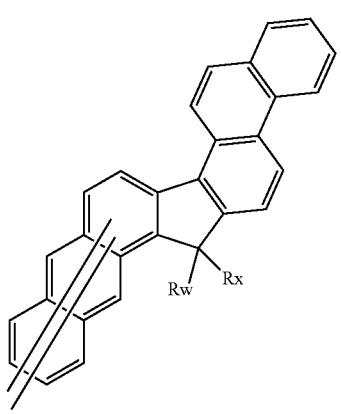

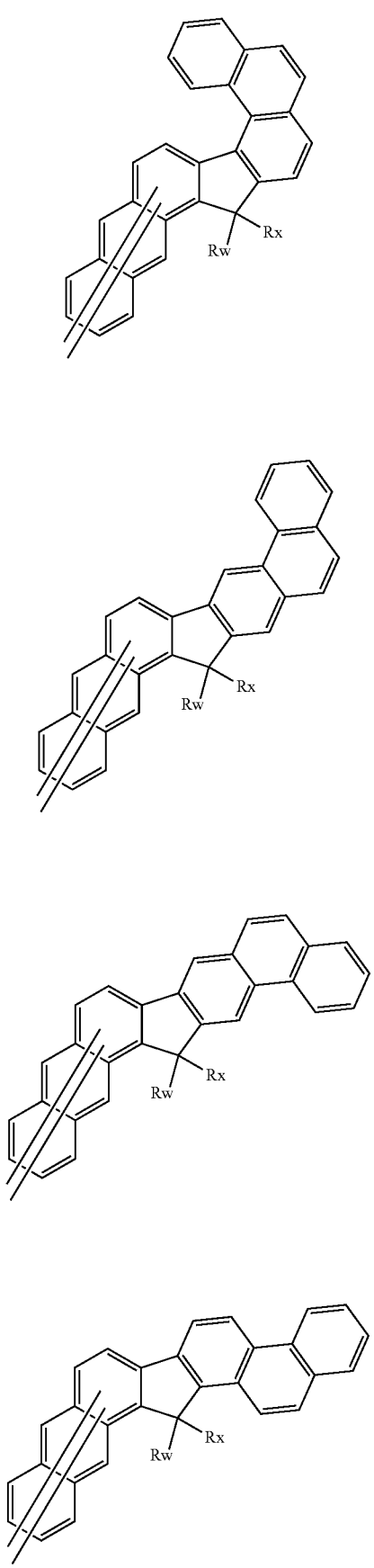
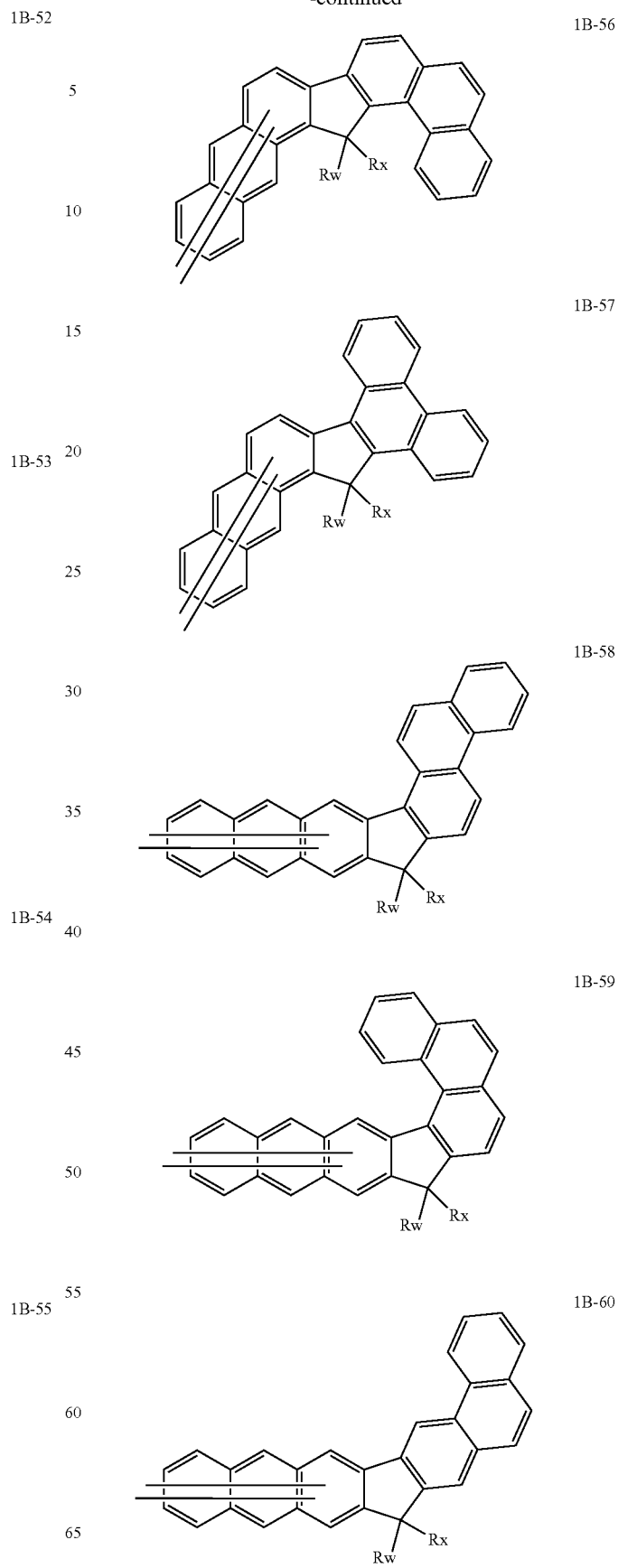

1B-61
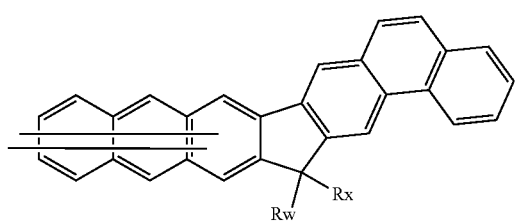
1B-62
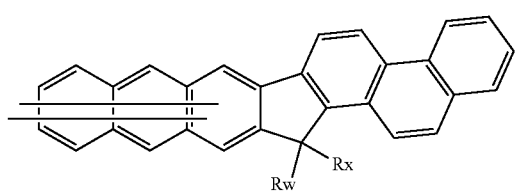
1B-63
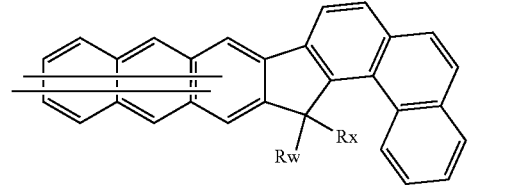
1B-64
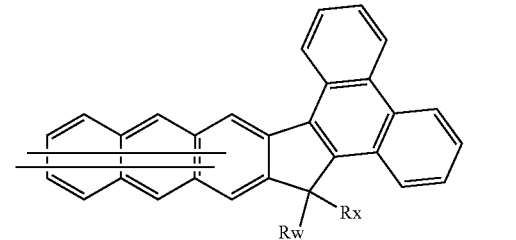
1C-1
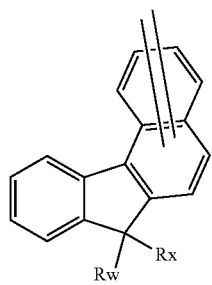
1C-2
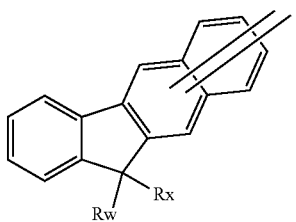
1C-3
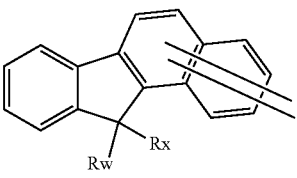
1C-4
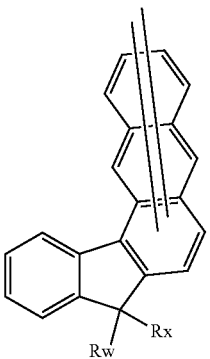
1C-5
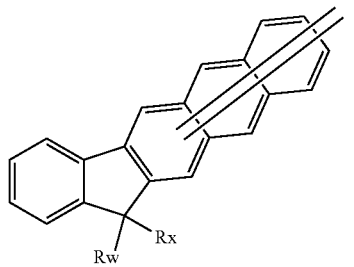
1C-6
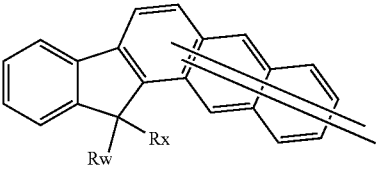
1C-7
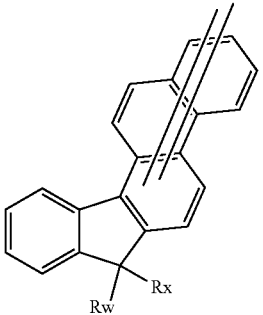
1C-8
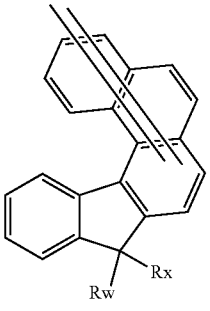

-continued
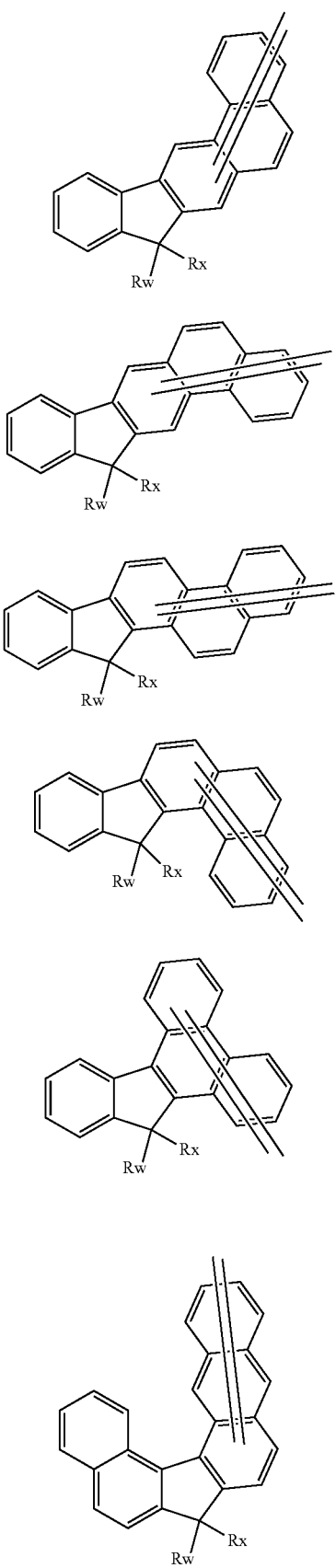
1C-9
1C-10
1C-11
1C-12
1C-13
1C-14
-continued
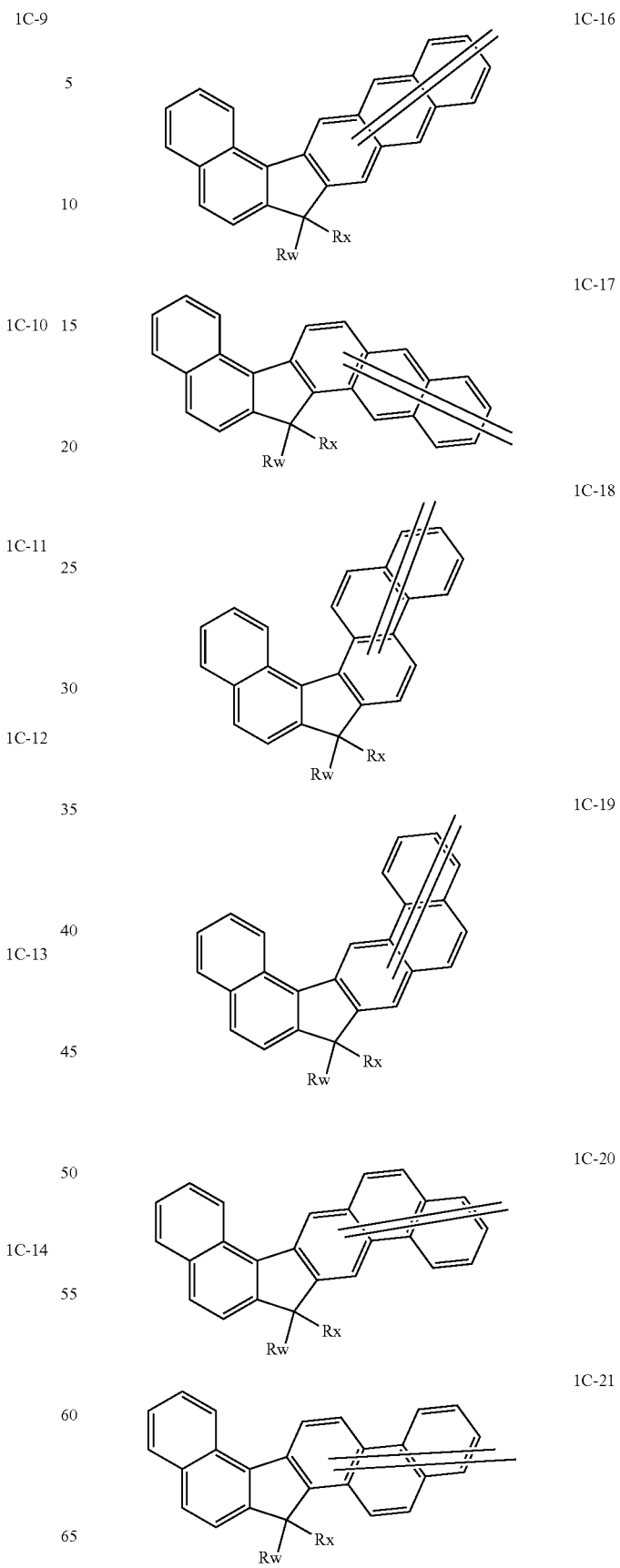
1C-16
1C-17
1C-18
1C-19
1C-20
1C-21

1C-22
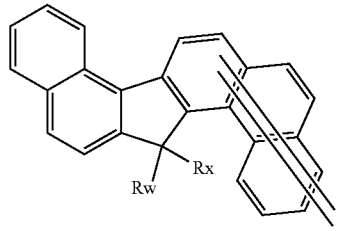
1C-23
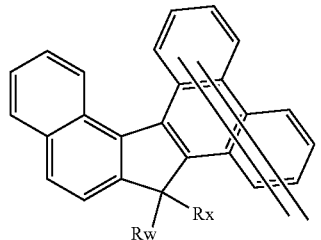
1C-24
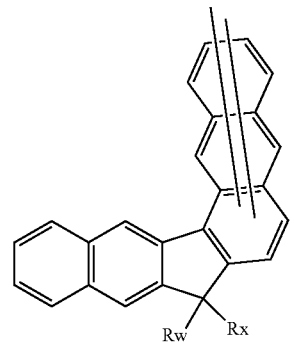
1C-25
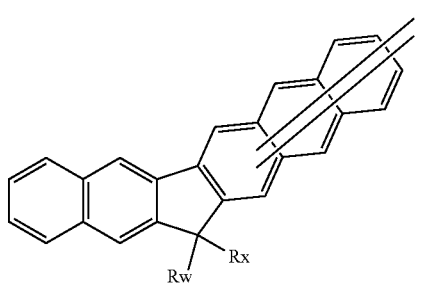
1C-26
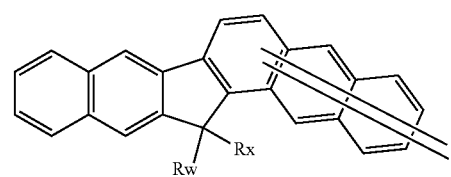
1C-27
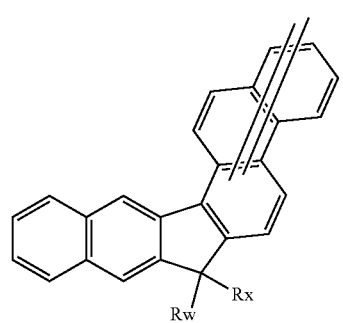
1C-28
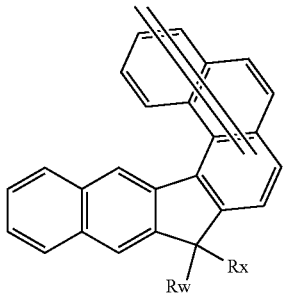
1C-29
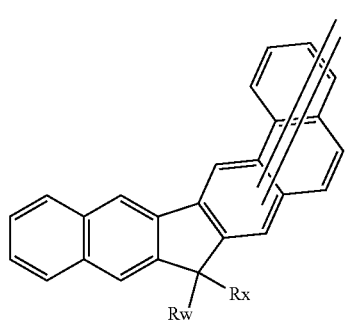
1C-30
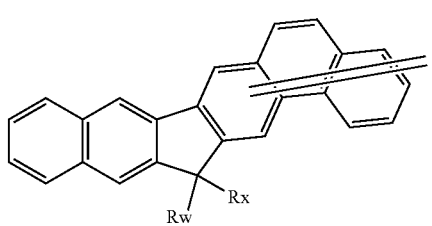
1C-31
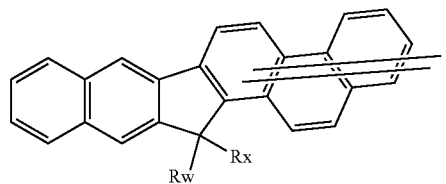
1C-32
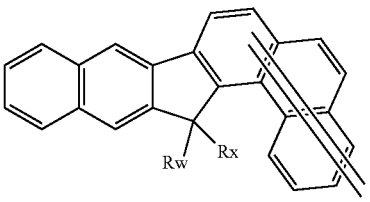
1C-33
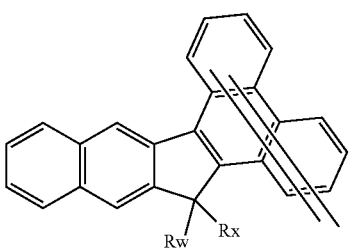

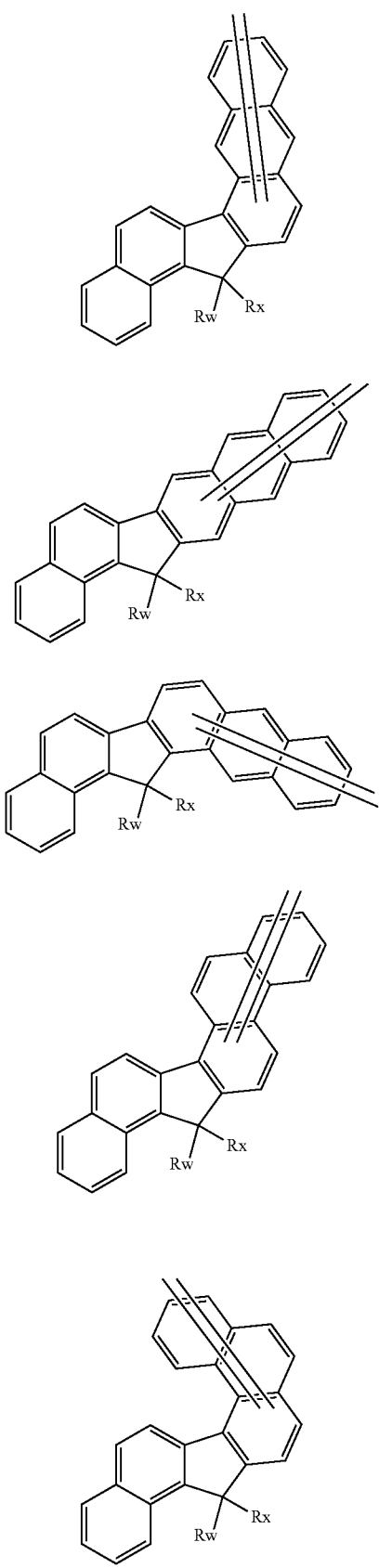
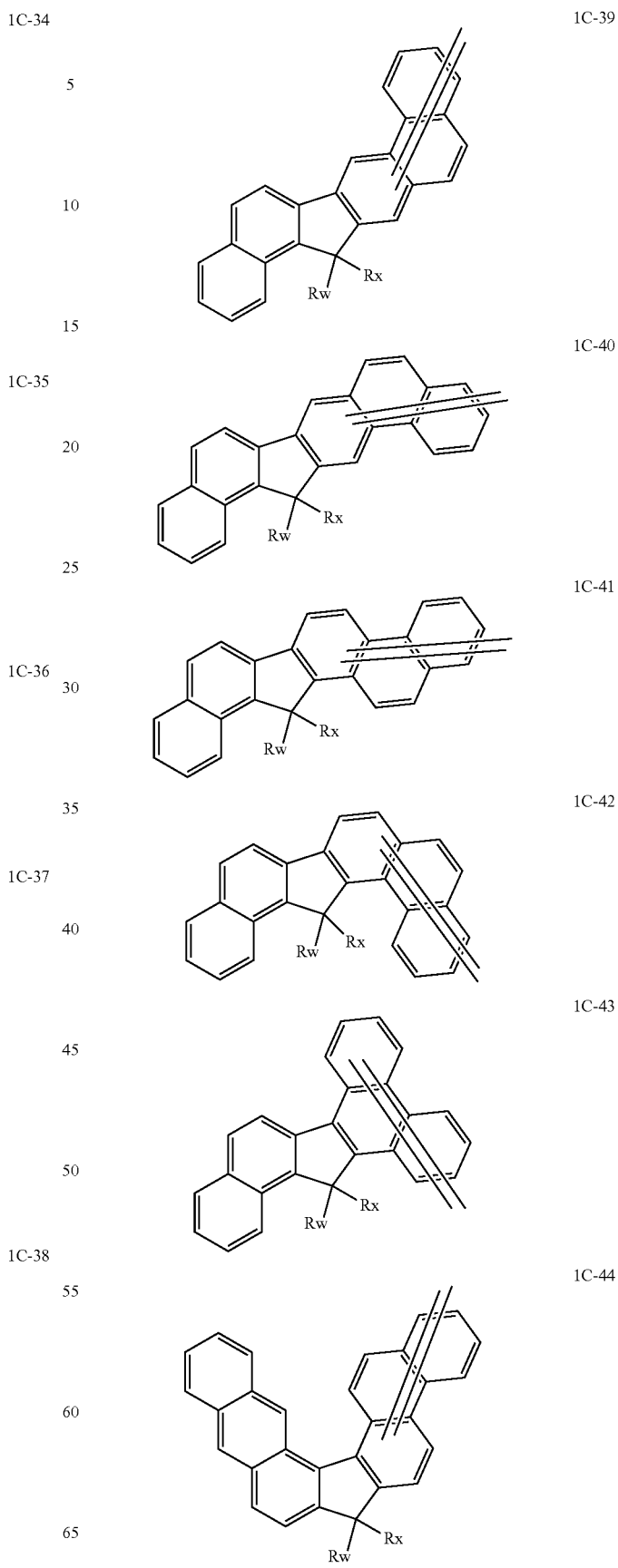

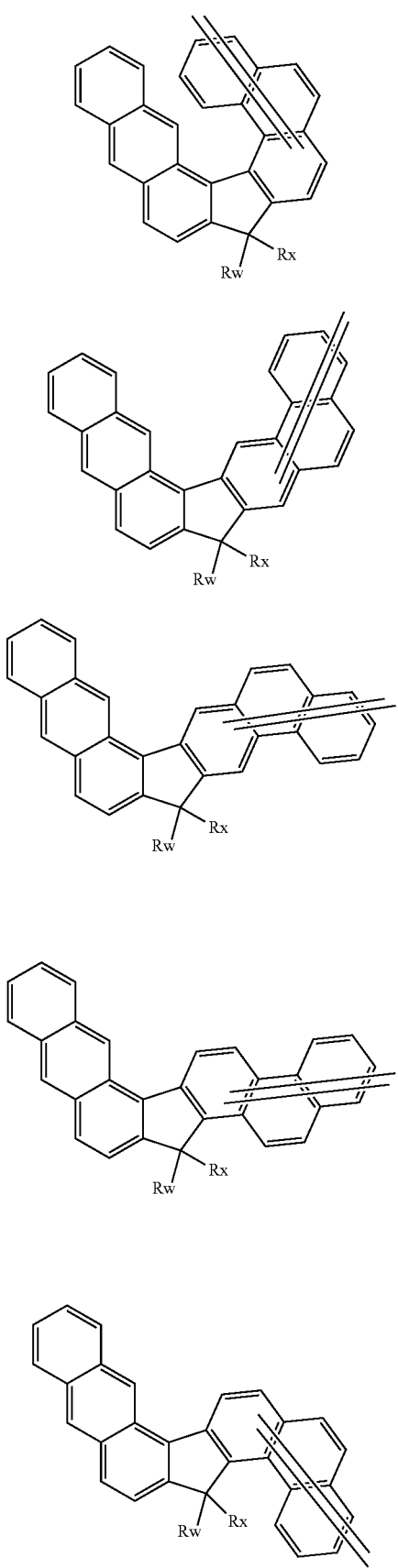
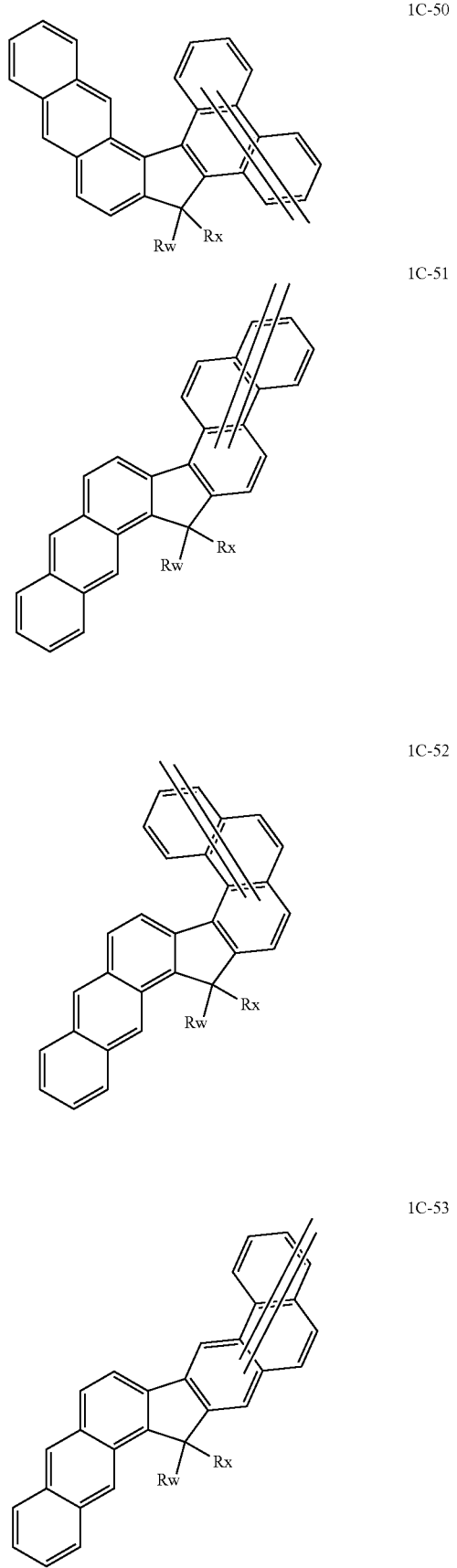

1C-54
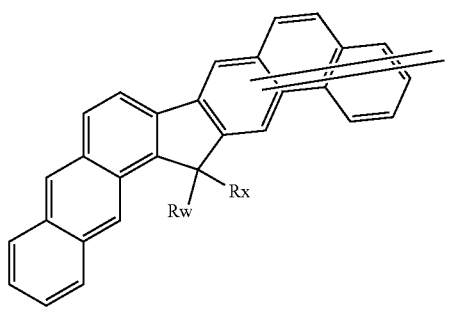
1C-55
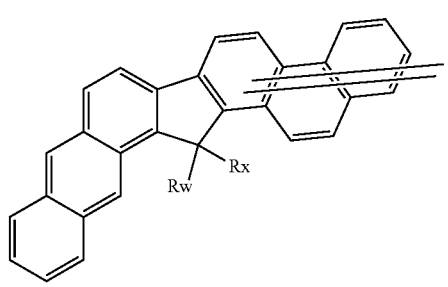
1C-56
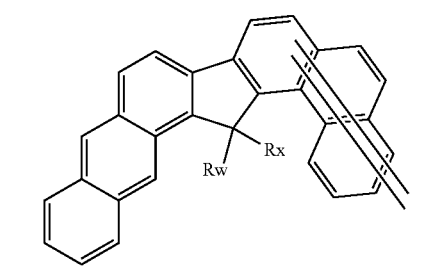
1C-57
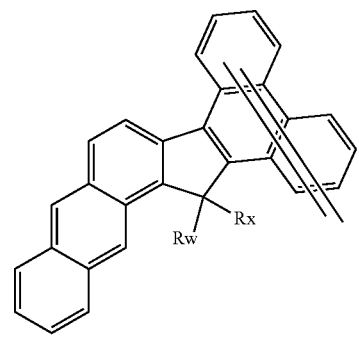
1C-58
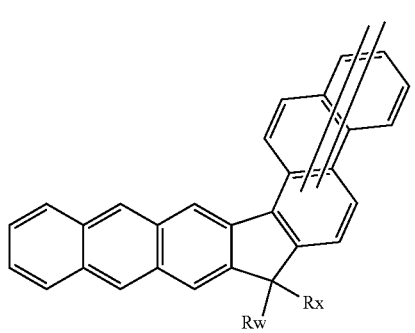
1C-59
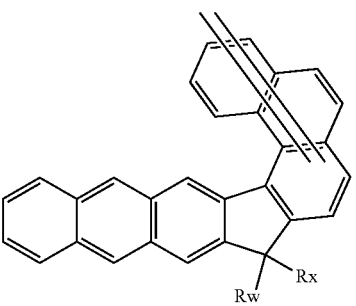
1C-60
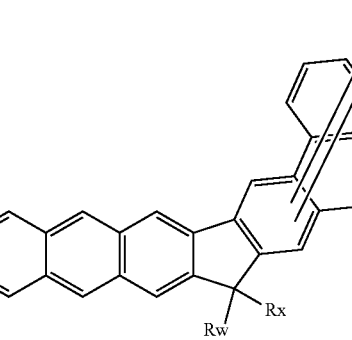
1C-61
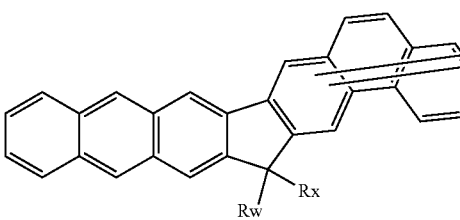
1C-62
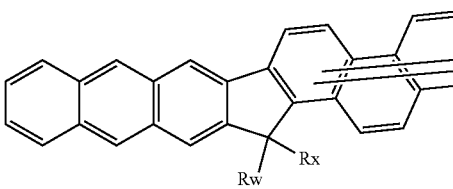
1C-63
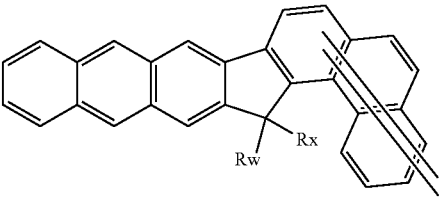
1C-64
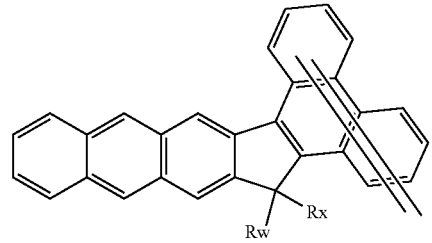

-continued
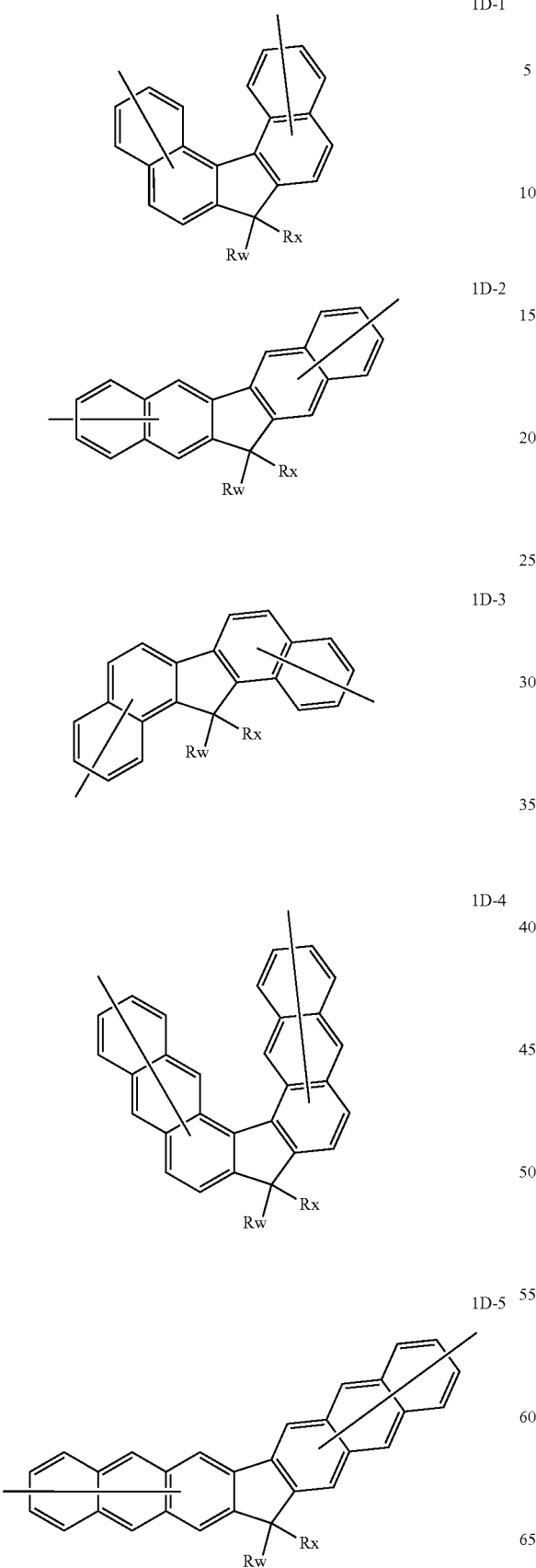
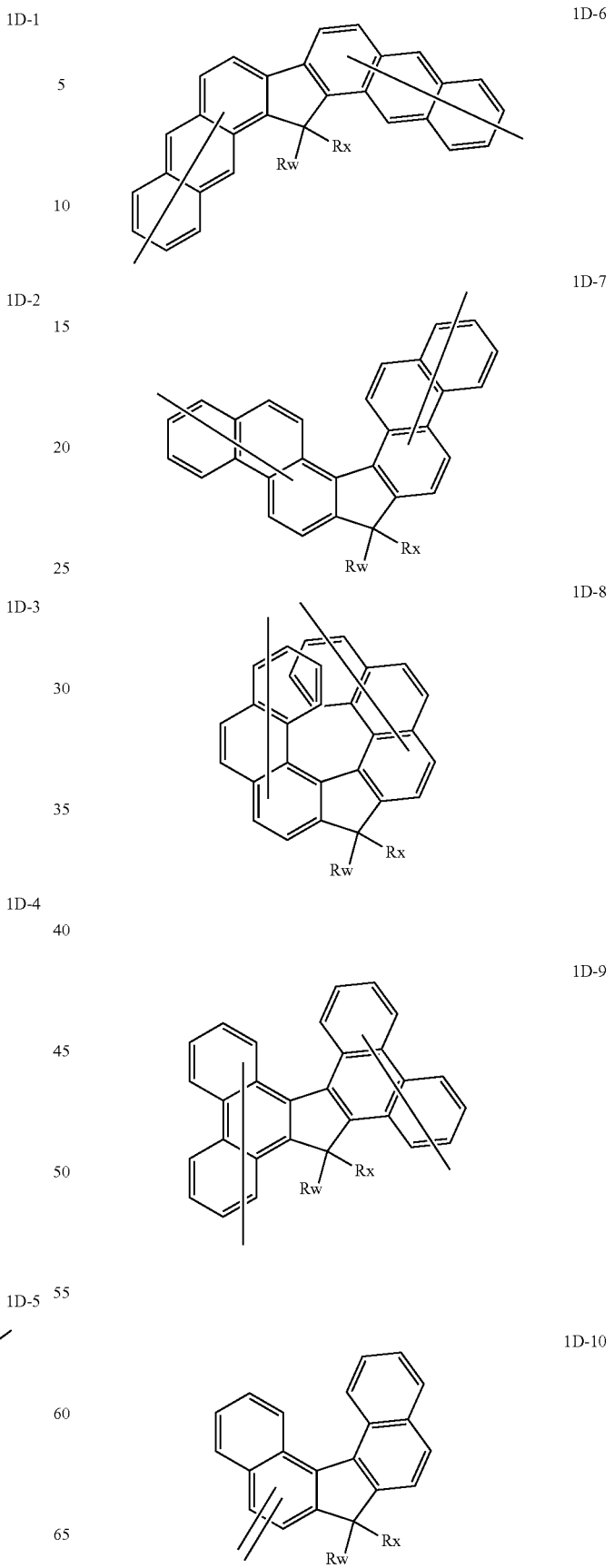

1D-11
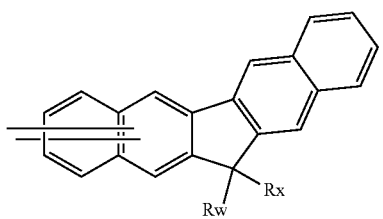

1D-12
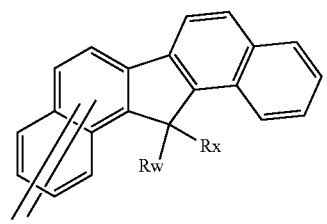

1D-13
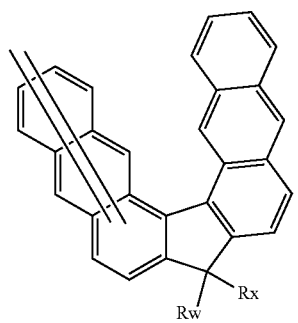

1D-14
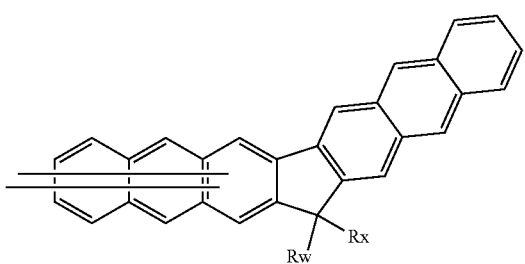

1D-15
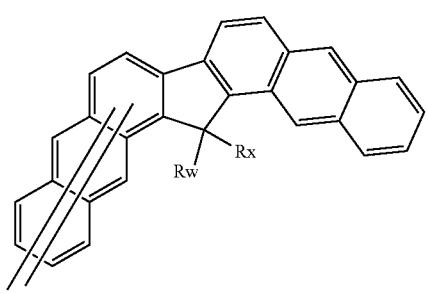

1D-16
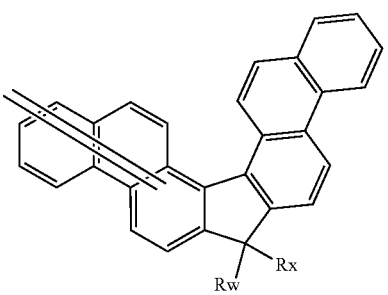

1D-17
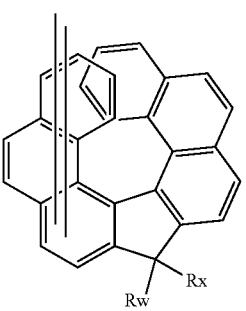

1D-18
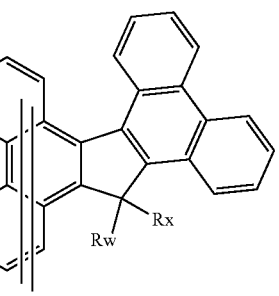

(wherein, $R_w$ and $R_x$ represent the same meanings as described above.).

In the repeating unit of the above-mentioned formula (2), it is preferable, from the standpoints of heat resistance, fluorescence intensity and the like of a polymer compound, that one bond is present on a ring A and one bond is present on a ring B, and it is more preferable that a ring A and a ring B are each composed of a combination of a benzene ring and a naphthalene ring.

Of them, repeating units of the following formulae (1-1) and (1-2) and repeating units of the following formulae (1-3) and (1-4) are preferable.

(1-1)
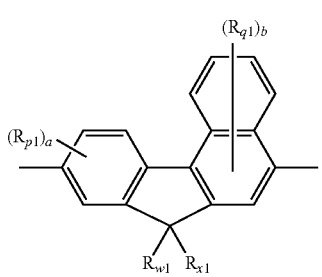

-continued

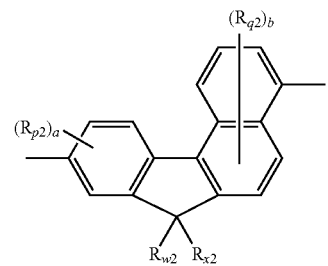

(1-2)

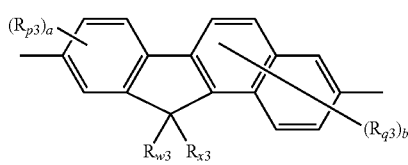

(1-3)

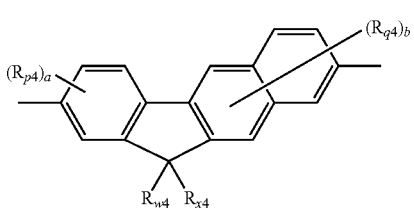

(1-4)

(wherein, $R_{p1}$, $R_{q1}$, $R_{p2}$, $R_{q2}$, $R_{p3}$, $R_{q3}$, $R_{p4}$ and $R_{q4}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. a represents an integer of 0 to 3, and b represents an integer of 0 to 5. When two or more of $R_{p1}$s, $R_{q1}$s, $R_{p2}$s, $R_{q2}$s, $R_{p3}$s, $R_{q3}$s, $R_{p4}$s and $R_{q4}$s are present, these may be the same or different. $R_{w1}$, $R_{x1}$, $R_{w2}$, $R_{x2}$, $R_{w3}$, $R_{x3}$, $R_{w4}$ and $R_{x4}$ represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group, and $R_{w1}$ and $R_{x1}$, $R_{w2}$ and $R_{x2}$, $R_{w3}$ and $R_{x3}$, $R_{w4}$ and $R_{x4}$ may mutually bond to form a ring.).

In the above-mentioned formulae (1-1), (1-2), (1-3) and (1-4), it is preferable, from the standpoints of solubility of a polymer compound in an organic solvent, properties of a device using the polymer compound, and the like, that $R_{p1}$, $R_{q1}$, $R_{p2}$, $R_{q2}$, $R_{p3}$, $R_{q3}$, $R_{p4}$ and $R_{q4}$ represent an alkyl group, alkoxy group, alkylthio group, aryl group, aryloxy group, arylthio group, arylalkyl group, arylalkoxy group, arylalkylthio group, substituted amino group, substituted silyl group, fluorine atom, acyl group, acyloxy group, amide group, acid imide group, mono-valent heterocyclic group, carboxyl group, substituted carboxyl group or cyano group, and more preferably, an alkyl group, alkoxy group, aryl group, aryloxy group, arylalkyl group, arylalkoxy group or arylalkylthio group.

In the above-mentioned formulae (1-1), (1-2), (1-3) and (1-4), it is preferable, from the standpoints of solubility of a polymer compound in an organic solvent, properties of a device using the polymer compound, and the like, that $R_{w1}$, $R_{x1}$, $R_{w2}$, $R_{x2}$, $R_{w3}$, $R_{x3}$, $R_{w4}$ and $R_{x4}$ represent an alkyl group, alkoxy group, alkylthio group, aryl group, aryloxy group, arylthio group, arylalkyl group, arylalkoxy group, arylalkylthio group, substituted amino group, substituted silyl group, fluorine atom, acyl group, acyloxy group, amide group, acid imide group, mono-valent heterocyclic group, carboxyl group, substituted carboxyl group or cyano group, and more preferably, an alkyl group, alkoxy group, aryl group, aryloxy group, arylalkyl group, arylalkoxy group or arylalkylthio group, further preferably, an alkyl group, alkoxy group or aryl group.

As the alkyl group, alkoxy group and aryl group, more specific examples include linear, branched or cyclic alkyl groups having a carbon number of usually about from 1 to 20 such as a methyl group, ethyl group, propyl group, i-propyl group, butyl group, i-butyl group, t-butyl group, pentyl group, isoamyl group, hexyl group, cyclohexyl group, heptyl group, cyclohexylmethyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like; alkoxy groups having a carbon number of usually about from 1 to 20 such as a methoxy group, ethoxy group, propyloxy group, i-propyloxy group, butoxy group, i-butoxy group, t-butoxy group, pentyloxy group, hexyloxy group, cyclohexyloxy group, heptyloxy group, cyclohexylmethyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyloxy group, perfluorooctyloxy group, methoxymethyloxy group, 2-methoxyethyloxy group and the like; and aryl groups having a carbon number of usually about from 6 to 60 such as a phenyl group, $C_1$ to $C_{12}$ alkoxyphenyl groups, $C_1$ to $C_{12}$ alkylphenyl groups, 1-naphtyl group, 2-naphtyl group, 1-anthracenyl group, 2-anthracenyl group, 9-anthracenyl group, pentafluorophenyl group and the like.

Here, examples of $C_1$ to $C_{12}$ alkoxy include methoxy, ethoxy, propyloxy, i-propyloxy, butoxy, i-butoxy, t-butoxy, pentyloxy, hexyloxy, cyolohexyloxy, heptyloxy, octyloxy, 2-ethylhexyloxy, nonyloxy, decyloxy, 3,7-dimethyloctyloxy, lauryloxy group and the like, and examples of $C_1$ to $C_{12}$ alkylphenyl include a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like.

Examples of the repeating units of the above-mentioned formulae (1-1), (1-2), (1-3) and (1-4) include the following formula groups (1-1-2), (1-2-2), (1-3-2) and (1-4-2) in the case of mutual bonding of $R_{w1}$ and $R_{x1}$, $R_{w2}$ and $R_{x2}$, $R_{w3}$ and $R_{x3}$, $R_{w4}$ and $R_{x4}$ to form a ring. These structures may further have a substituent.

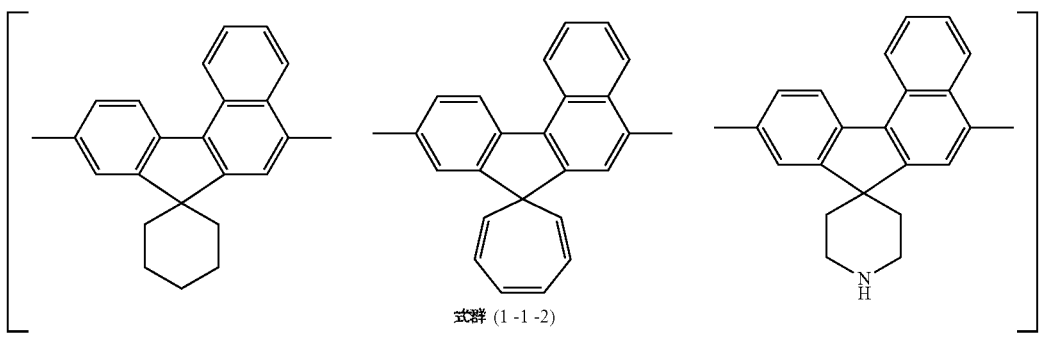
式群 (1-1-2)

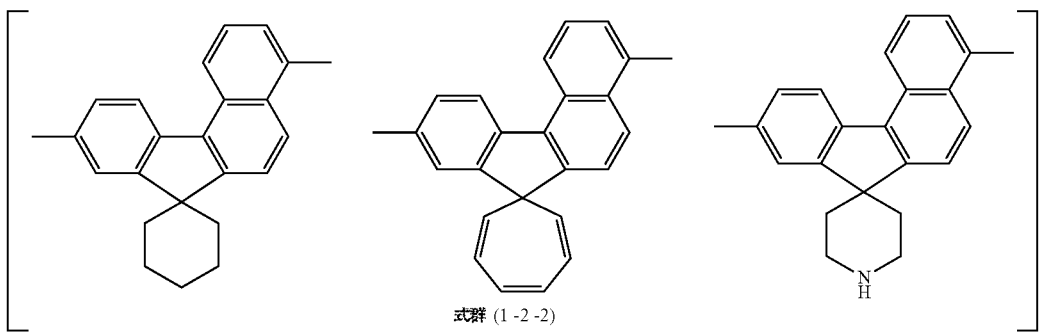
式群 (1-2-2)

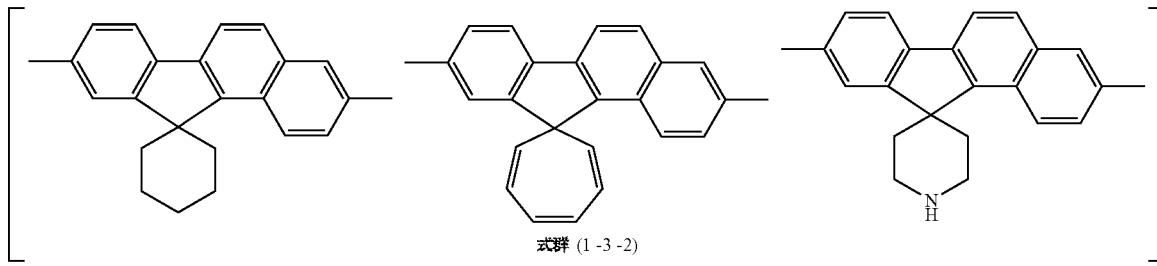
式群 (1-3-2)

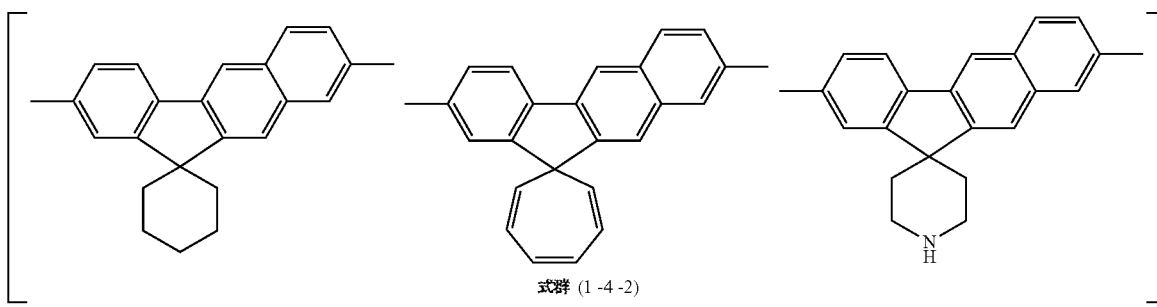
式群 (1-4-2)

In the above-mentioned formulae (1-1) and (1-2), it is preferable, from the standpoint of increase in the molecular weight of a polymer compound and from the standpoint of improvement of heat resistance, that a and b are 0.

Among the polymer compounds of the present invention, those containing a repeating unit of the formulae (1-1), (1-3) and (1-4) are preferable, and those of the formula (1-1) are further preferable, from the standpoint of easiness of synthesis of a monomer.

For balance between heat resistance and a standpoint of improving solubility of a synthesized polymer compound in an organic solvent, preferable as $R_{w1}$ and $R_{x1}$ are alkyl groups, and those having a carbon number of 3 or more are further preferable, those of 7 or more are more preferable, those of 8 or more are further preferable. Most preferable is an n-octyl group, and a structure of the following formula (110) is mentioned.

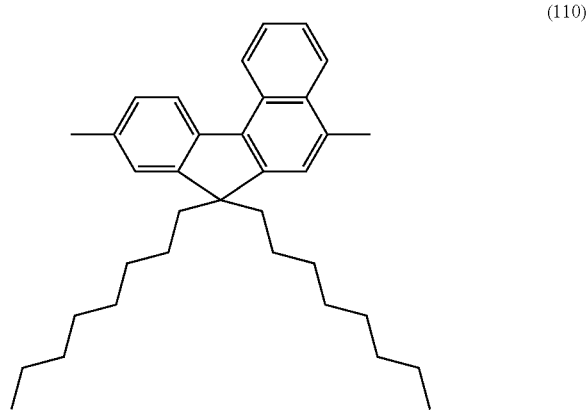
(110)

The aromatic ring represented by rings C and D in the above-described formula (70) include aromatic hydrocarbon rings such as a benzene ring, naphthalene ring, anthracene ring, tetracene ring, pentacene ring, pyrene ring, phenanthrene ring and the like; and heteroaromatic rings such as a pyridine ring, bipyridine ring, phenanthroline ring, quinoline ring, isoquinoline ring, thiophene ring, furan ring, pyrrole ring and the like, and preferable is a benzene ring from the standpoint of easiness of synthesis of a monomer.

The substituent optionally carried on rings C and D in the above-described formula (70) is an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group.

Here, the alkyl group, alkoxy group, alkylthio group, alkylsilyl group, alkylamino group, aryl group, aryloxy group, arylalkyl group, arylalkoxy group, arylalkenyl group, arylalkynyl group, arylamino group and monovalent heterocyclic group are the same as those illustrates and explained as the substituent represented by R in the above-described examples of arylene group (the above-described formulae 1 to 38, A to K).

From the standpoint of easiness of synthesis of a monomer, the above-described formula (70) which is one represented by the following formula (2E) is particularly preferable.

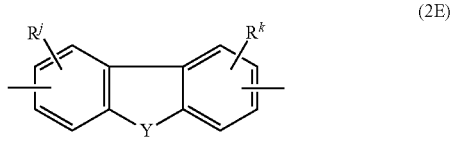
(2E)

(wherein, Y represents O or S. $R^j$ and $R^k$ represent each independently a hydrogen atom, alkyl group, alkoxy group or aryl group.).

In the above-described formula (2E), $R^j$ and $R^k$ represent preferably an identical group (namely, both of them represent a hydrogen atom, alkyl group, alkoxy group or aryl group), and preferable is an alkoxy group, from the standpoint of easiness of synthesis of a monomer. The alkyl group and aryl group represented by $R^j$ and $R^k$ are the same as those illustrated and explained in the above-described sections of $A^1$ and $A^2$. The alkoxy group represented by $R^j$ and $R^k$ is preferably a butoxy group, i-butoxy group, t-butoxy group, pentyloxy group, hexyloxy group, heptyloxy group, octyloxy group, 2-ethylhexyloxy group, nonyloxy group, decyloxy group, 3,7-dimethyloctyloxy group or lauryloxy group, further preferably a pentyloxy group, hexyloxy group, octyloxy group, 2-ethylhexyloxy group, decyloxy group or 3,7-dimethyloctyloxy, from the standpoint of solubility of the resultant polymer compound in an organic solvent.

The present invention may contain structures other than the above-described formulae (1), (2) and (70), for example, a repeating unit of the following formula (50), in addition to the above-described repeating units of the formulae (1), (2) and (70).

(50)

(wherein, $Ar_4$ represents an arylene group, divalent heterocyclic group or divalent aromatic amine group. X represents —$CR_4$=$CR_5$— or —C≡C—. $R_4$ and $R_5$ represent each independently a hydrogen atom, alkyl group, aryl group, monovalent heterocyclic group or cyano group. p represents 0 or 1.).

$Ar_4$ in the above-described formula (50) is arylene group, divalent heterocyclic group or divalent aromatic amine group. As $Ar_4$, the same groups as for $Ar_1$ are illustrated (structures other than the above-described formulae (1), (2) and (70)).

In the above-described formula (50), X represents —$CR_4$=$CR_5$— or C≡C—. $R_4$ and $R_5$ represent each independently a hydrogen atom, alkyl group, aryl group, monovalent heterocyclic group or cyano group. p represents 0 or 1. p is preferably 0 from the standpoint of photooxidation stability.

Examples of the repeating unit of the formula (50) include those having structures described in the above-described formulae 1 to 84, 91 to 117, the above-described formulae A to F, the above-described formulae 118 to 122, and the following formulae 128 to 131. Of them, preferable are phenylene groups (for example, the above-described formulae 1 to 3), naphthalenediyl groups (the above-described formulae 4 to 13), anthracenediyl groups (the above-described formulae 14 to 19), biphenylene groups (the above-described formulae 20 to 25), triphenylene groups (the above-described formulae 26 to 28), condensed ring compound groups (the above-described formulae 29 to 38), stilbene-diyl groups, distilbene-diyl groups (the above-described figures A to F), and the like.

128

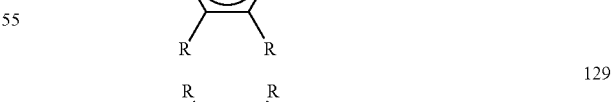
129

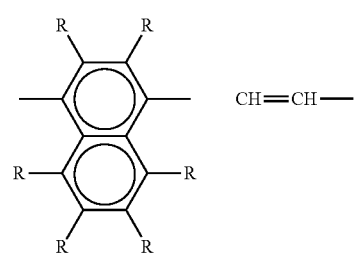

-continued

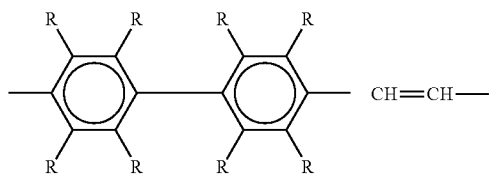
130

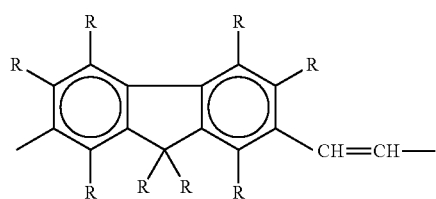
131

Here, R represents the same meaning as described above.

Among polymer compounds comprising a repeating unit of the above-described formula (1) and at least one of a repeating unit of the above-described formula (2) and a repeating unit of the above-described formula (70), more preferable are those in which the sum of repeating units of the formulae (1), (2) and (70) is 50 mol % or more based on all repeating units, from the standpoints of heat resistance and fluorescence intensity of the polymer compound.

Further, those in which the proportion of a repeating unit of the formula (1) is 1 mol % or more and 90 mol % or less based on the sum of repeating units of the formulae (1), (2) and (70) are more preferable from the standpoints of heat resistance and fluorescence intensity of the polymer compound. Those in which the proportion is 5 mol % or more and 50 mol % or less are further preferable.

As the polymer compound consisting essentially of a repeating unit of the formula (1) and at least one of a repeating unit of the formula (2) and a repeating unit of the formula (70), specific examples include copolymers comprising, as the repeating unit of the formula (1), at least one selected from the following moieties:

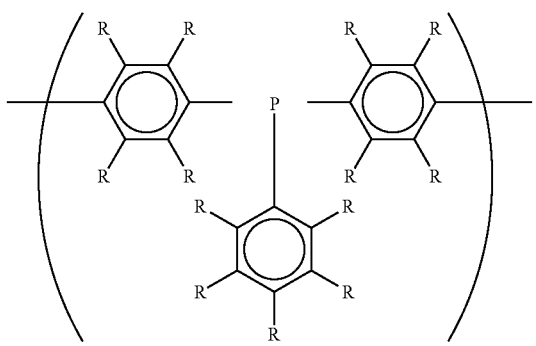

-continued

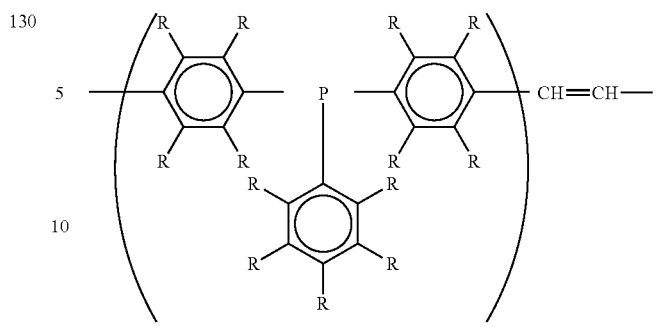

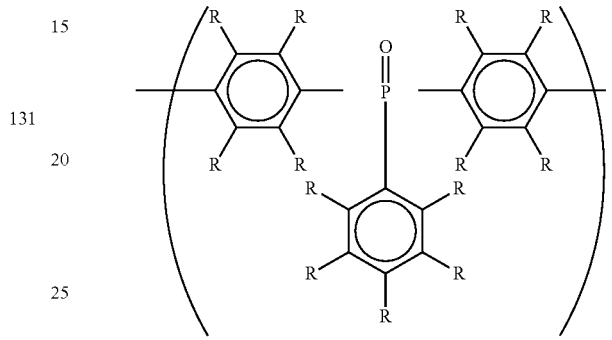

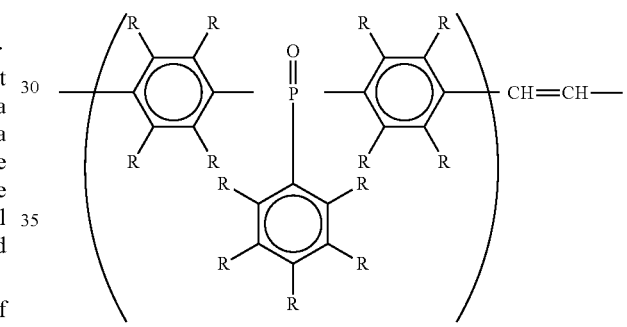

and comprising, as the repeating unit of the formula (2) and the repeating unit of the formula (70), at least one repeating unit selected from the following moieties;

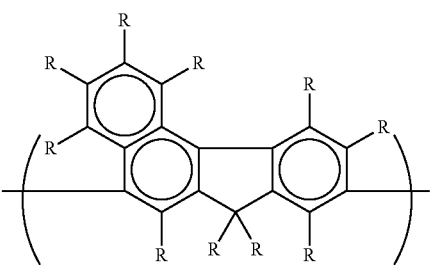

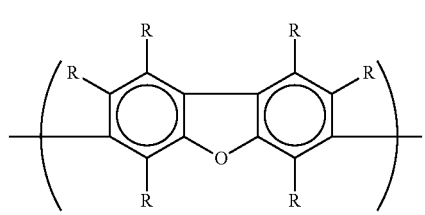

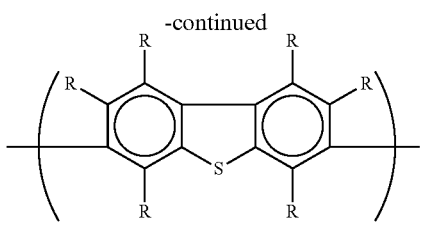

(wherein, R represents the same meaning as described above.).

The polymer compound of the present invention has a polystyrene-reduced number-average molecular weight of typically $10^3$ to $10^6$, preferably $2\times10^3$ to $10^7$.

An end group of the polymer compound of the present invention may be protected by a stable group since when a polymerization active group remains intact, there is a possibility of decrease in light emission property and life when made into a device. A structure containing a conjugation bond continuous with a conjugation structure of the main chain is preferable, and for example, a structure bonding to an aryl group or heterocyclic group via a vinylene group may also be permissible. Specific examples include substituents described in chemical formula 10 in JP-A No. 9-45478, and the like.

The polymer compound of the present invention may be a random, block or graft copolymer, or a polymer having an intermediate structure, for example, a random copolymer having a block property. From the standpoint of obtaining a polymer compound showing high quantum yield of fluorescence, a random copolymer having a block property and a block or graft copolymer are more preferable than a complete random copolymer. Those having branching in the main chain and thus having 3 or more end parts, and dendrimers are also included.

When the polymer compound of the present invention is used as a light emitting material of a polymer LED, light emission or phosphorescence from a thin film is utilized, thus, preferable as the polymer compound of the present invention are those showing fluorescence and/or phosphorescence at solid state.

As the good solvent for a polymer compound of the present invention, chloroform, methylene chloride, dichloroethane, tetrahydrofuran, toluene, xylene, mesitylene, tetralin, decalin, n-butylbenzene and the like are illustrated. Depending on the structure and molecular weight of a polymer compound, the compound can be dissolved usually in an amount of 0.1 wt % or more in these solvents.

Next, the method for producing a polymer compound of the present invention will be described.

The polymer compound of the present invention can be produced by, for example, condensation-polymerizing a compound of the following formula (80) and a compound of the following formula (90), respectively, as one of raw materials.

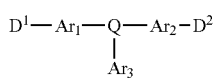

(80)

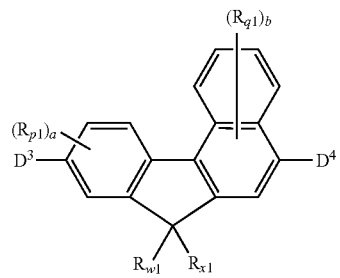

(wherein, Q, $Ar_1$, $Ar_2$, $Ar_3$ are the same as described in the above-described formula (1). $R_{w1}$, $R_{x1}$, $R_{p1}$, $R_{q1}$, a, b are the same as described in the above-described formula (1-1). $D^1$, $D^2$, $D^3$, $D^4$ represent each independently a halogen atom, alkyl sulfonate group, aryl sulfonate group, aryl alkyl sulfonate group, borate group, sulfoniummethyl group, phosphoniummethyl group, phosphonatemethyl group, methyl monohalide group, boric group, formyl group, cyanomethyl group or vinyl group.).

Examples of the alkyl sulfonate group include a methane sulfonate group, ethane sulfonate group, trifluoromethane sulfonate group and the like, examples of the aryl sulfonate group are a benzene sulfonate group, p-toluene sulfonate group and the like, and examples of the aryl sulfonate group include a benzyl sulfonate group and the like.

As the borate group, groups of the following formulae are illustrated.

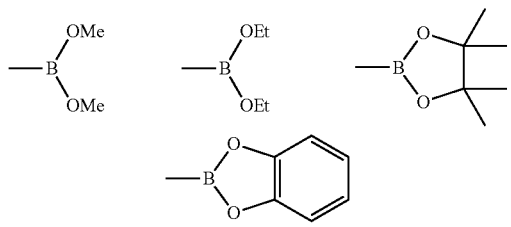

As the sulfoniummethyl group, groups of the following formulae are illustrated.

—$CH_2S^+Me_2X^-$, —$CH_2S^+Ph_2X^-$ (X represents a halogen atom.)

As the phosphoniummethyl group, groups of the following formula are illustrated.

—$CH_2P^+Ph_3X^-$ (X represents a halogen atom.)

As the phosphonatemethyl group, groups of the following formula are illustrated.

—$CH_2PO(OR''')_2$ (R''' represents an alkyl group, aryl group or arylalkyl group.)

As the methyl monohalide group, a methyl fluoride group, methyl chloride group, methyl bromide group and methyl iodide group are illustrated.

The monomer of the above-described formula (80) can be synthesized by, for example, a method described in JP-A No. 63-91393.

Regarding the condensation polymerization method, when the main chain has a vinylene group, other monomers are used according to demands, and for example, methods such as [1] polymerization by the Wittig reaction of a compound having an aldehyde group and a compound having a phosphonium salt group, [2] polymerization by the Wittig reaction of a compound having an aldehyde group and a phosphonium salt group, [3] polymerization by the Heck reaction of a compound having a vinyl group and a compound having a halogen atom, [4] polymerization by the Heck reaction of a compound having a vinyl group and a halogen atom, [5] polymerization by the Horner-Wadsworth-Emmons method of a compound having an aldehyde group and a compound having an alkyl sulfonate group, [6] polymerization by the Horner-Wadsworth-Emmons method of a compound having an aldehyde group and an alkyl phosphonate group, [7] polycondensation by the dehydrohalogenation method of a compound having two or more methyl halide groups, [8] polycondensation by the sulfonium salt decomposition method of a compound having two or more sulfonium salt groups, [9] polymerization by the Knoevenagel reaction of a compound having an aldehyde group and a compound having an acetonitrile group, [10] polymerization by the Knoevenagel reaction of a compound having an aldehyde group and an acetonitrile group, and the like, methods such as [11] polymerization by the McMurry reaction of a compound having two or more aldehyde groups, and the like, are illustrated.

As the method for producing a polymer compound of the present invention, when the main chain has no vinylene group, for example, [12] a method of polymerization by the Suzuki coupling reaction, [13] a method of polymerization by the Grignard reaction, [14] a method of polymerization with a Ni(0) catalyst, [15] a method of polymerization with an oxidizer such as $FeCl_3$ and the like, a method of electrochemical oxidation polymerization, [16] a method by decomposition of an intermediate polymer having a suitable leaving group, and the like, are illustrated.

Of them, the polymerization by the Wittig reaction, the polymerization by the Heck reaction, the polymerization by the Horner-Wadsworth-Emmons method, the polymerization by the Knoevenagel reaction, the method of polymerization by the Suzuki coupling reaction, the method of polymerization by the Grignard reaction and the method of polymerization with a Ni(0) catalyst are preferable since structure control is easier. Further, the method of polymerization with a Ni(0) catalyst is more preferable because of easier availability of raw materials and simplicity of operation of the polymerization reaction.

Here, a case of use of the method of polymerization with a Ni(0) catalyst (Yamamoto polymerization method) will be described. In this case, an intended polymer can be produced by using monomers in which $D^1$, $D^2$, $D^3$, $D^4$ represent each independently a halogen atom, alkylsulfonyloxy group or arylsulfonyloxy group, and reacting these monomers in the presence of a Ni(0) complex. The reaction is usually carried out by mixing all monomers (80) and (90).

The polymerization is carried out in the presence of a Ni(0) complex (zerovalent nickel complex). The polymerization using a nickel complex includes a method of using zerovalent nickel as it is, and a method of reacting a nickel salt in the presence of a reducing agent to produce zerovalent nickel in the system and reacting this. As the zerovalent nickel complex, bis(1,5-cyclooctadiene)nickel(0), (ethylene)bis(triphenylphosphine)nickel(0), tetrakis(triphenylphosphine)nickel and the like are illustrated, and of them, bis(1,5-cyclooctadiene)nickel(0) is preferable from the standpoints of wide usage and cheap price. Addition of a neutral ligand is preferable from the standpoint of improvement in yield. Here, the neutral ligand is a ligand not having anion and cation, and examples include nitrogen-containing ligands such as 2,2'-bipyridyl, 1,10-phenanthroline, methylenebisoxazoline, N,N'-tetramethylethylenediamine and the like; tertiary phosphine ligands such as triphenylphosphine, tritolylphosphine, tributylphosphine, triphenoxyphosphine and the like, and nitrogen-containing ligands are preferable from the standpoints of general versatility and cheap price, and 2,2'-bipyridyl is particularly preferable from the standpoints of high reactivity and high yield. Particularly, a system obtained by adding 2,2'-bipyridyl as a neutral ligand to a system containing bis(1,5-cyclooctadiene)nickel(0) is preferable from the standpoint of improvement in yield of a polymer. In the method of reacting zerovalent nickel in a system, the nickel salt includes nickel chloride, nickel acetate and the like. The reducing agent includes zinc, sodium hydroxide, hydrazine and derivatives thereof, lithium aluminum hydride and the like, and if necessary, ammonium iodide, lithium iodide, potassium iodide and the like are used as an additive. The polymerization solvent is not particularly restricted providing it does not disturb polymerization, and those containing at least one aromatic hydrocarbon solvent and/or ether solvent are preferable. Examples of the aromatic hydrocarbon solvent include benzene, toluene, xylene, trimethylbenzene, tetramethylbenzene, butylbenzene, naphthalene, tetralin and the like, and preferable are toluene, xylene, tetralin and tetramethylbenzene. Examples of the ether solvent include diisopropyl ether, tetrahydrofuran, 1,4-dioxane, diphenyl ether, ethylene glycol dimethyl ether, tert-butyl methyl ether and the like, and tetrahydrofuran, 1,4-dioxane and the like as a good solvent for a polymer compound are preferable. Of solvents, tetrahydrofuran is most preferable. From the standpoint of improvement of polymerizability and solubility, mixed solvents of an aromatic hydrocarbon solvent and/or ether solvent with a solvent other than the aromatic hydrocarbon solvent and ether solvent may be used as the solvent providing the polymerization reaction is not disturbed.

The reaction operation and the like can be carried out according to a method described, for example, in JP-A No. 2000-44544. In the Yamamoto polymerization method, for example, the polymerization reaction is carried out usually under an atmosphere of an inert gas such as argon, nitrogen and the like, in a tetrahydrofuran solvent, at a temperature of 60° C., in the presence of a zerovalent nickel complex and a neutral ligand. The polymerization time is usually about from 0.1 to 100 hours, and from the standpoint of production cost, times of 10 hours or shorter are preferable. The polymerization temperature is usually about from 0 to 200° C., and from the standpoints of high yield and low heating cost, temperatures of 20 to 100° C. are preferable.

When the neutral ligand is used, the use amount thereof is preferably about from 0.5 to 10 mol, more preferably 0.8 to 1.5 mol, further preferably 0.9 to 1.1 mol based on 1 mol of a zerovalent nickel complex from the standpoints of reaction yield and cost.

The use amount of the zerovalent nickel complex is not particularly restricted providing the polymerization reaction is not disturbed, and there is a tendency of lower molecular weight when the use amount is too small and there is a tendency of more complicated post treatment when the use amount is too large. Thus, the use amount is preferably 0.1 to 10 mo, more preferably 1 to 5 mol, further preferably 1.7 to 3.5 based on 1 mol of a monomer.

The polymerization reaction is carried out usually under an atmosphere of an inert gas such as argon, nitrogen and the like in a reaction system in which the zerovalent nickel complex catalyst is not deactivated.

After completion of production of a polymer compound of the present invention, the polymer compound may be subjected, if necessary, to conventional separation operations and purification operations such as washing with acid, washing with alkali, neutralization, washing with water, washing with organic solvent, re-precipitation, centrifugal separation, extraction, column chromatography and the like, and to drying and other operations.

<Composition (Liquid Composition)>

The composition of the present invention contains the above-described polymer compound and a compound having a polystyrene-reduced number average molecular weight of $10^3$ to $10^8$ other than the polymer compound. As the compound having a polystyrene-reduced number average molecular weight of $10^3$ to $10^8$ other than the polymer compound, illustrated are poly(phenylene) and derivatives thereof, poly(fluorene) and derivatives thereof, poly(benzofluorene) and derivatives thereof, poly(dibenzofuran) and derivatives thereof, poly(dibenzothiophene) and derivatives thereof, poly(carbazole) and derivatives thereof, poly(thiophene) and derivatives thereof, poly(phenylenevinylene) and derivatives thereof, poly(fluorenevinylene) and derivatives thereof, poly(benzofluorenevinylene) and derivatives thereof, poly(dibenzofuranvinylene) and derivatives thereof, and the like. Here, these derivatives are other than the above-described repeating units of the formulae (1), (2) and (70).

The liquid composition of the present invention is useful for production of light emitting devices such as polymer light emitting devices and the like and organic transistors. The liquid composition contains the above-described polymer compound and a solvent. In the present specification, "liquid composition" means that which is liquid in producing a device, and typically, means that which is liquid at normal pressure (namely, 1 atom) and 25° C. The liquid composition is, in general, called ink, ink composition, solution or the like in some cases.

The liquid composition of the present invention may contain low molecular weight light emitting materials, hole transporting materials, electron transporting materials, stabilizers, additives for controlling viscosity and/or surface tension, antioxidants and the like in addition to the above-described polymer compound. These optional components may be used singly or in combination of two or more.

Examples of the low molecular weight fluorescent material which may be contained in a liquid composition of the present invention include fluorescent materials composed of low molecular weight compounds such as naphthalene derivatives, anthracene, anthracene derivatives, perylene, perylene derivatives, polymethine coloring matters, xanthene coloring matters, coumarin coloring matters, cyanine coloring matters, metal complexes having a metal complex of 8-hydroxyquinoline as a ligand, metal complexes having a 8-hydroxyquinoline derivative as a ligand, other fluorescent metal complexes, aromatic amines, tetraphenylcyclopentadiene, tetraphenylcyclopentadiene derivatives, tetraphenylcyclobutadiene, tetraphenylcyclobutadiene derivatives, stilbenes, silicon-containing aromatics, oxazoles, furoxans, thiazoles, tetraarylmethanes, thiadiazoles, pyrazoles, metacyclophanes, acetylenes and the like. Specifically, those described in, for example, JP-A Nos, 57-51781, 59-194393 and the like, and known materials are mentioned.

Examples of the hole transporting material which may be contained in a liquid composition of the present invention include polyvinylcarbazole and its derivatives, polysilane and its derivatives, polysiloxane derivatives having an aromatic amine on the side chain or main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives, poly(2,5-thienylenevinylene) and its derivatives, and the like.

Examples of the electron transporting material which may be contained in a liquid composition of the present invention include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, polyfluorene and its derivatives, and the like.

Examples of the stabilizer which may be contained in a liquid composition of the present invention include phenol antioxidants, phosphorus-based antioxidants and the like.

Examples of the additives for controlling viscosity and/or surface tension which may be contained in a liquid composition of the present invention include compounds of higher molecular weight for increasing viscosity (thickening agents), poor solvents, compounds of lower molecular weight for lowering viscosity, surfactants for lowering surface tension, and the like may be appropriately combined and used.

As the above-described compounds of higher molecular weight, those which do not disturb light emission and charge transportation are advantageous, and these are usually soluble in the solvent for a liquid composition. As the compound of higher molecular weight, for example, polystyrene of higher molecular weight, polymethyl methacrylate of higher molecular weight, and the like can be used. The styrene-reduced weight average molecular weight of the above-described compound of higher molecular weight is preferably 500000 or more, and more preferably 1000000 or more. A poor solvent can also be used as a thickening agent.

As the antioxidant which may be contained in a liquid composition of the present invention, those which do not disturb light emission and charge transportation are advantageous, and when the composition contains a solvent, these antioxidants are usually soluble in the solvent. As the antioxidant, illustrated are phenol antioxidants, phosphorus-based antioxidants and the like. By use of an antioxidant, preservation stability of the above-described polymer compound and solvent can be improved.

When a liquid composition of the present invention contains a hole transporting material, the ratio of the hole transporting material in the liquid composition is usually 1 wt % to 80 wt %, preferably 5 wt % to 60 wt %. When a liquid composition of the present invention contains an electron transporting material, the ratio of the electron transporting material in the liquid composition is usually 1 wt % to 80 wt %, preferably 5 wt % to 60 wt %.

In producing a polymer light emitting device, when a film is formed using this liquid composition, it may be permissible to only remove a solvent by drying after application of the liquid composition, and also in the case of mixing of a charge transporting material and a light emitting material, the same means can be applied, thus, it is very advantageous for production. In drying, drying may be carried out under condition heated at about from 50 to 150° C., and drying may be carried out under condition pressure-reduced at about $10^{-3}$ Pa.

As the film formation method using a liquid composition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

The proportion of a solvent in the liquid composition is usually 1 wt % to 99.9 wt %, preferably 60 wt % to 99.9 wt %, further preferably 90 wt % to 99.8 wt % based on the total weight of the liquid composition. Though the viscosity of the liquid composition varies depending on the printing method, a range of 0.5 to 500 mPa·s is preferable at 25° C., and when the liquid composition passes through a discharging apparatus such as in an ink jet printing method and the like, the viscosity at 25° C. is preferably in the range from 0.5 to 20 mPa·s for preventing clogging and curving in flying in discharging.

As the solvent to be contained in the liquid composition, those capable of dissolving or dispersing components other than the solvent in the liquid composition are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethyl cellosolve acetate and the like, polyhydric alcohols such as ethylene glycol, ethylene glycol monoethyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, and amide solvents such as N-methyl-2-pyrrolidone, N,N-dimethylformamide and the like. These solvents may be used singly or in combination of two or more. Of the above-described solvents, at least one organic solvent having a structure containing at least one benzene ring and having a melting point of 0° C. or lower and a boiling point of 100° C. or higher is preferably contained from the standpoints of viscosity, film formability and the like.

Regarding the kind of the solvent, aromatic hydrocarbon solvents, aliphatic hydrocarbon solvents, ester solvents and ketone solvents are preferable from the standpoints of dissolvability into an organic solvent of other components than the solvent in the liquid composition, uniformity in film formation, viscosity property and the like, and more preferable are toluene, xylene, ethylbenzene, diethylbenzene, trimethylbenzene, mesitylene, n-propylbenzene, i-propylbenene, n-butylbenzene, i-butylbenzene, s-butylbenzene, anisole, ethoxybenzene, 1-methylnaphthalene, cyclohexane, cyolohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone and dicyclohexylketone, and at least one of xylene, anisole, mesitylene, cyclohexylbenzene, bicyclohexyl methyl benzoate is more preferably contained.

The number of the kinds of solvents contained in the liquid composition is preferably 2 or more, more preferably 2 to 3, further preferably 2, from the standpoint of film formability and from the standpoint of device properties and the like.

When two solvents are contained in the liquid composition, one solvent of them may be in solid state at 25° C. From the standpoint of film formability, it is preferable that one solvent has a boiling point of 180° C. or higher and another solvent has a boiling point of lower than 180° C., and it is more preferable that one solvent has a boiling point of 200° C. or higher and another solvent has a boiling point lower than 180° C. From the standpoint of viscosity, it is preferable that 0.2 wt % or more of components left after removal of solvents from the liquid composition are dissolved in solvents at 60° C., and it is preferable that 0.2 wt % or more of components left after removal of solvents from the liquid composition are dissolved in one of two solvents at 25° C.

When three solvents are contained in the liquid composition, one to two solvents of them may be in solid state at 25° C. From the standpoint of film formability, it is preferable that at least one of three solvents has a boiling point of 180° C. or higher and at least one solvent has a boiling point of 180° C. or lower, and it is more preferable that at least one of three solvents has a boiling point of 200° C. or higher and 300° C. or lower and at least one solvent has a boiling point of 180° C. or lower. From the standpoint of viscosity, it is preferable that 0.2 wt % or more of components left after removal of solvents from the liquid composition are dissolved in two of three solvents at 60° C., and it is preferable that 0.2 wt. % or more of components left after removal of solvents from the liquid composition are dissolved in one of three solvents at 25° C.

When two or more solvents are contained in the liquid composition, the proportion of a solvent having the highest boiling point is preferably 40 to 90 wt %, more preferably 50 to 90 wt %, further preferably 65 to 85 wt % based on the weight of all solvents contained in the liquid composition from the standpoints of viscosity and film formability.

—Thin Film—

The thin film of the present invention will be described. This thin film is obtained by using the above-described polymer compound. As the kind of the thin film, a light emitting thin film, electric conductive thin film, organic semiconductor thin film and the like are illustrated.

The light emitting thin film shows a quantum yield of light emission of preferably 50% or more, more preferably 60% or more, further preferably 70% or more from the standpoints of brilliance, light emission voltage and the like of a device.

The electric conductive thin film has a surface resistance of preferably 1 KΩ/ or less. By doping the thin film with a Lewis acid, ionic compound and the like, the electric conductivity can be enhanced. The surface resistance is more preferably 100Ω/ or less, further preferably 10Ω/ or less.

Either larger one of electron mobility or hole mobility of the organic semiconductor thin film is preferably $10^{-5}$ cm$^2$/V/sec. or more, more preferably $10^{-3}$ cm$^2$/V/sec. or more, further preferably $10^{-1}$ cm$^2$/V/sec. or more. Using an organic semiconductor thin film, an organic transistor can be manufactured. Specifically, an organic semiconductor thin film is formed on a Si substrate carrying an insulation film of $SiO_2$ and the like and a gate electrode formed thereon, and a source electrode and a drain electrode are formed with Au and the like, thus, an organic transistor is obtained.

—Organic Transistor (Polymer Electric Field Effect Transistor—

Next, a polymer electric field effect transistor as one embodiment of the organic transistor will be described.

The polymer compound of the present invention can be used as a material of a polymer electric field effect transistor, particularly, as an active layer. As the structure of a polymer electric field effect transistor, it may be usually permissible that a source electrode and a drain electrode are placed next to an active layer made of a polymer, and further, a gate electrode is placeded sandwiching an insulation layer next to the active layer.

The polymer electric field effect transistor is usually formed on a supporting substrate. The material of the supporting substrate is not particularly restricted providing it does not disturb a property as an electric field effect transistor, and a glass substrate, flexible film substrate and plastic substrate can also be used.

The polymer electric field effect transistor can be produced by known methods, for example, a method described in JP-A No. 5-110069.

In forming an active layer, it is very advantageous and preferable for production to use a polymer compound soluble in organic solvents. As the film formation method from a solution prepared by dissolving an organic solvent-soluble polymer compound in a solvent, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

Preferable is an encapsulated polymer electric field effect transistor obtained by producing a polymer electric field effect transistor and then, encapsulating this. By this, the polymer electric field effect transistor is blocked from atmospheric air, and decrease in the property of the polymer electric field effect transistor can be suppressed.

As the encapsulating method, a method of covering with a ultraviolet (UV) hardening resin, thermosetting resin, inorganic SiONx film and the like, a method of pasting a glass plate or film with a UV hardening resin, thermosetting resin and the like, are mentioned. It is preferable that a process from manufacturing of a polymer electric field effect transistor until encapsulation is carried out without exposing to atmospheric air (for example, in a dried nitrogen atmosphere, in vacuum, and the like), for effectively performing blocking from atmospheric air.

—Organic Solar Battery—

Next, the organic solar battery will be described. An organic photoelectric conversion device as one embodiment of the organic solar battery, the organic photoelectric conversion device being a solid photoelectric conversion device utilizing a photoelectromotive force effect, will be described.

The polymer compound of the present invention can be used suitably as a material of organic photoelectric conversion devices, particularly, as an organic semiconductor layer of a schottky barrier type device utilizing an interface between an organic semiconductor and a metal, or as an organic semiconductor layer of a pn heterojunction type device utilizing an interface between an organic semiconductor and an inorganic semiconductor or between organic semiconductors.

Further, the polymer compound of the present invention can be used suitably as an electron donating polymer or electro accepting polymer in a bulk heterojunction type device having increased donor-acceptor contact area, further, as an electron donating conjugated polymer (dispersion supporting body) of an organic photoelectric conversion device using a high molecular weight-low molecular weight complex system, for example, a bulk heterojunction type organic photoelectric conversion device in which a fullerene derivative is dispersed as an electron acceptor Regarding the structure of an organic photoelectric conversion device, is may be permissible in the case of, for example, a pn heterojunction type device, that a p type semiconductor layer is formed on an ohmic electrode, for example, ITO, and further, an n type semiconductor layer is formed, and an ohmic electrode is placed thereon.

The organic photoelectric conversion device is usually formed on a supporting substrate. The material of the supporting substrate is not particularly restricted providing it does not disturb a property as an organic photoelectric conversion device, and a glass substrate, flexible film substrate and plastic substrate can also be used.

The organic photoelectric conversion device can be produced by known methods, for example, a method described in Synth. Met., 102, 982 (1999) and a method described in Science, 270, 1789 (1995).

When the polymer compound of the present invention is used as a light emitting material of a polymer LED, its purity exerts an influence on a light emission property, thus, in the production method of the present invention, it is preferable that the above-described separation operations and purification operations are carried out sufficiently, to previously remove unreacted monomers, by-products, catalyst residue and the like sufficiently.

In drying, conditions under which a remaining solvent is removed sufficiently are advantageous. For preventing denaturing of a polymer compound, it is preferable to carry out drying while shielding with an inert atmosphere. Further, it is preferable to carry out drying at temperatures at which a polymer compound is not thermally denatured.

The light emitting material of the present invention contains a polymer compound of the present invention. That is, the polymer compound of the present invention can be used as a component of a light emitting material. The polymer compound of the present invention can also be used as a charge transporting material, organic semiconductor material, optical material, or as an electric conductive material by doping. Further, the polymer compound of the present invention can also be used in an organic transistor and a solar battery.

—Polymer LED—

Next, the polymer LED of the present invention will be illustrated.

The polymer LED of the present invention is characterized in that a light emitting layer is present between electrodes composed of an anode and a cathode and the light emitting layer contains a polymer compound of the present invention.

The polymer LED of the present invention includes polymer LED having an electron transporting layer placed between a cathode and a light emitting layer, polymer LED having a hole transporting layer placed between an anode and a light emitting layer, polymer LED having an electron transporting layer placed between a cathode and a light emitting layer and a hole transporting layer placed between an anode and a light emitting layer, and the like.

The polymer LED of the present invention includes also polymer LED having a layer containing an electric conductive polymer between at least one electrode and a light emitting layer, the layer being adjacent to the electrode; polymer LED having an insulation layer having a thickness of 2 nm or less between at least one electrode and a light emitting layer, the insulation layer being adjacent to the electrode.

For example, the following structures a) to d) are specifically illustrated a) anode/light emitting layer/cathode b) anode/hole transporting layer/light emitting layer/cathode c) anode/light emitting layer/electron transporting layer/cathode d) anode/hole transporting layer/light emitting layer/electron transporting layer/cathode (wherein, / means adjacent lamination of layers, applicable also in the followings)

Here, the light emitting layer is a layer having a function of light emission, the hole transport layer is a layer having a function of transporting holes, and the electron transport layer is a layer having a function of transporting electrons. The electron transport layer and the hole transport layer are collectively called charge transporting layer.

Two or more of the light emitting layers, two or more of the hole transport layers and two or more of the electron transport layers may be used each independently.

Among charge transporting layers placed next to an electrode, those having a function of improving charge injecting efficiency from an electrode and having an effect of lowering the driving voltage of a device are, in particularly, called generally charge injection layer (hole injection layer, electron injection layer).

Further, for improving close adherence with an electrode or improving charge injection from an electron, the above-described charge injection layer or an insulation layer having a thickness of 2 nm or less may be placed next to the electrode, alternatively, for improving close adherence of an interface or preventing mixing, a thin buffer layer may be inserted into an interface of a charge transporting layer and a light emitting layer.

The order and number of layers to be laminated, and thickness of each layer can be appropriately determined in view of light emission efficiency and life of a device.

In the present invention, as the polymer LED carrying a provided charge injection layer (electron injection layer, hole injection layer), mentioned are polymer LED having a charge injection layer placed next to a cathode and polymer LED having a charge injection layer next to an anode.

For example, the following structures e) to p) are illustrated.

e) anode/charge injection layer/light emitting layer/cathode f) anode/light emitting layer/charge injection layer/cathode g) anode/charge injection layer/light emitting layer/charge injection layer/cathode h) anode/charge injection layer/hole transporting layer/light emitting layer/cathode i) anode/hole injection layer/light emitting layer/charge injection layer/cathode j) anode/charge injection layer/hole transporting layer/light emitting layer/charge injection layer/cathode k) anode/charge injection layer/light emitting layer/charge transporting layer/cathode l) anode/light emitting layer/electron transporting layer/charge injection layer/cathode m) anode/charge injection layer/light emitting layer/electron transporting layer/charge injection layer/cathode n) anode/charge injection layer/hole transporting layer/light emitting layer/charge transporting layer/cathode o) anode/hole transporting layer/light emitting layer/electron transporting layer/charge injection layer/cathode p) anode/charge injection layer/hole transporting layer/light emitting layer/electron transporting layer/charge injection layer/cathode Examples of the charge injection layer include a layer containing an electric conductive polymer, a layer placed between an anode and a hole transporting layer and containing a material having ionization potential of a value between an anode material and a hole transporting material contained in a hole transporting layer, a layer placed between an anode and an electron transporting layer and containing a material having electron affinity of a value between a cathode material and an electron transporting material contained in an electron transporting layer, and the like.

When the above-described charge injection layer contains an electric conductive polymer, electric conductivity of the electric conductive polymer is preferably $10^{-5}$ S/cm or more and $10^3$ or less, and for decreasing leak current between light emission picture elements, more preferably $10^{-5}$ S/cm or more and $10^2$ S/cm or less, further preferably $10^{-5}$ S/cm or more and $10^1$ S/cm or less.

For controlling the electric conductivity of the electric conductive polymer to $10^{-5}$ Elam or more and $10^3$ or less, the electric conductive polymer is doped with a suitable amount of ions.

As the kind of ions to be doped, an anion is used in hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the charge injection layer may be appropriately selected depending on a relation with the material of an electrode and an adjacent layer, and examples include polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, electric conductive polymers such as polymers containing an aromatic amine structure on the side chain or main chain, metal phthalocyanine (copper phthalocyanine and the like), carbon and the like.

An insulation layer having a thickness of 2 nm or less has a function of making charge injection easier. As the material of the above-described insulation layer, a metal fluoride, metal oxide, organic insulating material and the like are mentioned. As the polymer LED carrying an insulation layer having a thickness of 2 nm or less placed thereon, there are mentioned polymer LED in which an insulation layer having a thickness of 2 nm or less is placed next to a cathode, and polymer LED in which an insulation layer having a thickness of 2 nm or less is placed next to an anode.

Specifically, the following structures q) to ab) are mentioned, for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole injection layer/light emitting layer/cathode u) anode/hole injection layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode The thickness of a light emitting layer in a polymer LED of the present invention shows an optimum value varying depending on the material to be used and may be advantageously selected so as to give suitable driving voltage and light emission efficiency, and it is, for example, 1 nm to 1 μm, preferably 2 nm to 500 nm, further preferably 5 nm to 200 nm.

In the polymer LED of the present invention, light emitting materials other than the above-described polymer compound may be mixed and used in a light emitting layer. In the polymer LED of the present invention, the light emitting layer containing light emitting materials other than the above-described polymer compound may be laminated with a light emitting layer containing the above-described polymer compound.

As the light emitting material, known materials can be used. As the compounds of lower molecular Weight, there can be used, for example, naphthalene derivatives, anthracene or its derivatives, perylene or its derivatives, and polymethine, xanthene, coumarin and cyanine coloring matters, metal complexes of 8-hydroxyquinoline or its derivatives, aromatic amines, tetraphenylcyclopentadiene or its derivatives, or tetraphenylbutadiene or its derivatives, metal complexes of 2-phenylpyridine or its derivatives, metal complexes of acetylacetone or its derivatives, and the like.

Specifically, known compounds such as those described in, for example, JP-A Nos. 57-51781, 59-194393, and the like can be used.

Further, metal complexes showing light emission from triplet excited state (triplet light emitting complex: for example, complexes in which phosphorescence emission is observed, and fluorescence emission in addition to this phosphorescence emission are observed, are also included), for example, those conventionally used as EL light emitting materials of low molecular weight, can also be used. These triplet light emitting complexes are described, for example, in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, and the like.

The film formation method of a light emitting layer is not restricted, and methods of film formation from a solution are illustrated. As the film formation method from a solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

When the polymer LED of the present invention has a hole transport layer, examples of the hole transporting material to be used include polyvinylcarbazole or its derivatives, polysilane or its derivatives, polysiloxane derivatives having an aromatic amine on the side chain or main chain, pyrazoline derivatives, arylamine derivatives, stilbene derivatives, triphenyldiamine derivatives, polyaniline or its derivatives, polythiophene or its derivatives, polypyrrole or its derivatives, poly(p-phenylenevinylene) or its derivatives, poly(2,5-thienylenevinylene) or its derivatives, and the like.

Specifically, those described in JP-A Nos. 63-70257, 63-175860, 2-135359, 2-135362, 2-209988, 3-37992 and 3-152184, and the like are illustrated, as the hole transporting material.

Of them, preferable as the hole transporting material used in a hole transport layer are polymer hole transporting materials such as polyvinylcarbazole or its derivatives, polysilane or its derivatives, polysiloxane derivatives having an aromatic amine compound group on the side chain or main chain, polyaniline or its derivatives, polythiophene or its derivatives, poly(p-phenylenevinylene) or its derivatives, poly(2,5-thienylenevinylene) or its derivatives, and the like, and more preferable are polyvinylcarbazole or its derivatives, polysilane or its derivatives, and polysiloxane derivatives having an aromatic amine on the side chain or main chain. In the case of a hole transporting material of low molecular weight, it is preferably dispersed in a polymer binder.

Polyvinylcarbazole or its derivatives can be obtained by, for example, cation polymerization or radical polymerization from a vinyl monomer.

As the polysilane or its derivative, compounds described in Chem. Rev., vol. 89, p. 1359 (1989), GB Patent No. 2300196 publication, and the like are illustrated. Also as the synthesis method, methods described in them can be used, and particularly, the Kipping method is suitably used.

In the polysiloxane or its derivative, the siloxane skeleton structure shows little hole transporting property, thus, those having a structure of the above-described hole transporting material of low molecular weight on the side chain or main chain are suitably used. Particularly, those having an aromatic amine showing hole transportability on the side chain or main chain are illustrated.

Though the film formation method of a hole transporting layer is not particularly restricted, a method of film formation from a mixed solution with a polymer binder is illustrated, in the case of a hole transporting material of low molecular weight. In the case of a hole transporting material of high molecular weight, a method of film formation from a solution is illustrated.

The solvent used for film formation from a solution is not particularly restricted providing it can dissolve a hole transporting material. Examples of the solvent include chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethylcellosolve acetate and the like.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

As the polymer binder to be mixed, those not extremely disturbing charge transportation are preferable, and those showing no strong absorption against visible light are suitably used. Examples of the polymer binder are polycarbonate, polyacrylate, polymethyl acrylate, polymethyl methacrylate, polystyrene, polyvinyl chloride, polysiloxane and the like.

Regarding the thickness of a hole transporting layer, the optimum value varies depending on a material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the hole transporting layer is, for example, 1 nm to 1 µm, preferably 2 µm to 500 nm, further preferably 5 nm to 200 nm.

When the polymer LED of the present invention has an electron transporting layer, known materials can be used as the electron transporting material to be used, and examples include oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, metal complexes of 8-hydroxyquinoline or its derivatives, polyquinoline or its derivatives, polyquinoxaline or its derivatives, polyfluorene or its derivatives, and the like.

Specifically, those described in JP-A Nos. 63-70257, 63-175860, 2-135359, 2-135361, 2-209988, 3-37992, 3-152184, and the like are illustrated.

Of them, oxadiazole derivatives, benzoquinone or its derivatives, anthraquinone or its derivatives, metal complexes of 8-hydroxyquinoline or its derivatives, polyquinoline or its derivatives, polyquinoxaline or its derivatives, and polyfluorene or its derivatives are preferable, and 2-(4-biphenylyl)-5-(4-t-butylphenyl)-1,3,4-oxadiazole, benzoqinone, anthraquinone, tris(8-quinolinol)aluminum and polyquinoline are further preferable.

The film formation method of an electron transporting layer is not particularly restricted, and in the case of an electron transporting material of low molecular weight, examples include a vacuum vapor-deposition method from powder, film formation methods from solution or melted condition, and in the case of an electron transporting material of high molecular weight, film formation methods from solution or melted condition are illustrated, respectively. In film formation from solution or melted condition, a polymer binder may be used together.

The solvent used for film formation from a solution is not particularly restricted, providing it can dissolve an electron transporting material and/or polymer binder. Examples of the solvent include chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethylcellosolve acetate and the like.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

As the polymer binder to be mixed, those not extremely disturbing charge transportation are preferable, and those showing no strong absorption against visible light are suitably used. Examples of the polymer binder include poly(N-vinylcarbazole), polyaniline or its derivatives, polythiophene or its derivatives, poly(p-phenylenevinylene) or its derivatives, poly(2,5-thienylenevinylene) or its derivatives, polycarbonate, polyacrylate, polymethyl acrylate, polymethyl methacrylate, polystyrene, polyvinyl chloride, polysiloxane and the like.

Regarding the thickness of an electron transporting layer, the optimum value varies depending on a material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the electron transporting layer is, for example, 1 nm to 1 µm, preferably 2 nm to 500 nm, further preferably 5 nm to 200 nm.

The substrate which forms polymer LED of the present invention may advantageously be that forming an electrode and which does not change in forming a layer of an organic substance, and examples thereof include glass, plastic, polymer film, silicon substrate and the like. In the case of an opaque substrate, it is preferable that the opposite electrode is transparent or semi-transparent.

In the present invention, it is usually preferable that at least one of electrodes composed of an anode and a cathode is transparent or semi-transparent, and the anode side is transparent or semi-transparent.

As the material of the cathode, an electric conductive metal oxide film, semi-transparent metal thin film and the like are used. Specifically, films (NESA and the like) formed using electric conductive glass composed of indium oxide, zinc oxide, tin oxide, and composite thereof: indium.tin.oxide (ITO), indium.zinc.oxide and the like, and gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline or its derivative, polythiophene or its derivative, and the like may be used.

The thickness of an anode can be appropriately selected in view of light transmission and electric conductivity, and it is, for example, 10 nm to 10 µm, preferably 20 nm to 1 µm, further preferably 50 nm to 500 nm.

For making charge injection easier, a layer made of a phthalocyanine derivative, electric conductive polymer, carbon and the like, or a layer having an average thickness of 2 nm or less made of a metal oxide, metal fluoride, organic insulation material and the like, may be placed on an anode.

As the material of a cathode used in polymer LED of the present invention, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys made of two or more of them, or alloys made of at least one of them and at least one of gold, silver, platinum, copper, manganese, titanium, cobalt, nickel, tungsten and tin, graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure including two or more layers.

The thickness of a cathode can be appropriately selected in view of electric conductivity and durability, and it is, for example, 10 nm to 10 µm, preferably 20 nm to 1 µm, further preferably 50 nm to 500 nm.

As the cathode manufacturing method, a vacuum vapor-deposition method, sputtering method, lamination method of thermally press-bonding a metal thin film, and the like are used. A layer made of an electric conductive polymer, or a layer having an average thickness of 2 nm or less made of a metal oxide, metal fluoride, organic insulation material and the like, may be placed between a cathode and an organic substance layer, and after manufacturing a cathode, a protective layer for protecting the polymer LED may be installed.

For use of the polymer LED stably for a long period of time, it is preferable to install a protective layer and/or protective cover, for protecting a device from outside.

As the protective layer, a polymer compound, metal oxide, metal fluoride, metal boride and the like can be used. As the protective cover, a glass plate, and a plastic plate having a surface subjected to low water permeation treatment, and the like can be used, and a method of pasting the cover to a device substrate with a thermosetting resin or photo-curable resin to attain close sealing is suitably used. When a space is maintained using a spacer, prevention of blemishing of a device is easier. If an inert gas such as nitrogen, argon and the like is filled in this space, oxidation of a cathode can be prevented, further, by placing a drying agent such as barium oxide and the like in this space, it becomes easier to suppress moisture adsorbed in a production process from imparting damage to the device. It is preferable to adopt one strategy among these methods.

Further, polymer LED having a charge transporting layer and a light emitting layer between electrodes composed of an anode and a cathode wherein the charge transporting layer contains a polymer compound of the present invention is also possible.

The polymer light emitting device of the present invention can be used as a sheet light source, segment display, dot matrix display, and back light of a liquid crystal display.

For obtaining light emission in the form of sheet using polymer LED of the present invention, it may be advantages to place a sheet anode and a sheet cathode so as to overlap. For obtaining light emission in the form of pattern, there are a method in which a mask having a window in the form of pattern is placed on the surface of the above-described sheet light emitting device, a method in which an organic substance layer in non-light emitting parts is formed with extremely large thickness to give substantially no light emission, and a method in which either anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several light emitting materials showing different emission colors are painted separately or a method in which a color filter or a fluorescence conversion filter is used, partial color display and multi-color display are made possible. In the case of a dot matrix device, passive driving is possible, and active driving may also be carried out in combination with TFT and the like. These displays can be used as a display of a computer, television, portable terminal, cellular telephone, car navigation, view finder of video camera, and the like.

Further, the above-described sheet light emitting device is of self emitting and thin type, and can be suitably used as a sheet light source for back light of a liquid crystal display, or as a sheet light source for illumination. IF a flexible substrate is used, it can also be used as a curved light source or display.

Examples will be shown below for illustrate the present invention further in detail, but the invention is not limited to them.

Here, as the number-average molecular weight and the weight-average molecular weight, polystyrene-reduced number-average molecular weight and polystyrene-reduced weight-average molecular weight were measured by gel permeation chromatography (GPC) using tetrahydrofuran as a solvent.

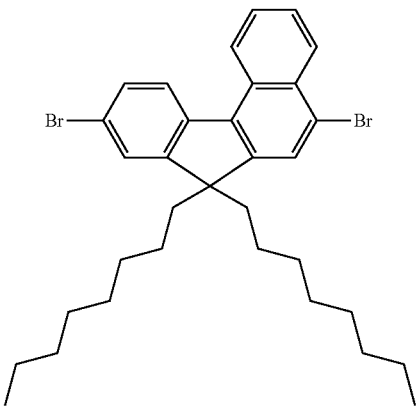

Monomer (1)

Synthesis Example 1 <synthesis of monomer (1)>

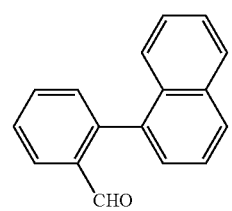

Compound D (synthesis of compound D)

Under an inert atmosphere, into a 300 ml three-necked flask was charged 5.00 g (29 mmol) of 1-naphthaleneboronic acid, 6.46 g (35 mmol) of 2-bromobenzaldehyde, 10.0 g (73 mmol) of potassium carbonate, 36 ml of toluene and 36 ml of ion exchanged water, and argon was bubbled through the mixture for 20 minutes at room temperature while stirring. Subsequently, 16.8 mg (0.15 mmol) of tetrakis(triphenylphosphine)palladium was added, further, argon was bubbled through the mixture for 10 minutes at room temperature while stirring. The temperature was raised to 100° C., and the mixture was reacted for 25 hours. After cooling to room temperature, an organic layer was extracted with toluene, and dried over sodium sulfate, then, the solvent was distilled off. Purification was performed by a silica gel column using a toluene:cyclohexane=1:2 mixed solvent as a developing solvent, to obtain 5.18 g (yield: 86%) of compound D as while crystal.

$^1$H-NMR (300 MHz/CDCl$_3$):

δ 7.39 to 7.62 (m, 5H), 7.70 (m, 2H), 7.94 (d, 2H), 8.12 (dd, 2H), 9.63 (s, 1H)

MS (APCI (+)): (M+H)$^+$ 233

Compound E

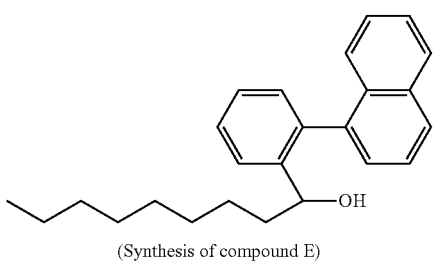

(Synthesis of compound E)

Under an inert atmosphere, into a 300 ml three-necked flask was charged 8.00 g (34.4 mmol) of compound D and 46 ml of dehydrated THF, and the mixture was cooled down to −78° C. Subsequently, 52 ml of n-octylmagnesium bromide (1.0 mol/l THF solvent) was dropped over a period of 30 minutes. After completion of dropping, the temperature was raised up to 0° C., the mixture was stirred for 1 hour, then, the temperature was raised up to room temperature, and the mixture was stirred for 45 minutes. The flask was immersed in an ice bath, and 20 ml of 1 N hydrochloric acid was added to stop the reaction, and an organic layer was extracted with ethyl acetate, and dried over sodium sulfate. The solvent was distilled off, then, purification was performed by a silica gel column using a toluene: hexane=10:1 mixed solvent as a developing solvent, to obtain 7.64 g (yield: 64%) of compound E as pale yellow oil. Two peaks were observed in HPLC measurement, and an identical mass number was observed in LC-MS measurement, leading to judgment of a mixture of isomers.

Compound F

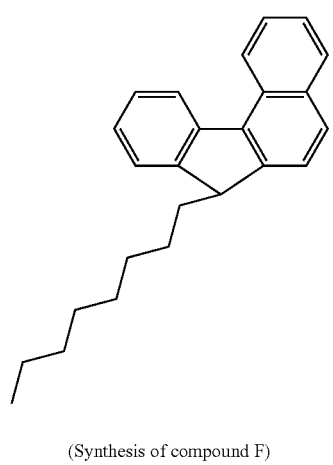

(Synthesis of compound F)

Under an inert atmosphere, into a 500 ml three-necked flask was charged 5.00 g (14.4 mmol) of compound E (mixture of isomers) and 74 ml of dehydrated dichloromethane, and the mixture was stirred at room temperature to cause dissolution thereof. Subsequently, an etherate complex of boron trifluoride was dropped at room temperature over 1 hour, and after completion of dropping, the mixture was stirred at room temperature for 4 hours. 125 ml of ethanol was added slowly while stirring, and when heat generation stopped, an organic layer was extracted with chloroform, washed with water twice, and dried over magnesium sulfate. The solvent was distilled off, then, purification was performed by a silica gel column using hexane as a developing solvent, to obtain 3.22 g (yield: 68%) of compound F as colorless oil.

$^1$H-NMR (300 MHz/CDCl$_3$):

δ 0.90 (t, 3H), 1.03 to 1.26 (m, 14H), 2.13 (m, 2H), 4.05 (t, 1H), 7.35 (dd, 1H), 7.46 to 7.50 (m, 2H), 7.59 to 7.65 (m, 3H), 7.82 (d, 1H), 7.94 (d, 1H), 8.35 (d, 1H), 8.75 (d, 1H)

MS (APCI (+)): (M+H)$^+$ 329

Compound G

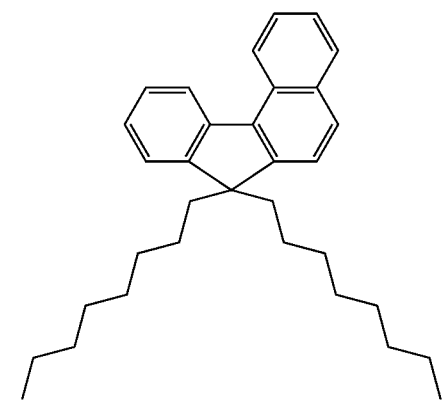

(Synthesis of compound G)

Under an inert atmosphere, into a 200 ma three-necked flask was charged 20 ml of ion exchanged water, and 18.9 g (0.47 mol) of sodium hydroxide was added portionwise while stirring to cause dissolution thereof. The aqueous solution was cooled down to room temperature, then, 20 ml of toluene, 5.17 g (15.7 mmol) of compound F and 1.52 g (4.72 mmol) of tributylammonium bromide were added and the temperature was raised up to 50° C. n-octyl bromide was dropped, and after completion of dropping, the mixture was reacted for 9 hours at 50° C. After completion of the reaction, an organic layer was extracted with toluene, washed with water twice, and dried over sodium sulfate. Purification was performed by a silica gel column using hexane as a developing solvent, to obtain 5.13 g (yield: 74%) of compound G as yellow oil.

$^1$H-NMR (300 MHz/CDCl$_3$):

δ 0.52 (m, 2H), 0.79 (t, 6H), 1.00 to 1.20 (m, 22H), 2.05 (t, 4H), 7.34 (d, 1H), 7.40 to 7.53 (m, 2H), 7.63 (m, 3H), 7.83 (d, 1H), 7.94 (d, 1H), 8.31 (d, 1H), 8.75 (d, 1H)

MS (APCI (+)): (M+H)$^+$ 441

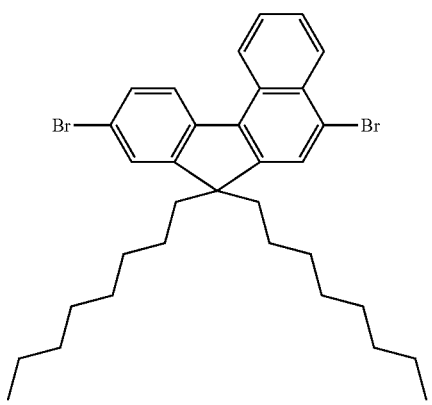

Compound H (Synthesis of compound H)

Under an air atmosphere, into a 50 ml three-necked flask was charged 4.00 g (9.08 mmol) of Compound G and 57 ml of an acetic acid:dichloromethane=1:1 mixed solvent, and the mixture was stirred at room temperature to cause dissolution thereof. Subsequently, 7.79 g (20.0 mmol) of benzyltrimethylammonium tribromide was added, and zinc chloride was added while stirring until complete dissolution of benzyltrimethylammonium tribromide. The mixture was stirred for 20 hours, then, 10 ml of a 5% sodium hydrogen sulfite aqueous solution was added to stop the reaction, and an organic layer was extracted with chloroform, washed with a potassium carbonate aqueous solution twice, and dried over sodium sulfate. Purification was performed twice by a flash column using hexane as a developing solvent, then, re-crystallized from an ethanol:hexane=1:1 mixed solvent, then, from an ethanol:hexane=10:1 mixed solvent, to obtain 4.13 g (yield: 76%) of compound H as white crystal.

$^1$H-NMR (300 MHz/CDCl$_3$):

δ 0.60 (m, 2H), 0.91 (t, 6H), 1.01 to 1.38 (m, 22H), 2.09 (t, 4H), 7.62 to 7.75 (m, 3H), 7.89 (s, 1H), 8.20 (d, 1H), 8.47 (d, 1H), 8.72 (d, 1H)

MS (APPI (+)): (M+H)$^+$ 598

Compound H obtained here is called monomer (1).

Reference Example

Synthesis of Monomer (TPP)

Under an nitrogen atmosphere, a mixture of 2.9 g of magnesium chip and tetrahydrofuran (dehydrated) was stirred, and to this was added a small amount of a solution prepared by dissolving 25 g of 2-bromo-5-chlorotoluene in tetrahydrofuran (dehydrated), to initiate a reaction. After initiation of the reaction, the remaining solution was subsequently added drop by drop while stirring to cause a reaction obtaining 120 ml of a tetrahydrofuran (dehydrated) solution of Grignard reagent. Into 120 ml of this Grignard reagent solution, a solution prepared previously by dissolving 9.7 g of dichlorophenylphosphine in 100 ml of tetrahydrofuran (dehydrated) was added slowly drop by drop while stirring so that the reaction temperature was kept at temperatures lower than 30° C. After dropping, the mixture was stirred at room temperature for 1 hour. Next, to this solution was added ion exchanged water drop by drop slowly.

Next, this solution was partitioned, and an upper layer was recovered. This solution was filtrated to remove insoluble substances. Then, the solvent was removed by reducing pressure. Then, the resultant precipitate was dissolved in hexane, then, filtrated to remove insoluble substances. This solution was cooled, re-crystallized, and the produced precipitate was recovered by filtration. This precipitate was dried under reduced pressure to obtain 11 g of a monomer (TPP).

MS (APCI (+)): (M+H)$^+$ 359

Element Analysis (flask burning-ion chromatograph method) Cl content; 19.1(%)

(Wet ashing by sulfuric acid nitric acid—Dissolved by hydrochloric acid—ICP emission spectrometry) P content: 8.54%

Monomer (TPP):

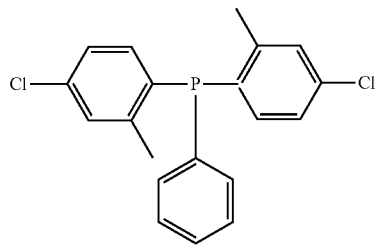

Example 1

Synthesis of Polymer Compound 1

0.17 g of bis(2-methyl-4-chlorophenyl)phenylphosphine {monomer (TPP)}, 1.08 g of the monomer (1) and 0.84 g of 2,2'-bipyridyl were dissolved in 70 g of tetrahydrofuran (dehydrated), then, a nitrogen gas was bubbled through this solution to purge an atmosphere in the system with a nitrogen gas. To this solution was added 1.5 g of bis(1,5-cyclooctadiene)nickel (0) {Ni(COD)$_2$}, and the mixture was stirred at room temperature for about 10 minutes, then, the temperature was raised and the mixture was reacted for 3 hours at 60° C. The reaction was carried out under a nitrogen atmosphere.

This reaction solution was cooled, then, a mixed solution of methanol 40 ml/ion exchanged water 40 ml was added, and the mixture was stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances, then, this toluene solution was purified by passing through an alumina column. Then, this toluene solution was washed with ca. 1 N hydrochloric acid, then, allowed to stand still, and partitioned and a toluene solution was recovered. Then, this toluene solution was washed with about 3% ammonia water, then, allowed to stand still, and partitioned and a toluene solution was recovered. Then, this toluene solution was washed with ion exchanged water, then, allowed to stand still, and partitioned and a toluene solution was recovered. Then, this toluene solution was poured into methanol, and purified by re-precipitation. The produced precipitate was recovered, then, this was dried under reduced pressure, to obtain 0.3 g of a polymer. The resultant polymer is called polymer compound 1.

The polymer compound 1 had a polystyrene-reduced number average molecular weight of $4.9 \times 10^4$ and a polystyrene-reduced weight average molecular weight of $1.6 \times 10^5$.

The structures of repeating units contained in the polymer compound 1 estimated from charged materials are shown below.

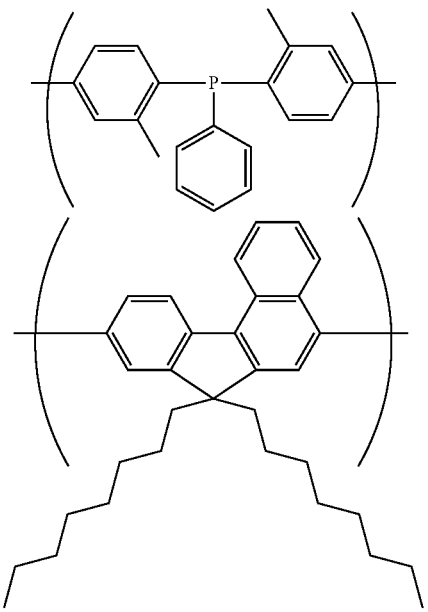

Example 2

Synthesis of Polymer Compound 2

0.16 g of bis(2-methyl-4-chlorophenyl)phenylphosphine {monomer (TPP)}, 0.63 g of the monomer (1) and 0.66 g of 2,2'-bipyridyl were charged in a reaction vessel, then, an atmosphere in the reaction vessel was purged with a nitrogen gas. To this vessel was added 70 g of tetrahydrofuran (dehydrated) previously deaerated by argon gas bubbling and dissolution was performed, then, to this solution was added 1.15 g of bis(1,5-cyclooctadiene)nickel (0) {Ni(COD)$_2$}, and the mixture was stirred at room temperature for about 10 minutes, then, the temperature was raised and the mixture was reacted for 3 hours at 60° C. The reaction was carried out under a nitrogen atmosphere.

This reaction solution was cooled, then, a mixed solution of methanol 40 ml/ion exchanged water 40 ml was added, and the mixture was stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances, then, this toluene solution was purified by passing through an alumina column. Then, this toluene solution was washed with ion exchanged water, then, allowed to stand still, and partitioned and a toluene solution was recovered. Then, this toluene solution was washed again with ion exchanged water, then, allowed to stand still, and partitioned and a toluene solution was recovered. Then, this toluene solution was poured into methanol, and purified by re-precipitation. The produced precipitate was recovered, then, this was dried under reduced pressure, to obtain 0.17 g of a polymer. The resultant polymer is called polymer compound 2.

The polymer compound 2 had a polystyrene-reduced number average molecular weight of $1.1 \times 10^4$ and a polystyrene-reduced weight average molecular weight of $8.5 \times 10^4$.

The structures of repeating units contained in the polymer compound 2 estimated from charged materials are shown below.

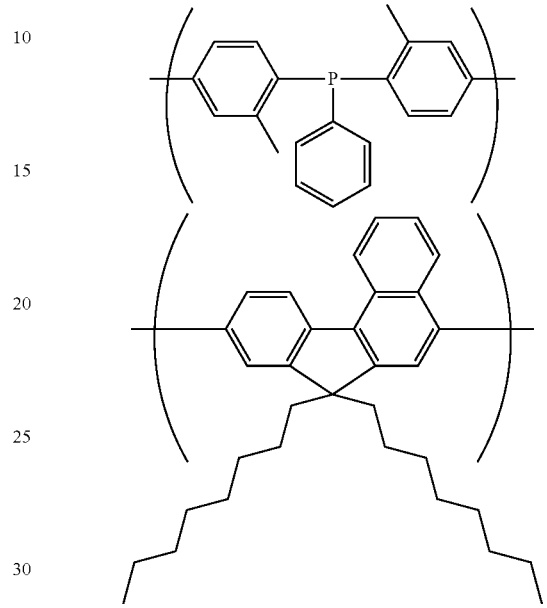

Comparative Example 1

Synthesis of Polymer Compound 3

0.45 g of bis(2-methyl-4-chlorophenyl)phenylphosphine {monomer (TPP)}, 1.29 g of 9,9-dioctyl-2,7-dibromofluorene, 0.27 g of 9,9-diisoamyl-2,7-dibromofluorene and 1.77 g of 2,2'-bipyridyl were dissolved in 175 g of tetrahydrofuran (dehydrated), then, a nitrogen gas was bubbled through this solution to purge an atmosphere in the system with a nitrogen gas. To this solution was added 3.2 g of bis(1,5-cyclooctadiene)nickel (0) {Ni(COD)$_2$}, and the mixture was stirred at room temperature for about 10 minutes, then, the temperature was raised and the mixture was reacted for 3 hours at 60° C. The reaction was carried out under a nitrogen atmosphere.

This reaction solution was cooled, then, a mixed solution of methanol 120 ml/ion exchanged water 120 ml was added, and the mixture was stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances, then, this toluene solution was purified by passing through an alumina column. Then, this toluene solution was washed with ca. 1 N hydrochloric acid, then, allowed to stand still, and partitioned and a toluene solution was recovered. Then, this toluene solution was washed with about 3% ammonia water, then, allowed to stand still, and partitioned and a toluene solution was recovered. Then, this toluene solution was washed with ion exchanged water, then, allowed to stand still, and partitioned and a toluene solution was recovered. Then, this toluene solution was poured into methanol, and purified by re-precipitation. The produced precipitate was recovered, then, this was dried under reduced pressure, to obtain 0.48 g of a polymer. The resultant polymer is called polymer compound 3.

The polymer compound 3 had a polystyrene-reduced number average molecular weight of $4.3 \times 10^4$ and a polystyrene-reduced weight average molecular weight of $1.1 \times 10^5$.

The structures of repeating units contained in the polymer compound 3 estimated from charged materials are shown below.

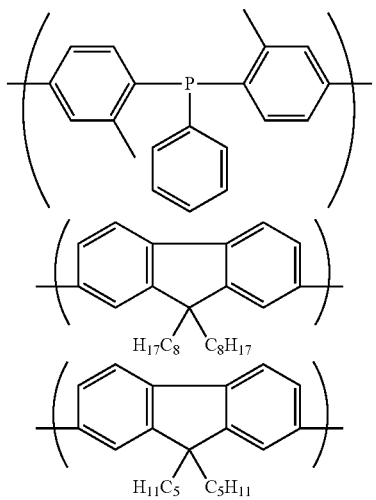

Comparative Example 2

Synthesis of Polymer Compound 4

Monomer (2) of the following structural formula:

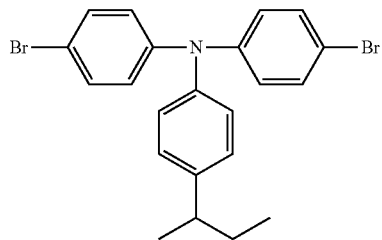

0.8 g of 4-(N,N-bis(4-bromophenyl)amino)isobutylbenzene, 2.5 g of the monomer (1) and 2.25 g of 2,2'-bipyridyl were dissolved in 200 g of tetrahydrofuran (dehydrated), then, a nitrogen gas was bubbled through this solution to purge an atmosphere in the system with a nitrogen gas. To this solution was added 4.0 g of bis(1,5-cyclooctadiene)nickel (0) {Ni(COD)$_2$}, and the mixture was stirred at room temperature for about 10 minutes, then, the temperature was raised and the mixture was reacted for 3 hours at 60° C. The reaction was carried out under a nitrogen atmosphere.

This reaction solution was cooled, then, a mixed solution of 25% ammonia water 50 ml/methanol 100 ml/ion exchanged water 100 ml was added, and the mixture was stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances, then, this toluene solution was purified by passing through an alumina column. Then, this toluene solution was washed with ca. 1 N hydrochloric acid, then, allowed to stand still, and partitioned and a toluene solution was recovered. Then, this toluene solution was washed with about 3% ammonia water, then, allowed to stand still, and partitioned and a toluene solution was recovered. Then, this toluene solution was washed with ion exchanged water, then, allowed to stand still, and partitioned and a toluene solution was recovered. Then, this toluene solution was poured into methanol, and purified by re-precipitation. The produced precipitate was recovered, then, this was dried under reduced pressure, to obtain 1.5 g of a polymer. The resultant polymer is called polymer compound 4.

The polymer compound 4 had a polystyrene-reduced number average molecular weight of $3.4 \times 10^4$ and a polystyrene-reduced weight average molecular weight of $2.2 \times 10^5$.

The structures of repeating units contained in the polymer compound 4 estimated from charged materials are shown below.

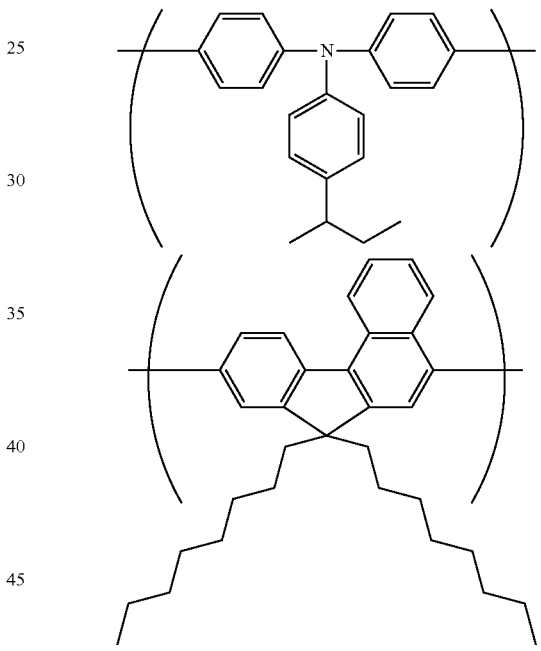

Example 3

Synthesis of Polymer Compound 5

0.70 g of monomer (3) of the following structural formula:

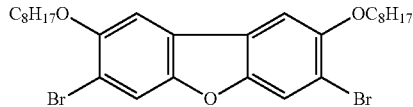

0.11 g of bis(2-methyl-4-chlorophenyl)phenylphosphine {monomer (TPP)} and 0.56 g of 2,2'-bipyridyl were charged in a reaction vessel, then, an atmosphere in the reaction vessel was purged with a nitrogen gas. To this vessel was added 60 g of tetrahydrofuran (dehydrated) previously deaerated by argon gas bubbling and dissolution was performed, then, to this solution was added 1.0 g of bis(1,5-cyclooctadiene) nickel (0) {Ni(COD)$_2$}, and the mixture was reacted at room temperature for 24 minutes. The reaction was carried out under a nitrogen atmosphere.

After the reaction, this reaction solution was added slowly to a mixed solution of methanol 40 ml/ion exchanged water 40 ml to cause re-precipitation, then, the mixture was subsequently stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances. Then, this toluene solution was washed with ca. 1 N hydrochloric acid aqueous solution, then, allowed to stand still, and a partitioned toluene solution was recovered. Then, this toluene solution was washed with about 4% ammonia water, then, allowed to stand still, and a partitioned toluene solution was recovered. Then, this toluene solution was washed with ion exchanged water, than, allowed to stand still, and a partitioned toluene solution was recovered. Then, this toluene solution was poured into methanol, and purified by re-precipitation. The produced precipitate was recovered, then, this was dried under reduced pressure, to obtain 0.17 g of a polymer. The resultant polymer is called polymer compound 5.

The polymer compound 5 had a polystyrene-reduced number average molecular weight of $2.0 \times 10^4$ and a polystyrene-reduced weight average molecular weight of $6.3 \times 10^4$.

The structures of repeating units contained in the polymer compound 5 estimated from charged materials are shown below.

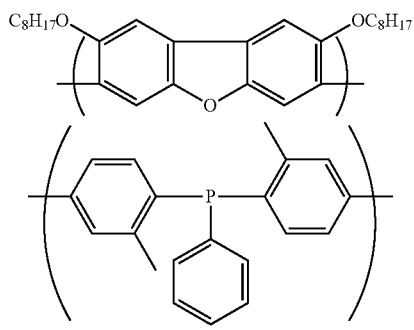

Example 4

Synthesis of Polymer Compound 6

0.72 g of monomer (4) of the following structural formula:

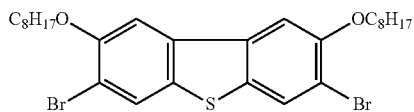

0.11 g of bis(2-methyl-4-chlorophenyl)phenylphosphine {monomer (TPP)} and 0.56 g of 2,2'-bipyridyl were charged in a reaction vessel, then, an atmosphere in the reaction vessel was purged with a nitrogen gas. To this vessel was added 60 g of tetrahydrofuran (dehydrated) previously deaerated by argon gas bubbling and dissolution was performed, then, to this solution was added 1.0 g of bis(1,5-cyclooctadiene) nickel (0) {Ni(COD)$_2$}, and the mixture was reacted at room temperature for 24 minutes. The reaction was carried out under a nitrogen atmosphere.

After the reaction, this reaction solution was added slowly to a mixed solution of methanol 40 ml/ion exchanged water 40 ml to cause re-precipitation, then, the mixture was subsequently stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances. Then, this toluene solution was washed with ca. 1 N hydrochloric acid aqueous solution, then, allowed to stand still, and a partitioned toluene solution was recovered. Then, this toluene solution was washed with about 4% ammonia water, then, allowed to stand still, and a partitioned toluene solution was recovered. Then, this toluene solution was washed with ion exchanged water, then, allowed to stand still, and a partitioned toluene solution was recovered. Then, this toluene solution was poured into methanol, and purified by re-precipitation. The produced precipitate was recovered, then, this was dried under reduced pressure, to obtain 0.20 g of a polymer. The resultant polymer is called polymer compound 6.

The polymer compound 6 had a polystyrene-reduced number average molecular weight of $2.2 \times 10^4$ and a polystyrene-reduced weight average molecular weight of $7.4 \times 10^4$.

The structures of repeating units contained in the polymer compound 6 estimated from charged materials are shown below.

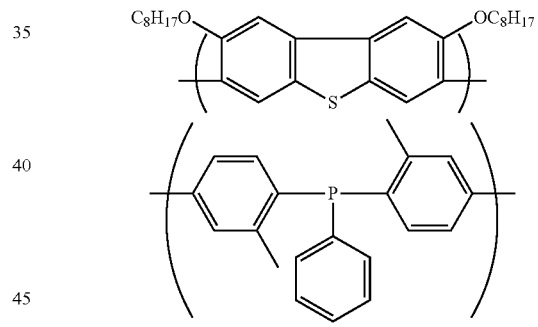

Comparative Example 3

Synthesis of Polymer Compound 7

3.6 g of the above-described monomer (4), 0.67 g of the above-described monomer (2) and 2.58 g of 2,2'-bipyridyl were charged in a reaction vessel, then, an atmosphere in the reaction vessel was purged with a nitrogen gas. To this vessel was added 200 g of tetrahydrofuran (dehydrated) previously deaerated by argon gas bubbling and dissolution was performed, then, to this solution was added 4.54 g of bis(1,5-cyclooctadiene)nickel (0) {Ni(COD)$_2$}, and the mixture was stirred at room temperature for 10 minutes, then, reacted at 60° C. for 3 hours. The reaction was carried out under a nitrogen atmosphere.

After the reaction, this reaction solution was cooled. Then, this reaction solution was poured slowly into a mixed solution of 25% ammonia water 50 ml/methanol 200 ml/ion exchanged water 200 ml to cause re-precipitation, then, the mixture was subsequently stirred for about 1 hour. This solution was allowed to stand still overnight at room temperature, then, the produced precipitate was recovered by filtration. Next, this precipitate was dried under reduced pressure, then, dissolved in toluene. This toluene solution was filtrated to remove insoluble substances. Then, this toluene solution was washed with ca. 1 N hydrochloric acid aqueous solution, then, allowed to stand still, and a partitioned toluene solution was recovered. Then, this toluene solution was washed with about 5% ammonia water, then, allowed to stand still, and a partitioned toluene solution was recovered. Then, this toluene solution was washed with ion exchanged water, then, allowed to stand still, and a partitioned toluene solution was recovered. Then, this toluene solution was poured into methanol, and purified by re-precipitation. The produced precipitate was recovered, then, this was dried under reduced pressure, to obtain 1.20 g of a polymer. The resultant polymer is called polymer compound 7.

The polymer compound 7 had a polystyrene-reduced number average molecular weight of $5.6 \times 10^4$ and a polystyrene-reduced weight average molecular weight of $4.6 \times 10^5$.

The structures of repeating units contained in the polymer compound 7 estimated from charged materials are shown below.

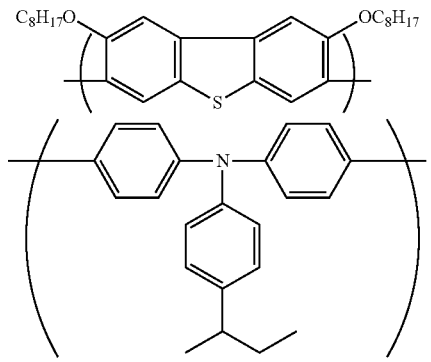

Example 5

Synthesis of Polymer Compound 8

0.61 g of the above-described monomer (3). 0.16 g of bis(2-methyl-4-chlorophenyl)phenylphosphine {monomer (TPP)} and 0.63 g of 2,2'-bipyridyl were charged in a reaction vessel, then, an atmosphere in the reaction vessel was purged with a nitrogen gas. To this vessel was added 60 g of tetrahydrofuran (dehydrated) previously deaerated by argon gas bubbling and dissolution was performed, then, to this solution was added 1.11 g of bis(1,5-cyclooctadiene)nickel (0) {Ni (COD)$_2$}, and the mixture was reacted at room temperature for 21 minutes. The reaction was carried out under a nitrogen atmosphere.

After the reaction, this reaction solution was poured slowly into a mixed solution of methanol 40 ml/ion exchanged water 40 ml to cause re-precipitation, then, the mixture was subsequently stirred for about 1 hour. This solution was allowed to stand still overnight at room temperature, then, the produced precipitate was recovered by filtration. Next, this precipitate was dried under reduced pressure, dissolved in toluene. This toluene solution was filtrated to remove insoluble substances. Then, this toluene solution was washed with about 5% acetic acid aqueous solution, then, allowed to stand still, and a partitioned toluene solution was recovered. Then, this toluene solution was washed with about 4% ammonia water, then, allowed to stand still, and a partitioned toluene solution was recovered. Then, this toluene solution was washed with ion exchanged water, then, allowed to stand still, and a partitioned toluene solution was recovered. Then, this toluene solution was purified by passing through a column filled with alumina. Then, this toluene solution was poured into methanol, and purified by re-precipitation. The produced precipitate was recovered, then, this was dried under reduced pressure, to obtain 0.10 g of a polymer. The resultant polymer is called polymer compound 8.

The polymer compound 8 had a polystyrene-reduced number average molecular weight of $1.0 \times 10^4$ and a polystyrene-reduced weight average molecular weight of $2.2 \times 10^4$.

The structures of repeating units contained in the polymer compound 8 estimated from charged materials are shown below.

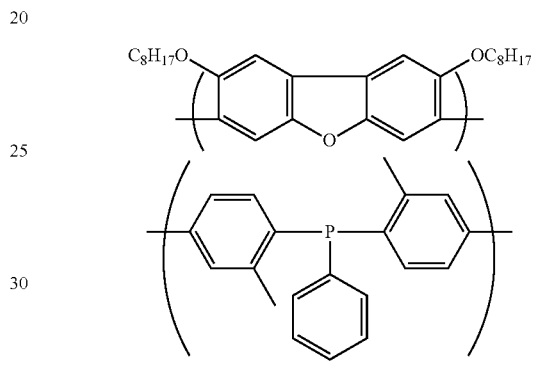

Example 6

Evaluation of Fluorescent Property and Glass Transition Temperature (Tg) of Polymer Compound <Evaluation of Fluorescent Property of Polymer Compound>

A 0.8 wt % toluene solution of a polymer compound was spin-coated on a quartz plate to manufacture a thin film of the polymer compound. The fluorescent spectrum of this thin film was measured using a fluorescence spectrophotometer (Fluorolog, manufactured by JOBINYVON-SPEX) at an excitation wavelength of 350 nm. For obtaining relative fluorescence intensity on the thin film, the fluorescence spectrum plotted against wave number was integrated in the spectrum measurement range, and allocated to absorbance at excitation wavelength, measured using a spectrophotometer (Cary5E, manufactured by Varian), using the intensity of water Raman line as standard.

<Evaluation of Glass Transition Temperature (Tg) of Polymer Compound>

Measurement of glass transition temperature (Tg) was carried out by DSC (DSC2920, manufactured by TA Instruments). A sample was kept at 200° C. for 5 minutes, then, quenched to −50° C. and kept for 30 minutes. The temperature was raised up to 30° C., then, measurement was carried out at a temperature rising rate of 5° C. per minute up to 300° C.

The fluorescence peak wavelengths and the measurement results of the fluorescence intensity and the glass transition temperature (Tg) are shown in Table 1. The polymer compounds 1 and 2 containing the above-described formula (1) and the above-described formula (2) of the present invention had higher glass transition temperature (Tg), more excellent in heat resistance, and also had larger fluorescence intensity, than the polymer compound 3 containing fluorene and triphenylphosphine and the polymer compound 4 containing benzofluorene and triphenylamine.

Further, the polymer compound 6 containing the above-described formula (1) and the above-described formula (70) of the present invention had higher glass transition temperature (Tg), more excellent in heat resistance, and also had larger fluorescence intensity, than the polymer compound 7 containing dibenzothiophene and triphenylamine.

TABLE 1

Fluorescence peak wavelength, fluorescence intensity (relative value) and Tg of polymer compound

| Polymer compound | fluorescence peak wavelength (nm) | fluorescence intensity (a.u.) | Tg (° C.) |
|---|---|---|---|
| 1 | 451 | 6.7 | 135 |
| 2 | 452 | 9.8 | 141 |
| 3 | 422 | 6.3 | 110 |
| 4 | 456 | 3.1 | 127 |
| 5 | 417 | 5.6 | 94 |
| 6 | 130 | 3.4 | 111 |
| 7 | 443 | 2.4 | 99 |
| 8 | 433 | 4.8 | 103 |

Example 7

Manufacturing and Evaluation of Device

A 1.5 wt % xylene solution of a mixture obtained by adding 2 wt % of iridium complex A to the polymer compound 5 was prepared.

On a glass substrate carrying an ITO film having a thickness of 150 nm formed thereon by a sputtering method, a solution of poly(ethylenedioxythiophene)/polystyrenesulfonic acid (Baytron P, manufactured by Bayer) was spin-coated to form a film having a thickness of 50 nm, and dried on a hot plate at 200° C. for 10 minutes. Next, the xylene solution prepared above was spin-coated at a rotational speed of 700 rpm to form a film. The thickness was about 90 nm. This was dried under a nitrogen gas atmosphere at 130° C. for 1 hour, then, as a cathode, barium was vapor-deposited with a thickness of about 5 nm, then, aluminum was vapor-deposited with a thickness of about 80 nm, to manufacture an EL device. After the degree of vacuum reached $1 \times 10^{-4}$ Pa or less, vapor deposition of a metal was initiated.

By applying voltage on the resulting device, strong EL light emission (peak wavelength: 640 nm) from the iridium complex was obtained. This device showed light emission of 100 cd/m² at 13.5 V, obtaining a maximum brilliance of as high as about 600 cd/m² or more.

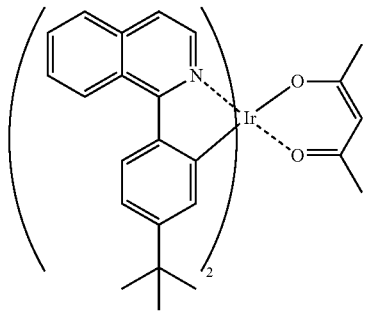

Iridium complex A

Example 8

A 1.5 wt % xylene solution of a mixture obtained by adding 2 wt % of iridium complex A to the polymer compound 6 was prepared, and an EL device was manufactured in the same manner as in Example 7. A light emitting layer was formed by spin coat at a rotational speed of 800 rpm. The film thickness was about 90 nm. By applying voltage on the resulting device, strong EL light emission (peak wavelength: 630 nm) from the iridium complex was obtained. This device showed light emission of 100 cd/m² at 14.8 V, obtaining a maximum brilliance of as high as about 290 cd/m² or more.

Example 9

A 1.5 wt % xylene solution of a mixture obtained by adding 2 wt % of iridium complex A to the polymer compound 1 was prepared, and an EL device was manufactured in the same manner as in Example 7. A light emitting layer was formed by spin coat at a rotational speed of 900 rpm. The film thickness was about 100 nm. By applying voltage on the resulting device, strong EL light emission (peak wavelength: 635 nm) from the iridium complex was obtained. This device showed light emission of 100 cd/m² at 7.5 V, obtaining a maximum brilliance of as high as about 1300 cd/m² or more.

INDUSTRIAL APPLICABILITY

The polymer compound of the present invention is useful as a light emitting material, and has heat resistance and strong fluorescence intensity. A polymer light emitting device using this polymer compound is of high performance, and can be used as a device such as a sheet light source as back light, a flat panel display and the like. Further, this polymer compound can be used as an organic transistor and solar battery.

The invention claimed is:

1. A polymer compound comprising a repeating unit of the following formula (1) and at least one of a repeating unit of the following formula (2) and a repeating unit of the following formula (70)

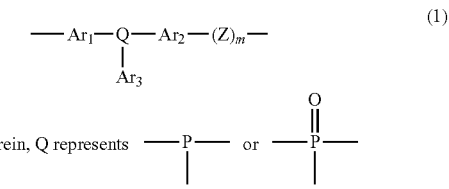

Ar$_1$ and Ar$_2$ represent each independently an arylene group, divalent heterocyclic group or divalent aromatic amine group, Ar$_3$ represents an aryl group, monovalent heterocyclic group or monovalent aromatic amine group, Z represents —CR$_1$═CR$_2$— or —C≡C—, R$_1$ and R$_2$ represent each independently a hydrogen atom, alkyl group, aryl group, monovalent heterocyclic group or cyano group, m represents 0 or 1,

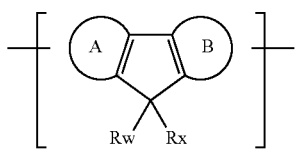

(2)

wherein, a ring A and a ring B represent each independently an aromatic hydrocarbon ring optionally having a substituent, and at least one of the ring A and the ring B is an aromatic hydrocarbon ring having two or more benzene rings condensed, two bonds are present on the ring A and/or the ring B, and Rw and Rx represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group or cyano group, and Rw and Rx may be mutually connected to form a ring,

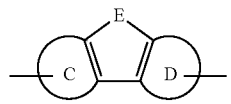

(70)

wherein, a ring C and a ring D represent each independently an aromatic ring, the ring C or the ring D optionally have a substituent selected from the group consisting of an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group, when there are two or more substituents, they may be the same or different, and E represents O or S.

2. A light emitting material comprising the polymer compound as described in claim 1.

3. A polymer light emitting device having a light emitting layer between electrodes composed of an anode and a cathode wherein the light emitting layer comprises the polymer compound as described in claim 1.

4. A sheet light source comprising the polymer light emitting device as described in claim 3.

5. A display comprising the polymer light emitting device as described in claim 3.

6. A liquid composition comprising the polymer compound as described in claim 1 and a solvent.

7. A thin film comprising the polymer compound as described in claim 1.

8. An organic transistor comprising the polymer compound as described in claim 1.

9. A solar battery comprising the polymer compound as described in claim 1.

\* \* \* \* \*